United States Patent
Bobde et al.

(10) Patent No.: US 8,373,208 B2
(45) Date of Patent: Feb. 12, 2013

(54) LATERAL SUPER JUNCTION DEVICE WITH HIGH SUBSTRATE-GATE BREAKDOWN AND BUILT-IN AVALANCHE CLAMP DIODE

(75) Inventors: Madhur Bobde, San Jose, CA (US); Lingpeng Guan, Sunnyvale, CA (US); Anup Bhalla, Santa Clara, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 221 days.

(21) Appl. No.: 12/799,810

(22) Filed: Apr. 30, 2010

(65) Prior Publication Data

US 2011/0127586 A1 Jun. 2, 2011

Related U.S. Application Data

(63) Continuation-in-part of application No. 12/592,619, filed on Nov. 30, 2009.

(51) Int. Cl.
*H01L 21/8232* (2006.01)

(52) U.S. Cl. . 257/262; 257/256; 257/265; 257/E21.615; 257/E27.016; 257/337

(58) Field of Classification Search ................. 257/328, 257/262, 337
See application file for complete search history.

(56) References Cited

U.S. PATENT DOCUMENTS

2003/0057479 A1* 3/2003 Ahlers et al. ................. 257/328

* cited by examiner

*Primary Examiner* — Mamadou Diallo
(74) *Attorney, Agent, or Firm* — Bo-In Lin

(57) ABSTRACT

A lateral super junction JFET is formed from stacked alternating P type and N type semiconductor layers over a P-epi layer supported on an N+ substrate. An N+ drain column extends down through the super junction structure and the P-epi to connect to the N+ substrate to make the device a bottom drain device. N+ source column and P+ gate column extend through the super junction but stop at the P-epi layer. A gate-drain avalanche clamp diode is formed from the bottom the P+ gate column through the P-epi to the N+ drain substrate.

14 Claims, 58 Drawing Sheets

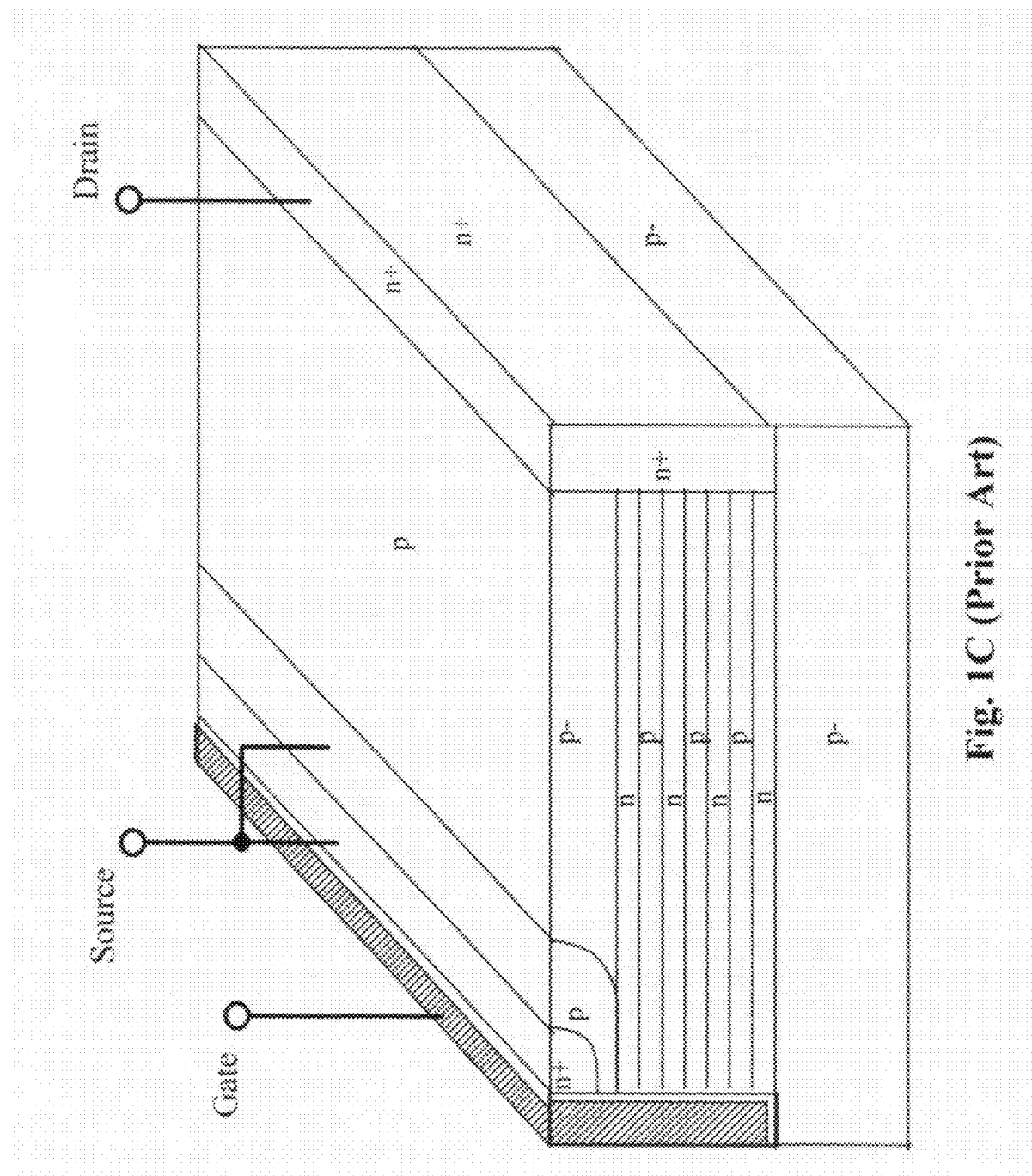

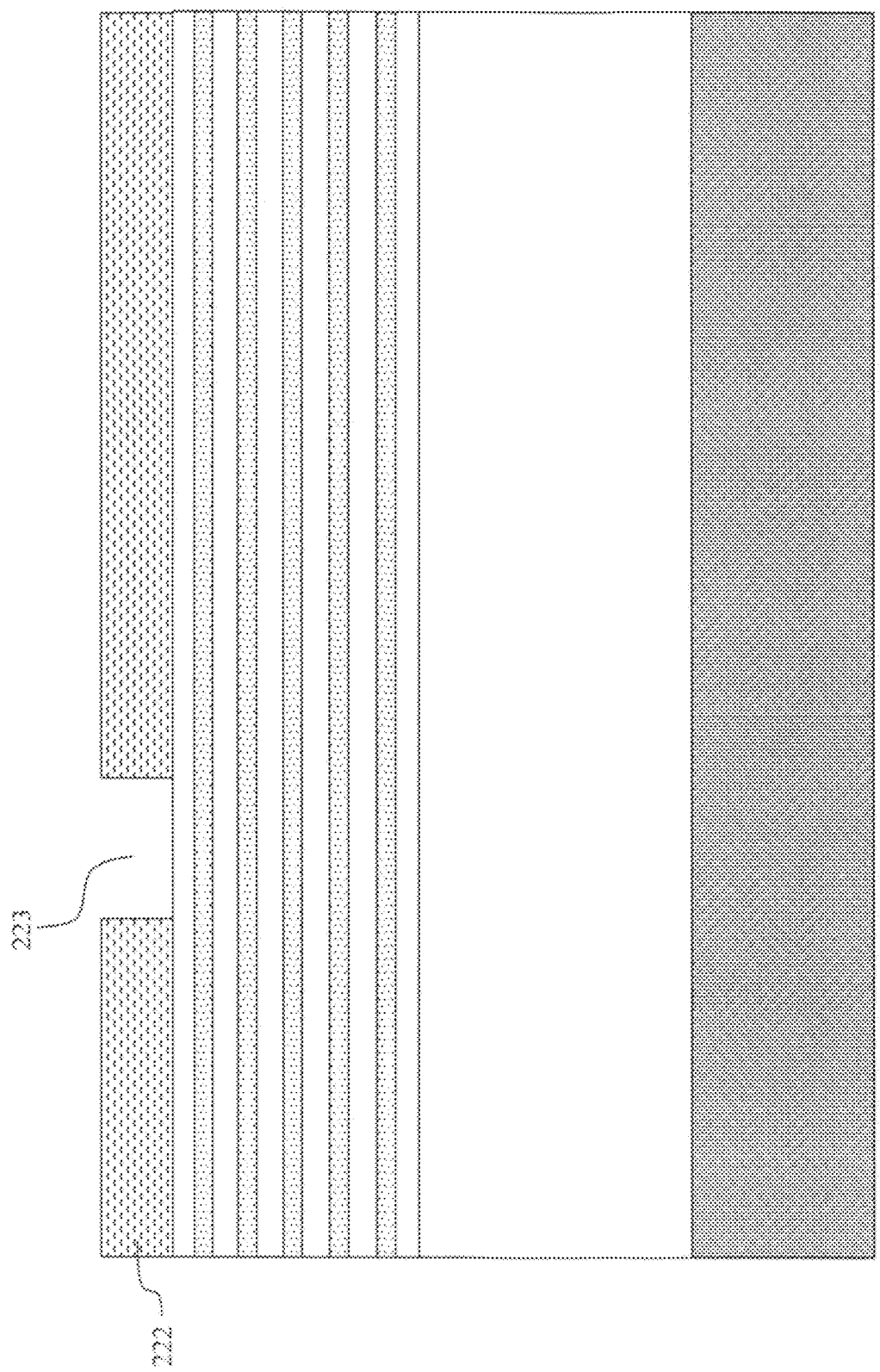

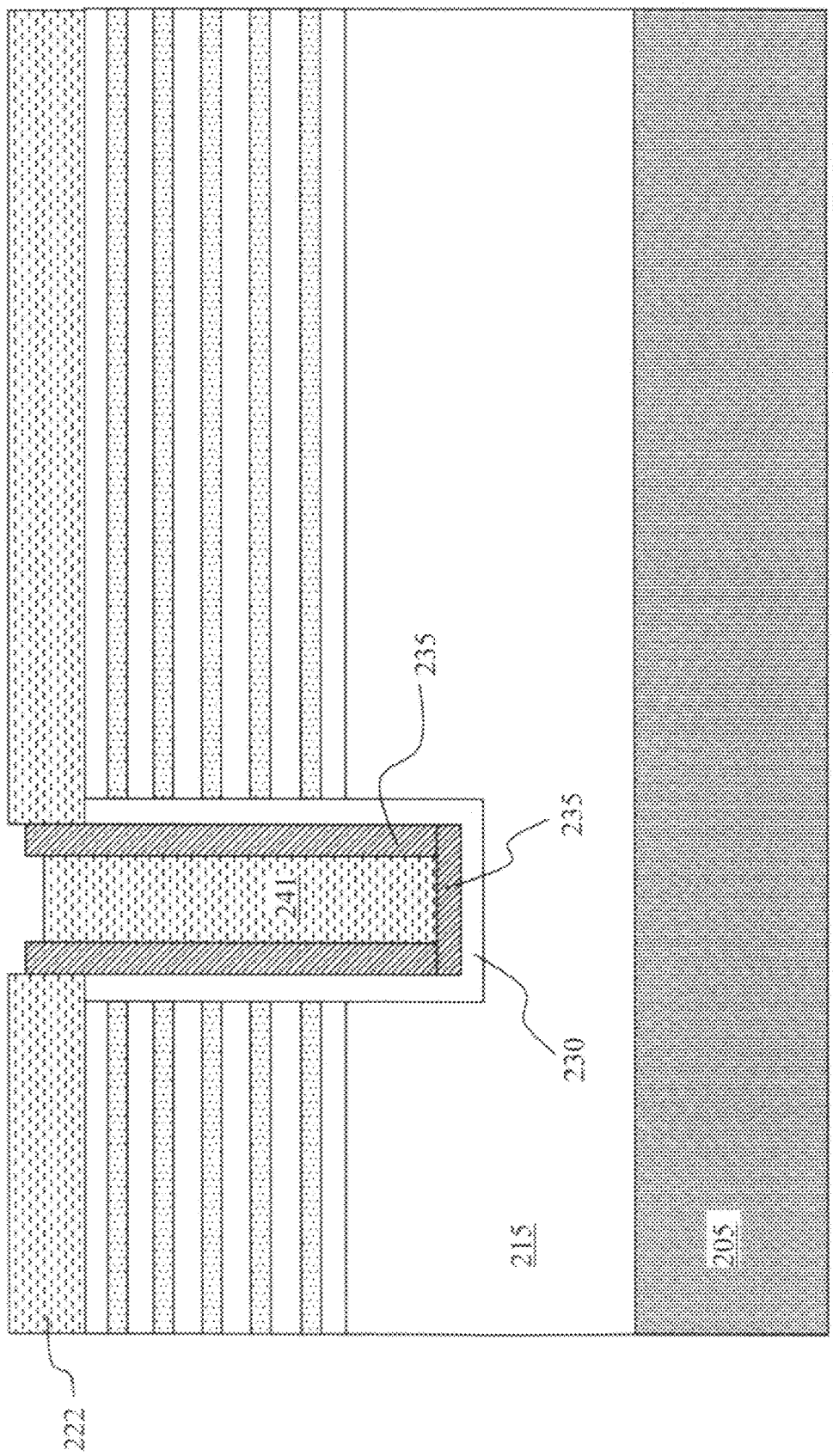

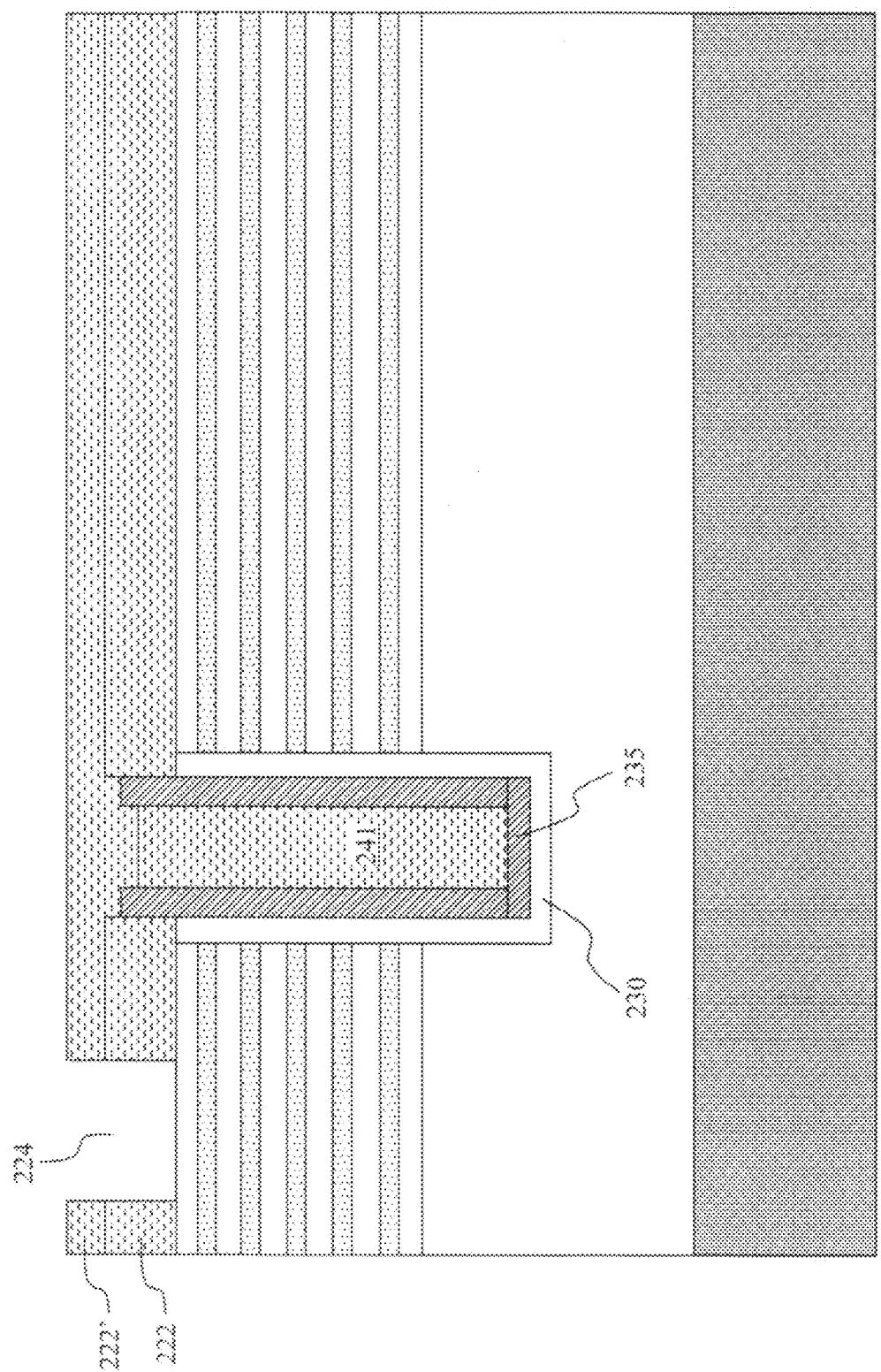

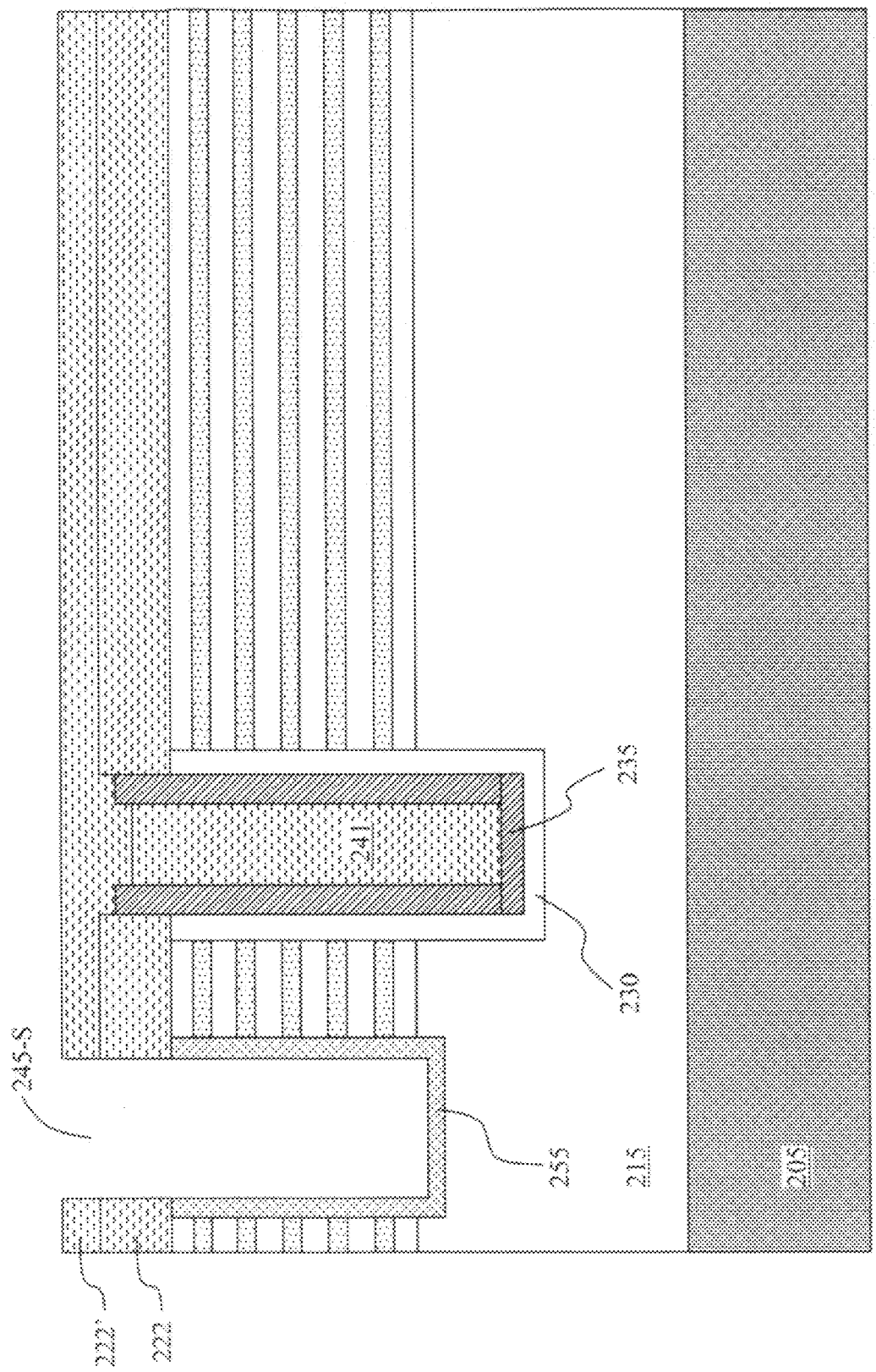

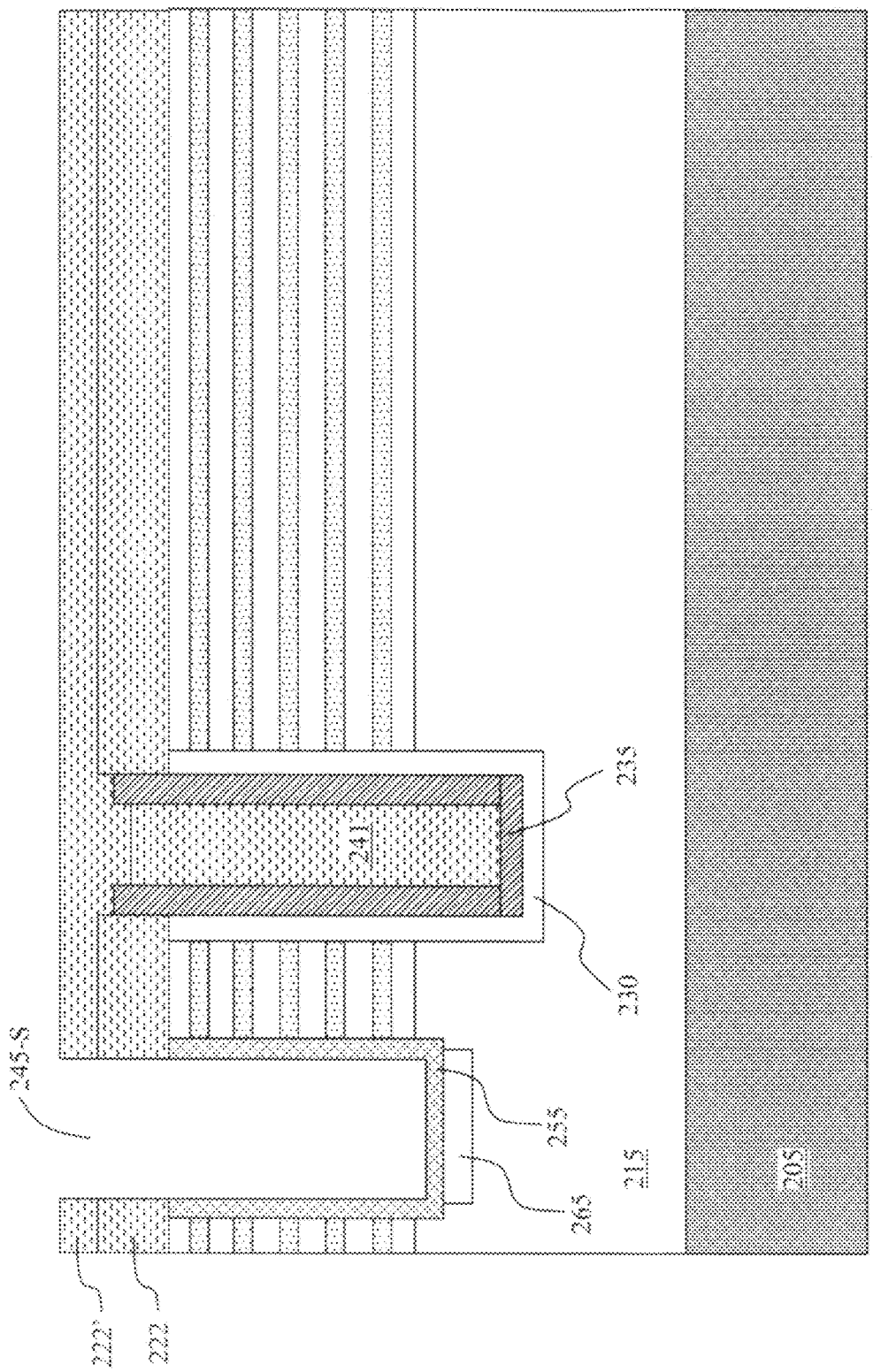

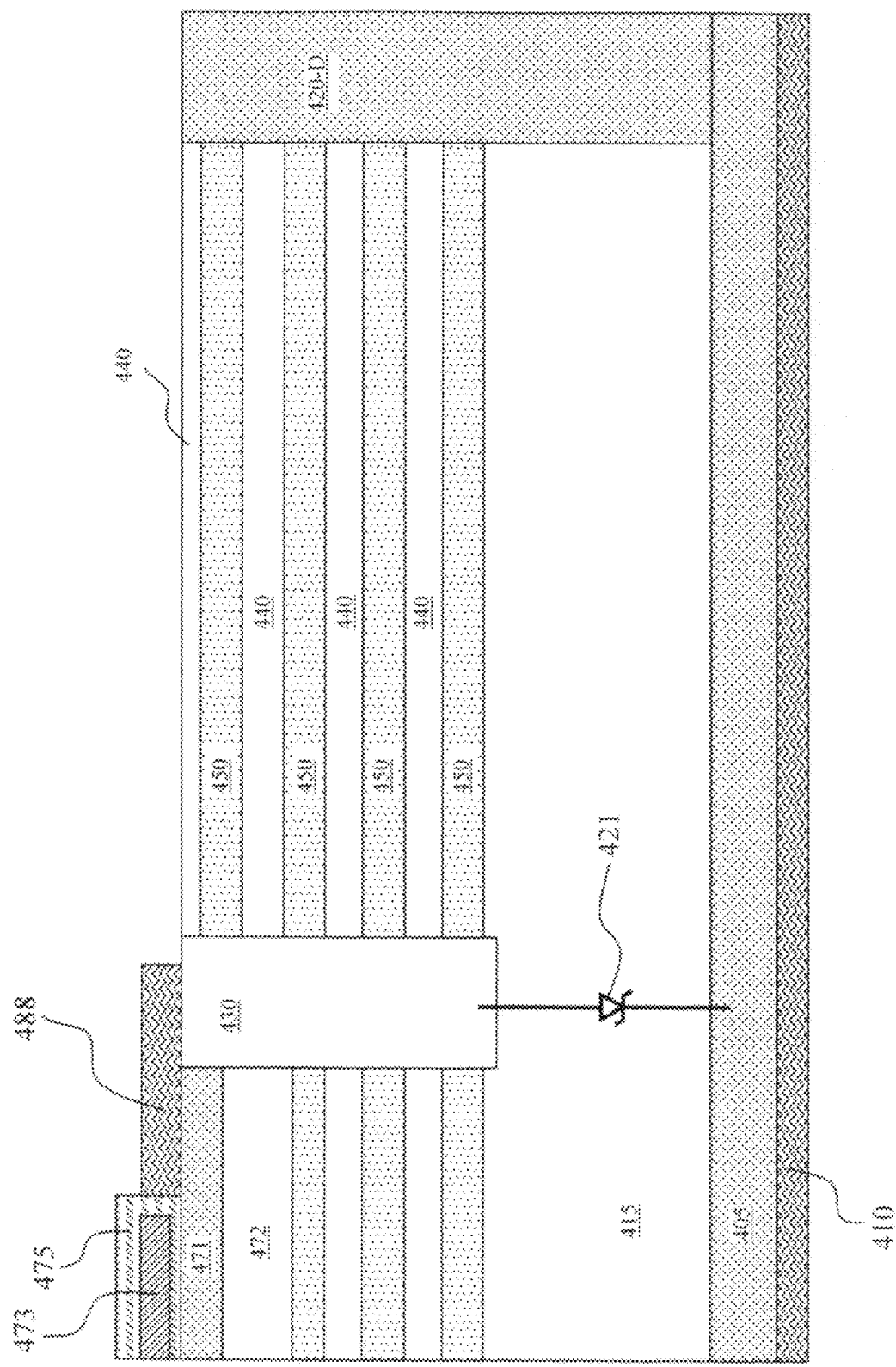

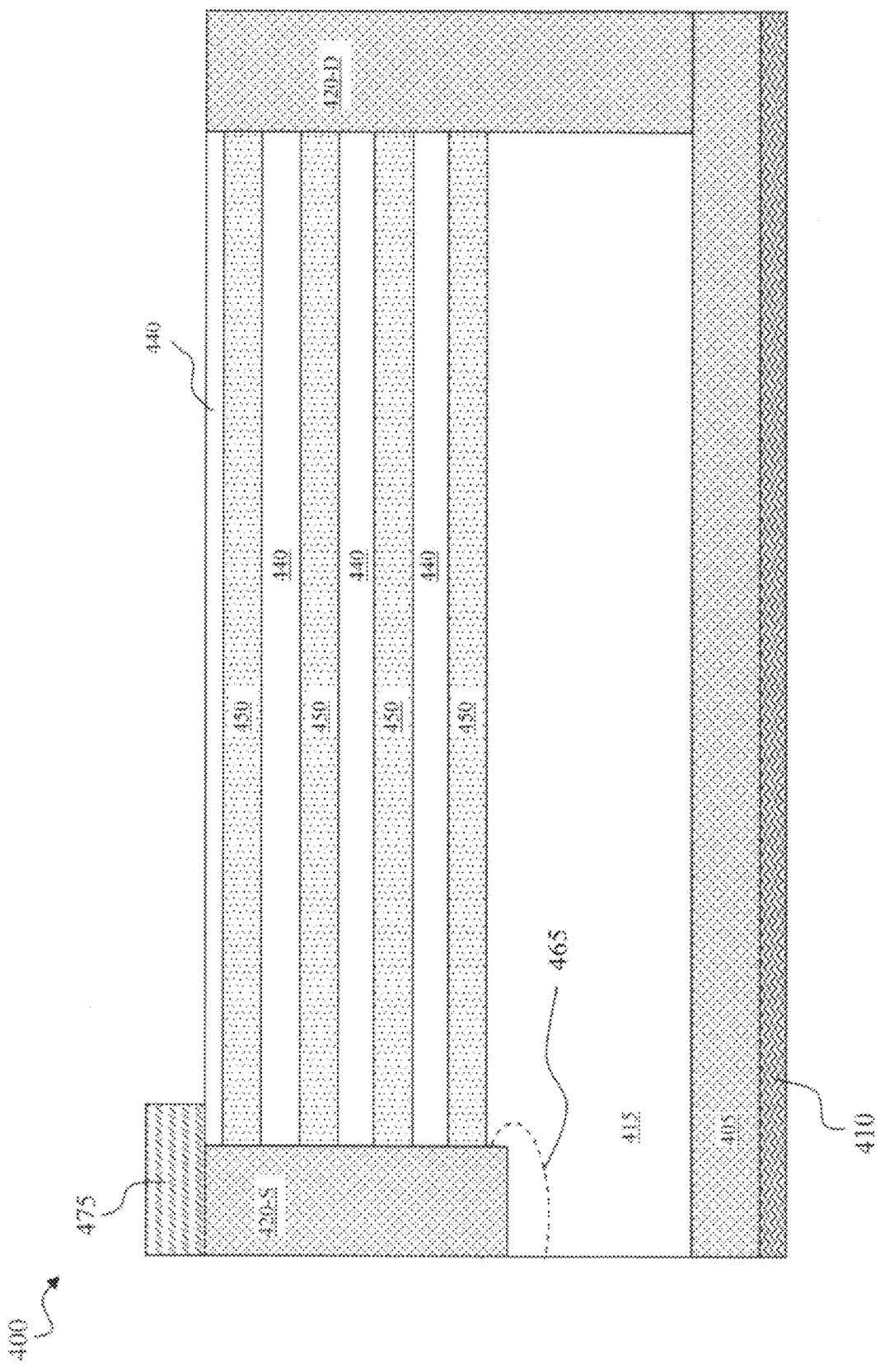

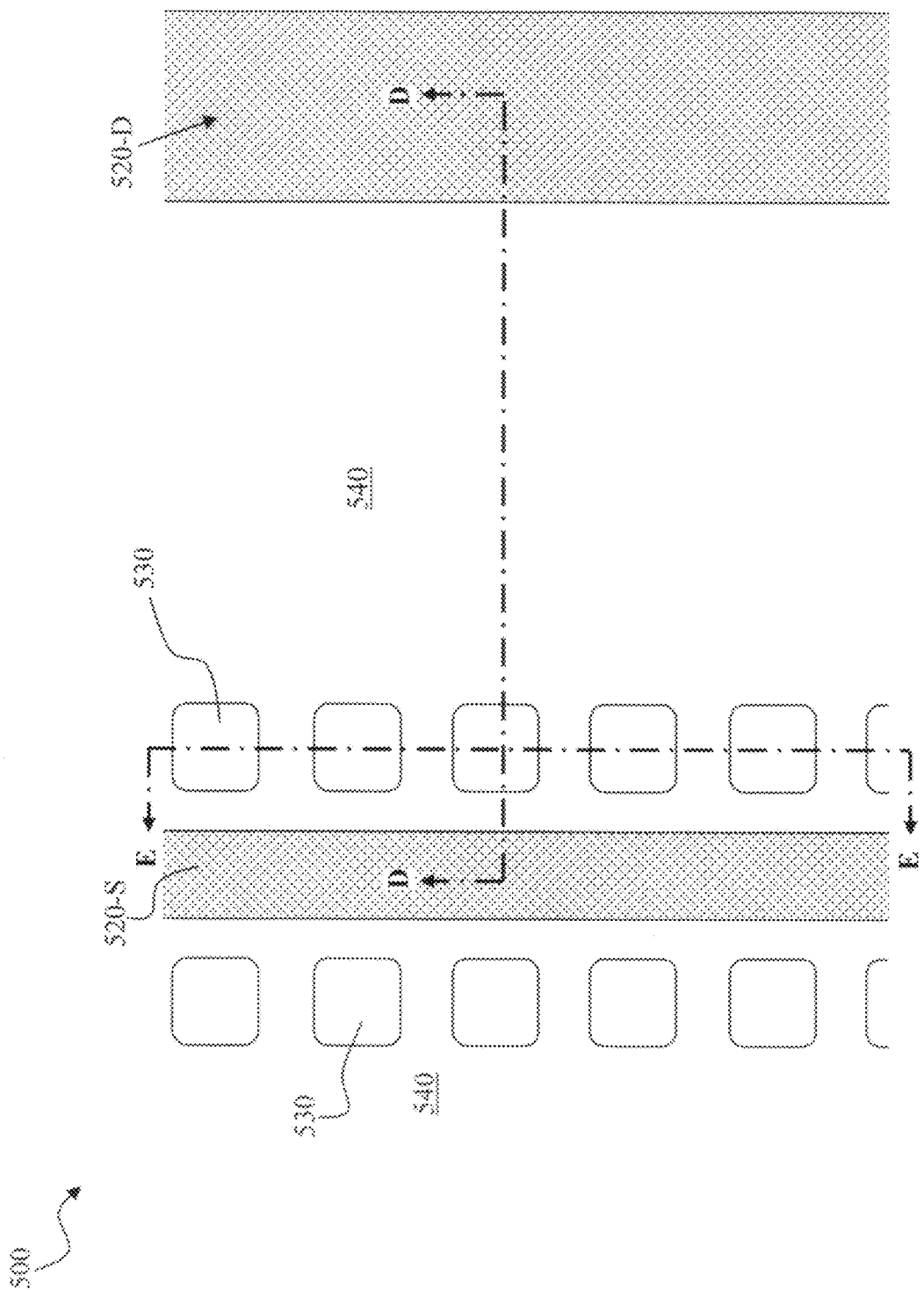

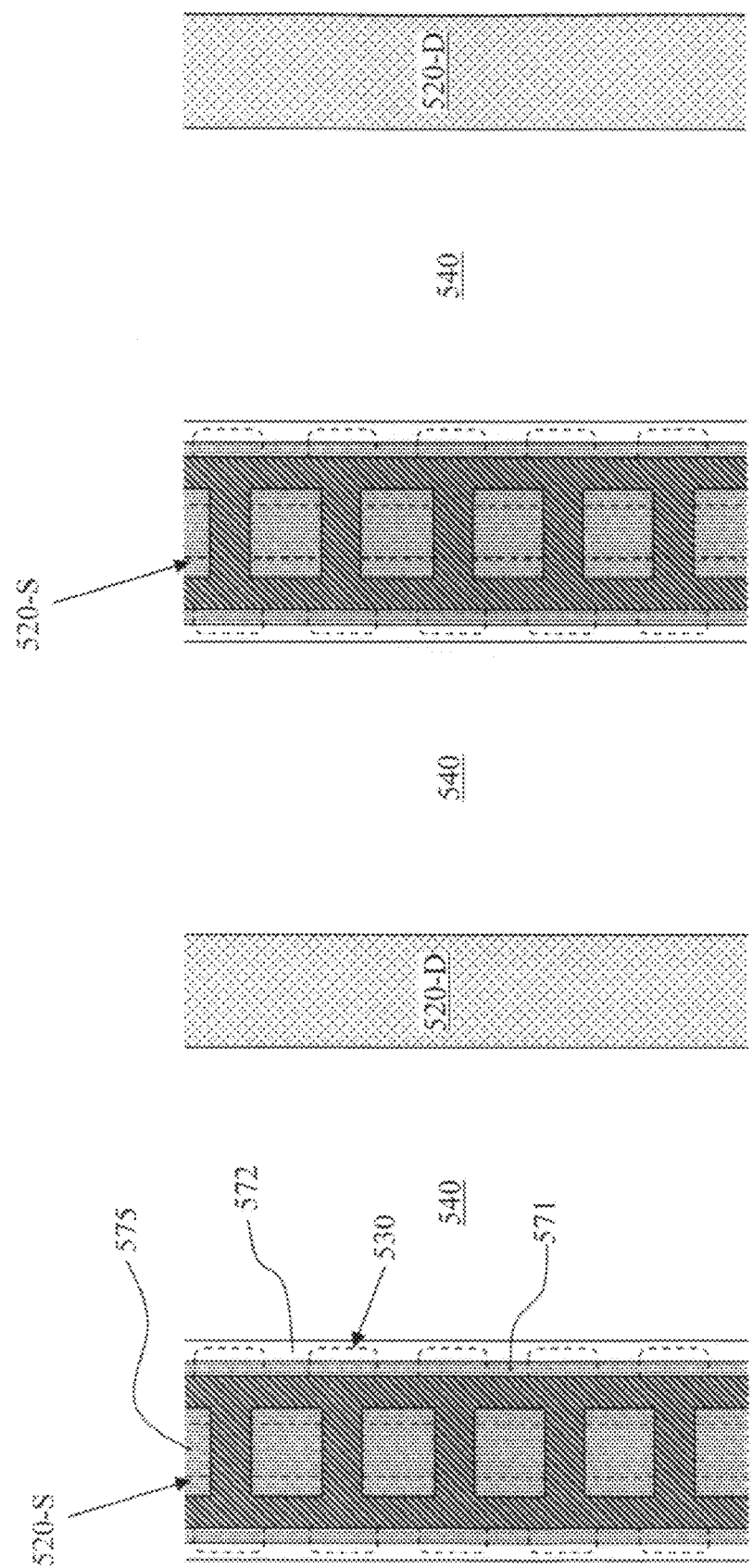

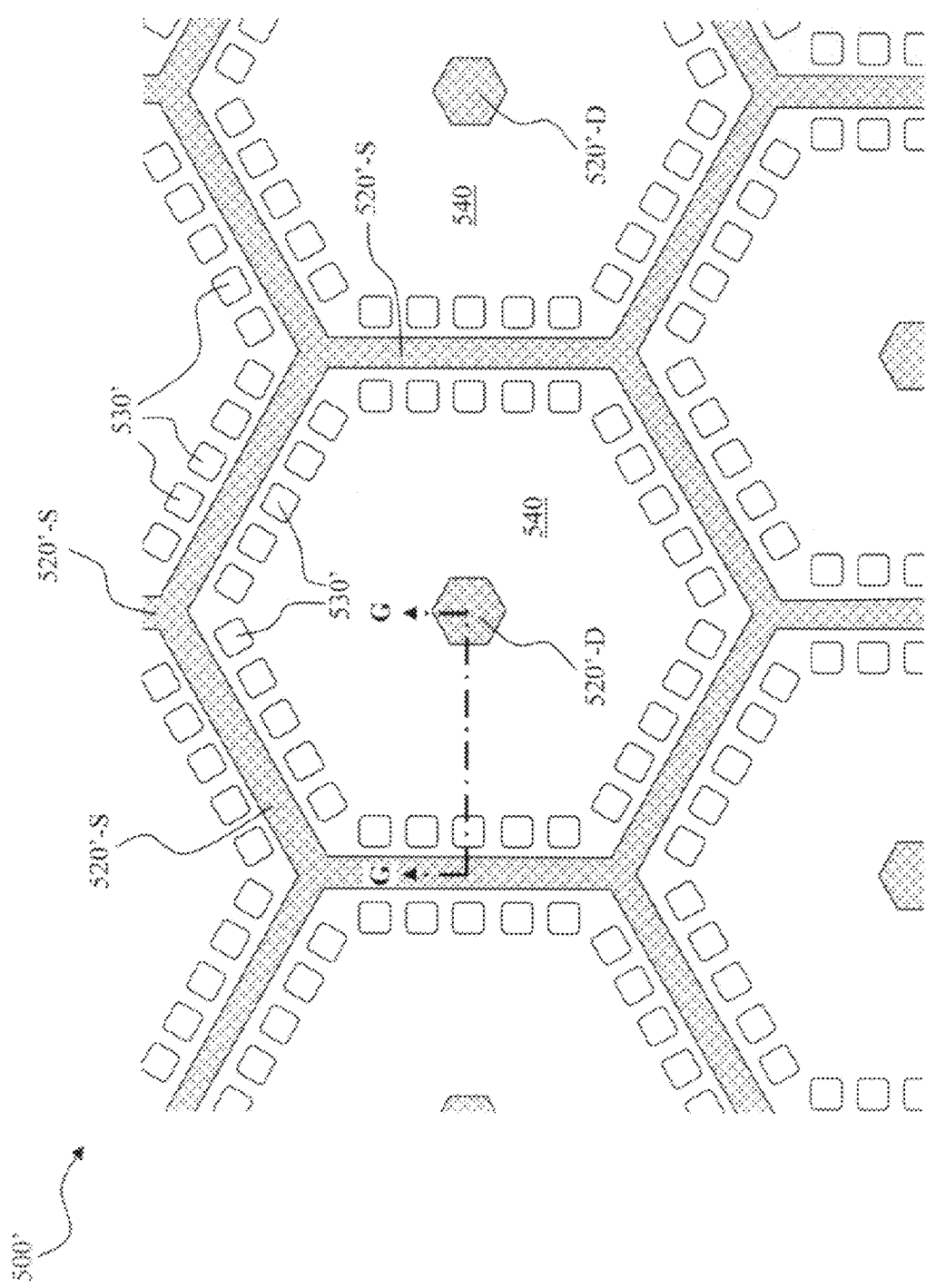

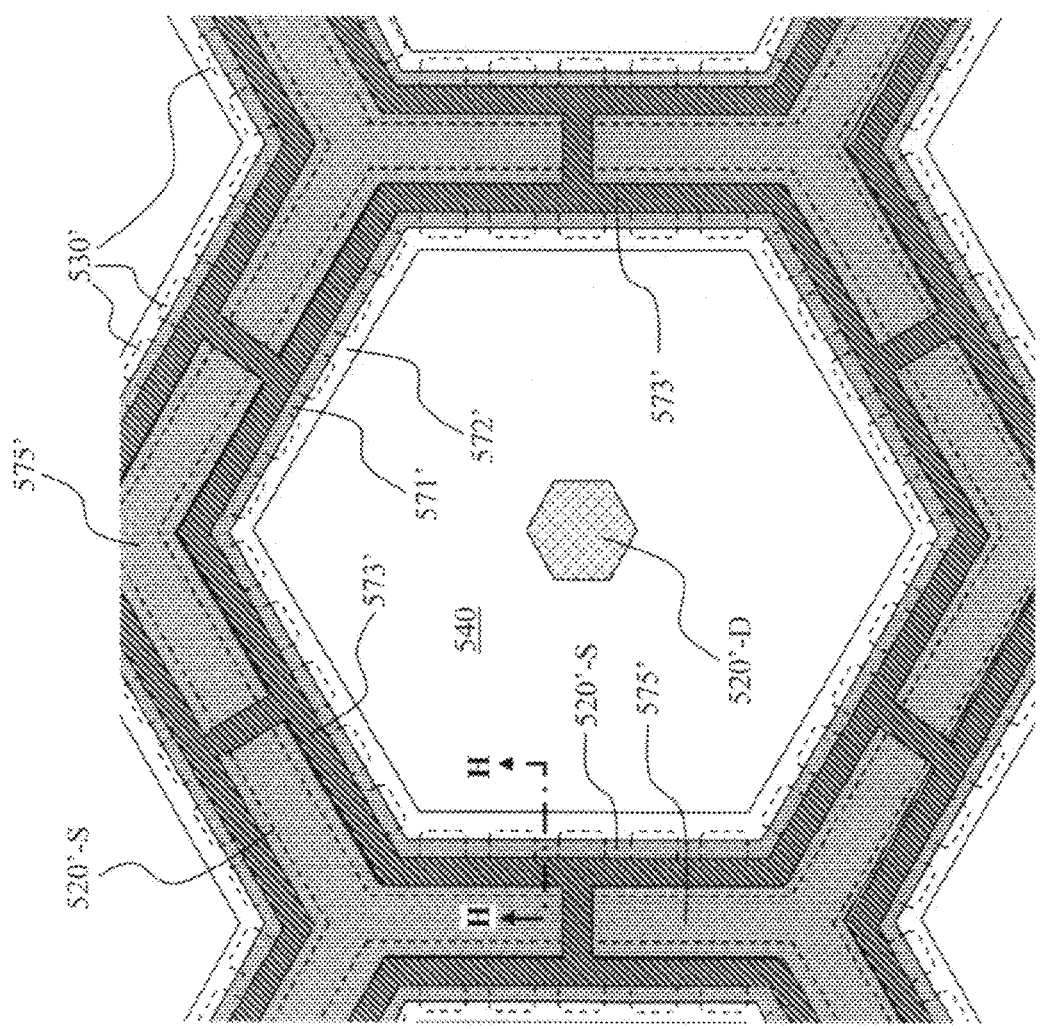

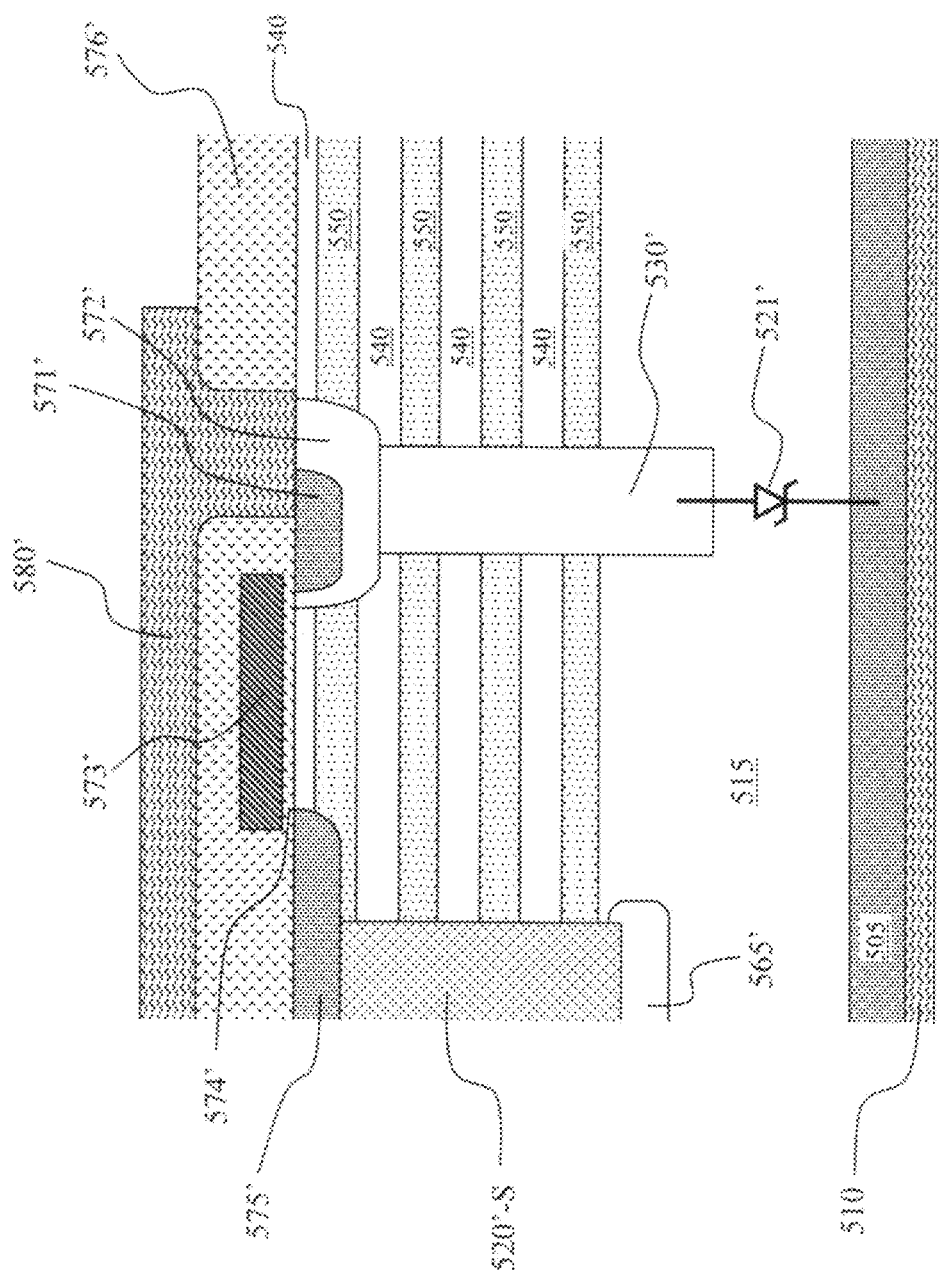

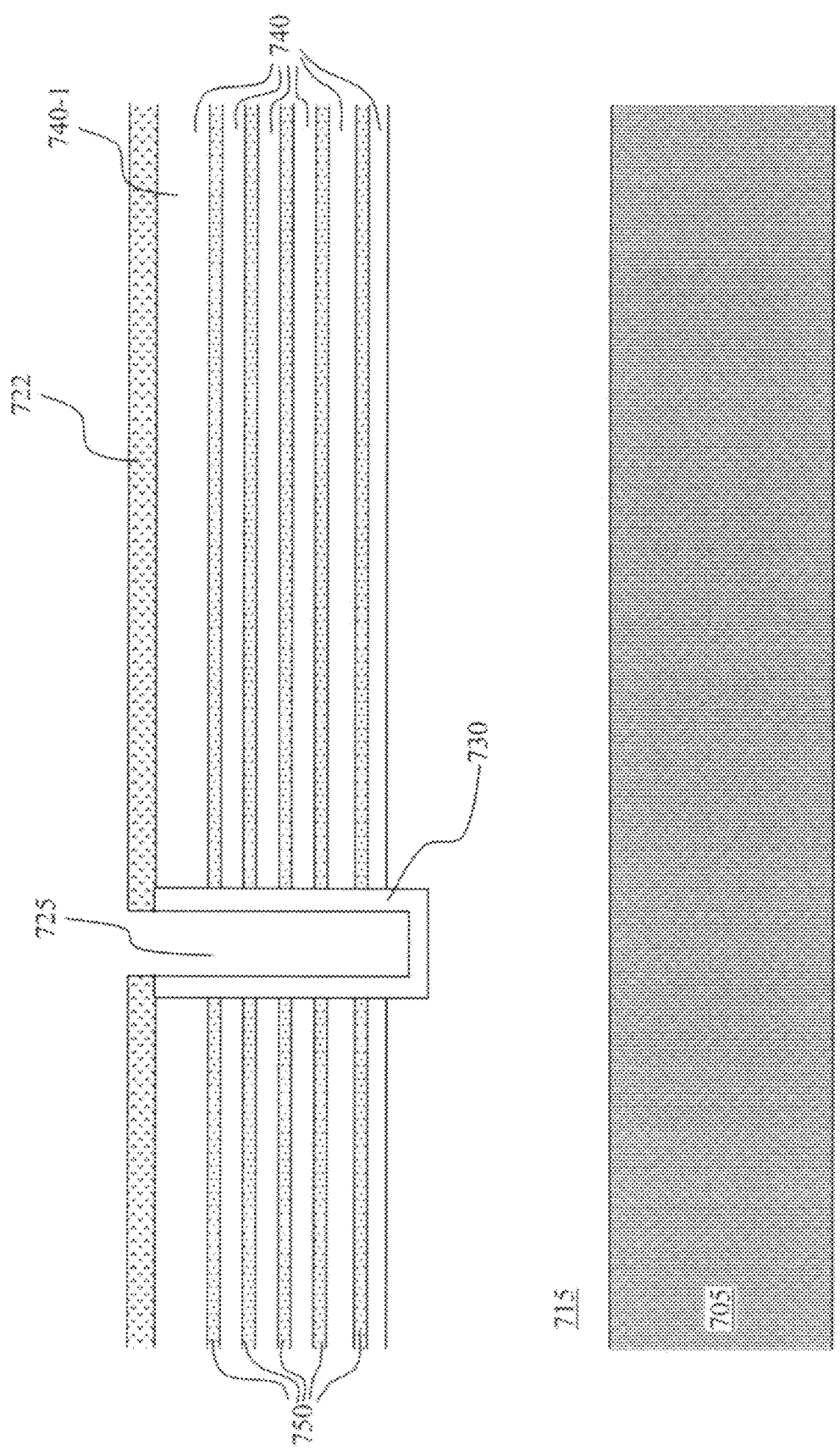

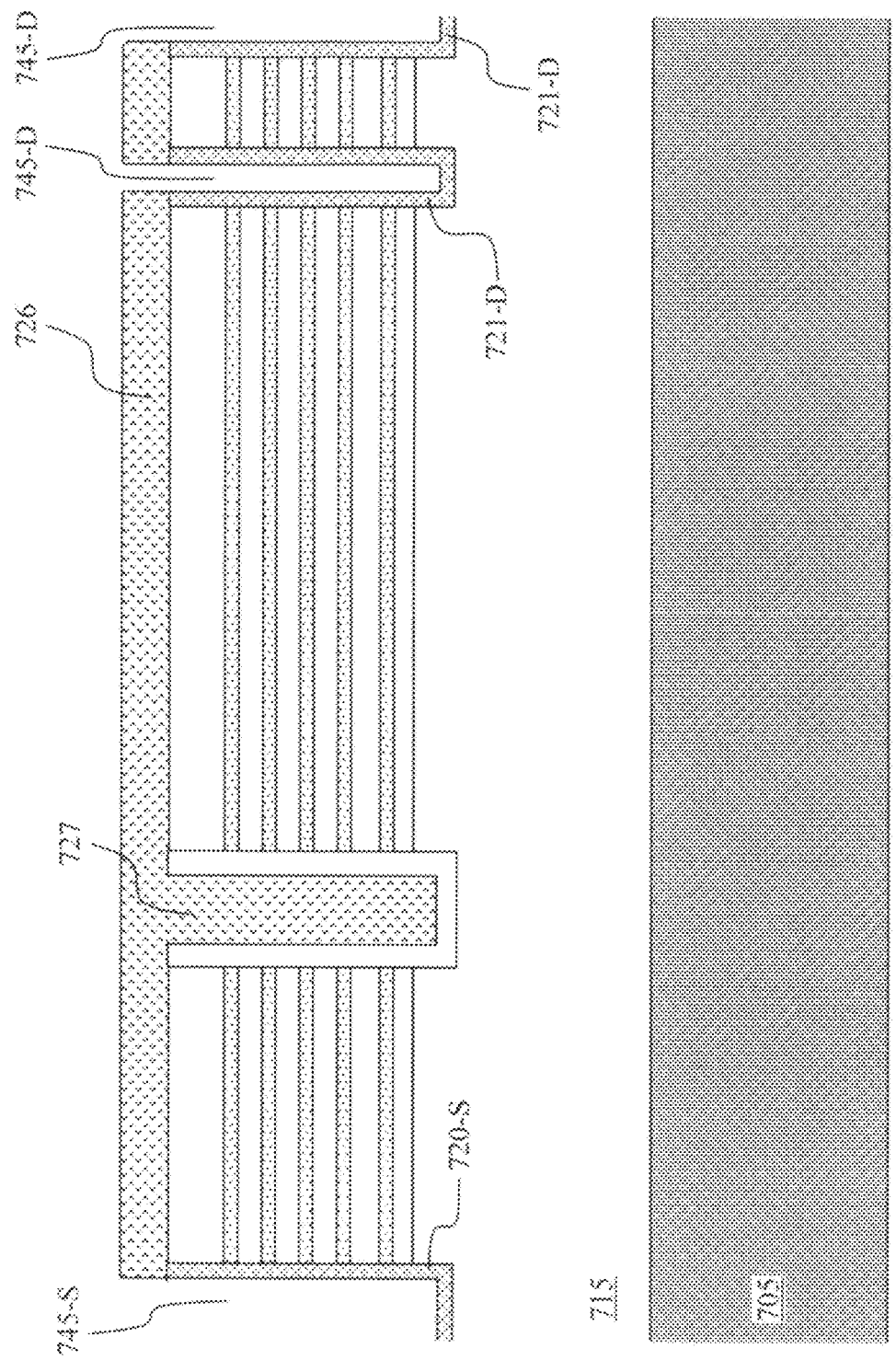

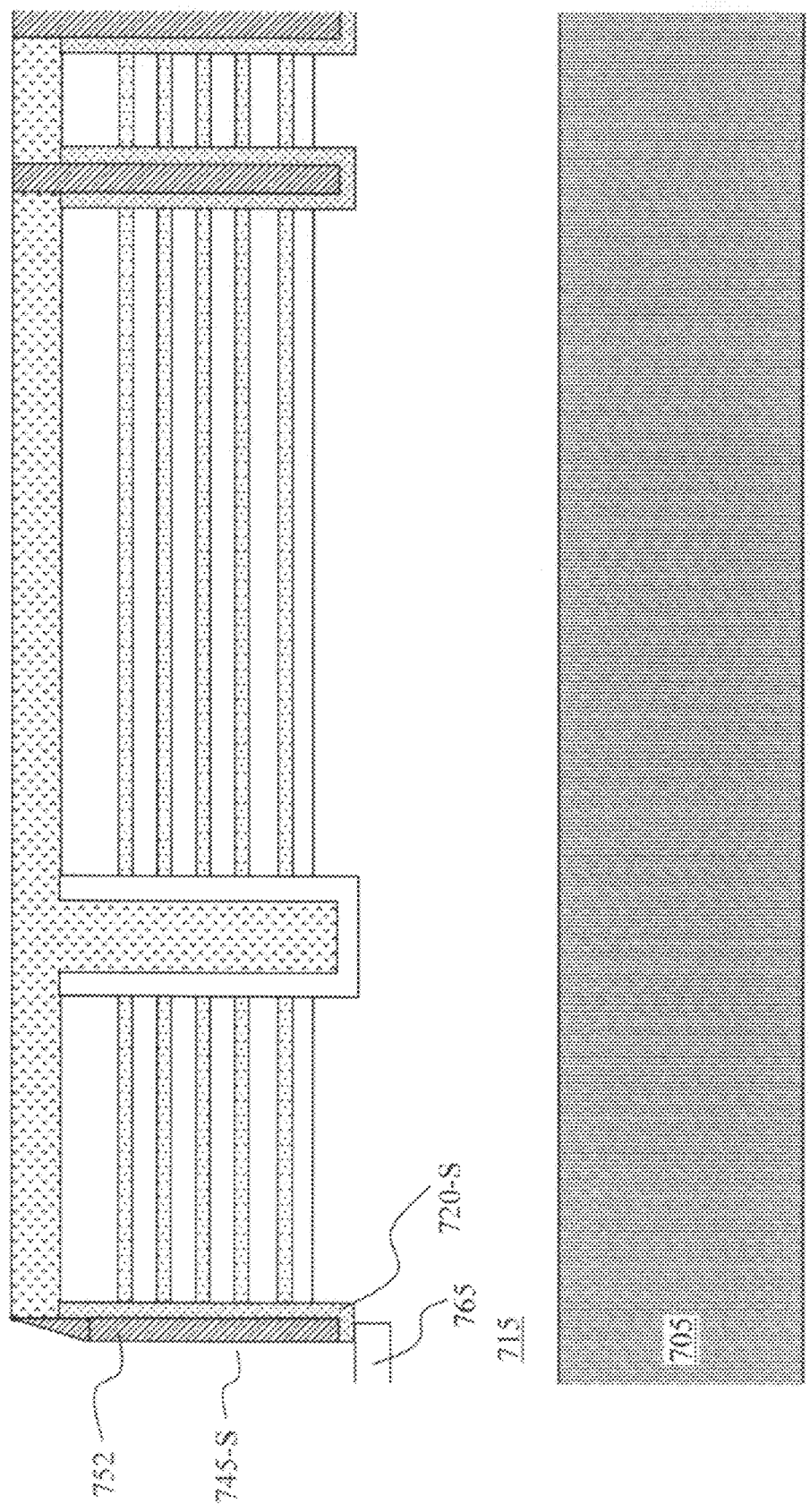

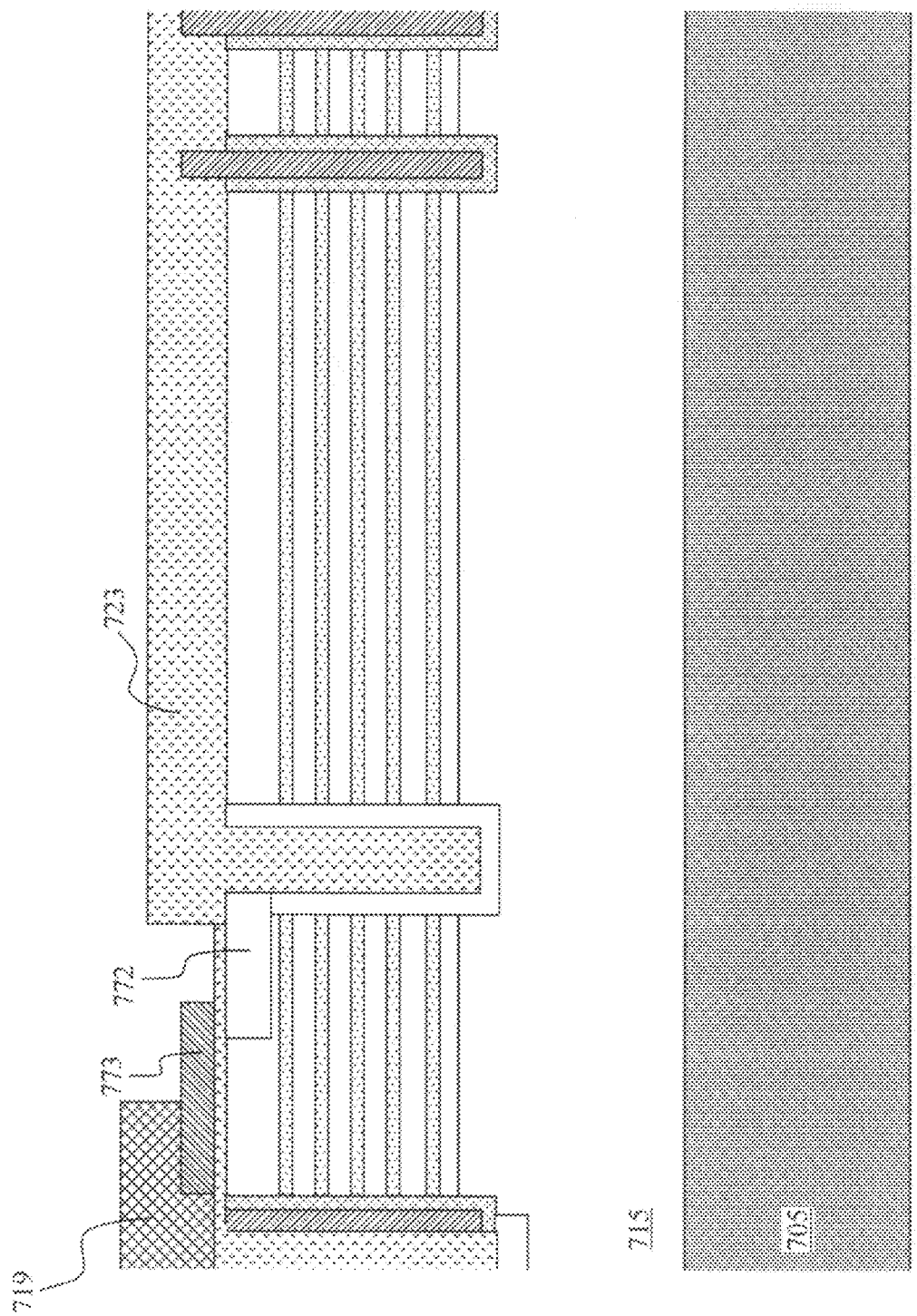

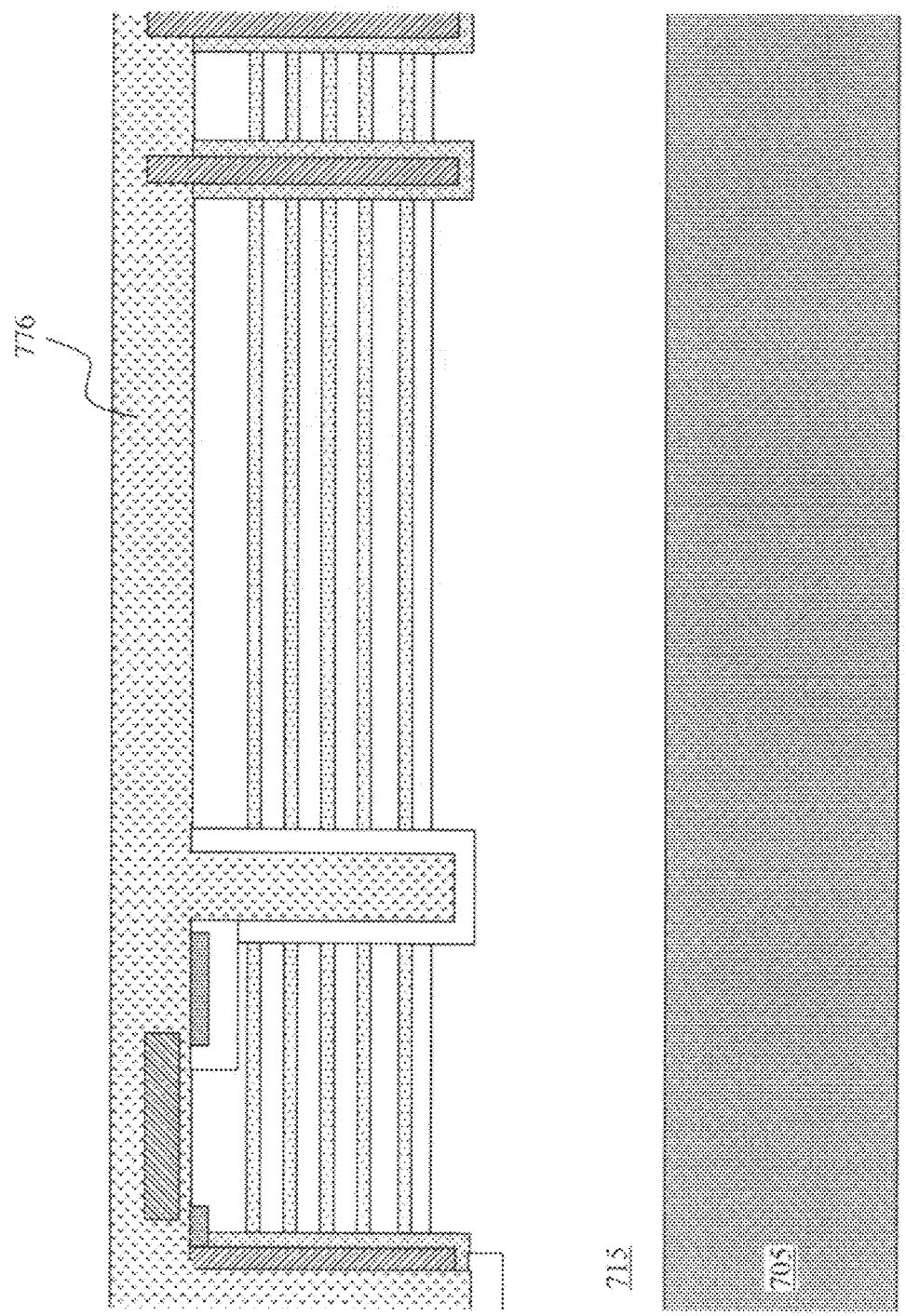

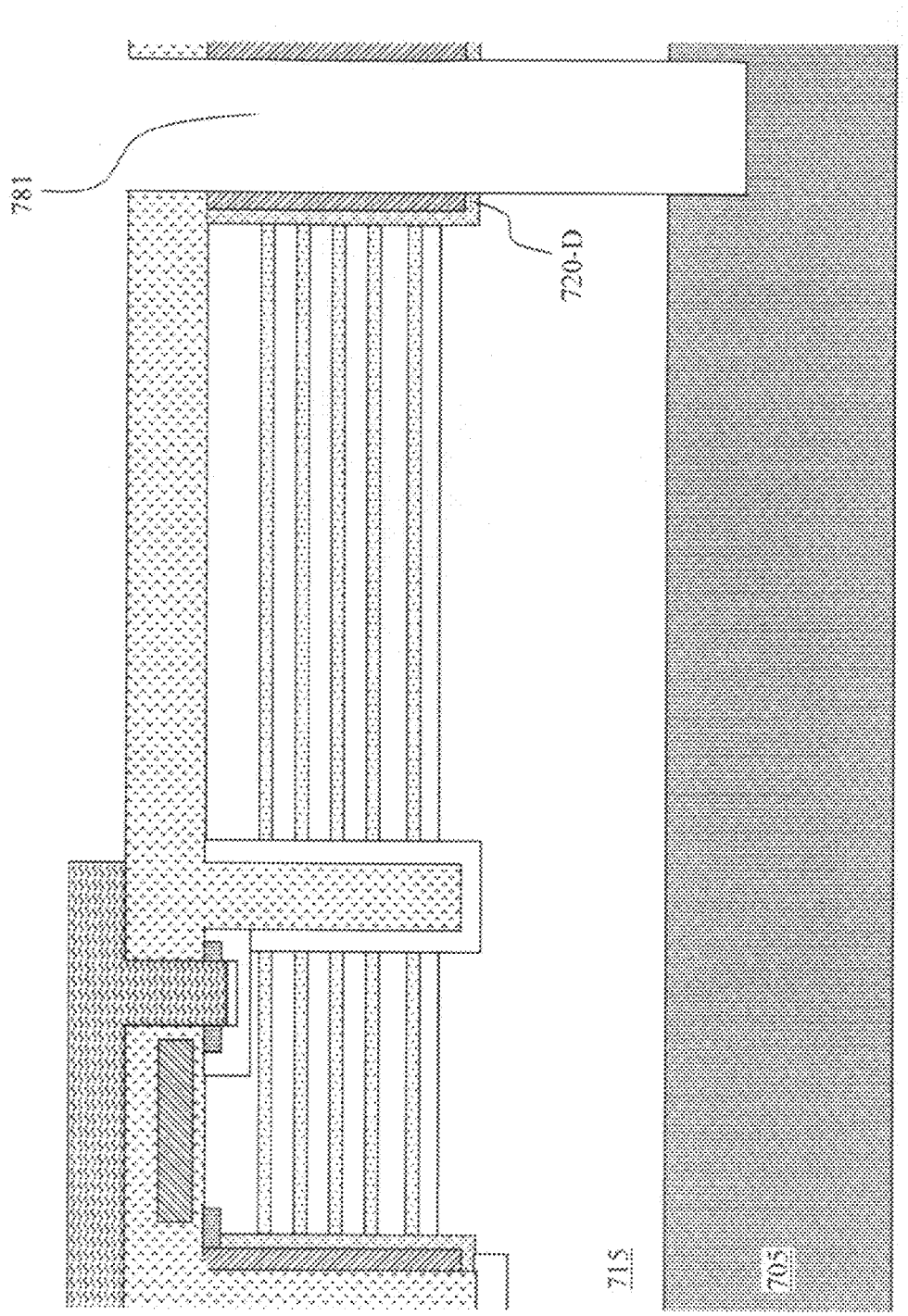

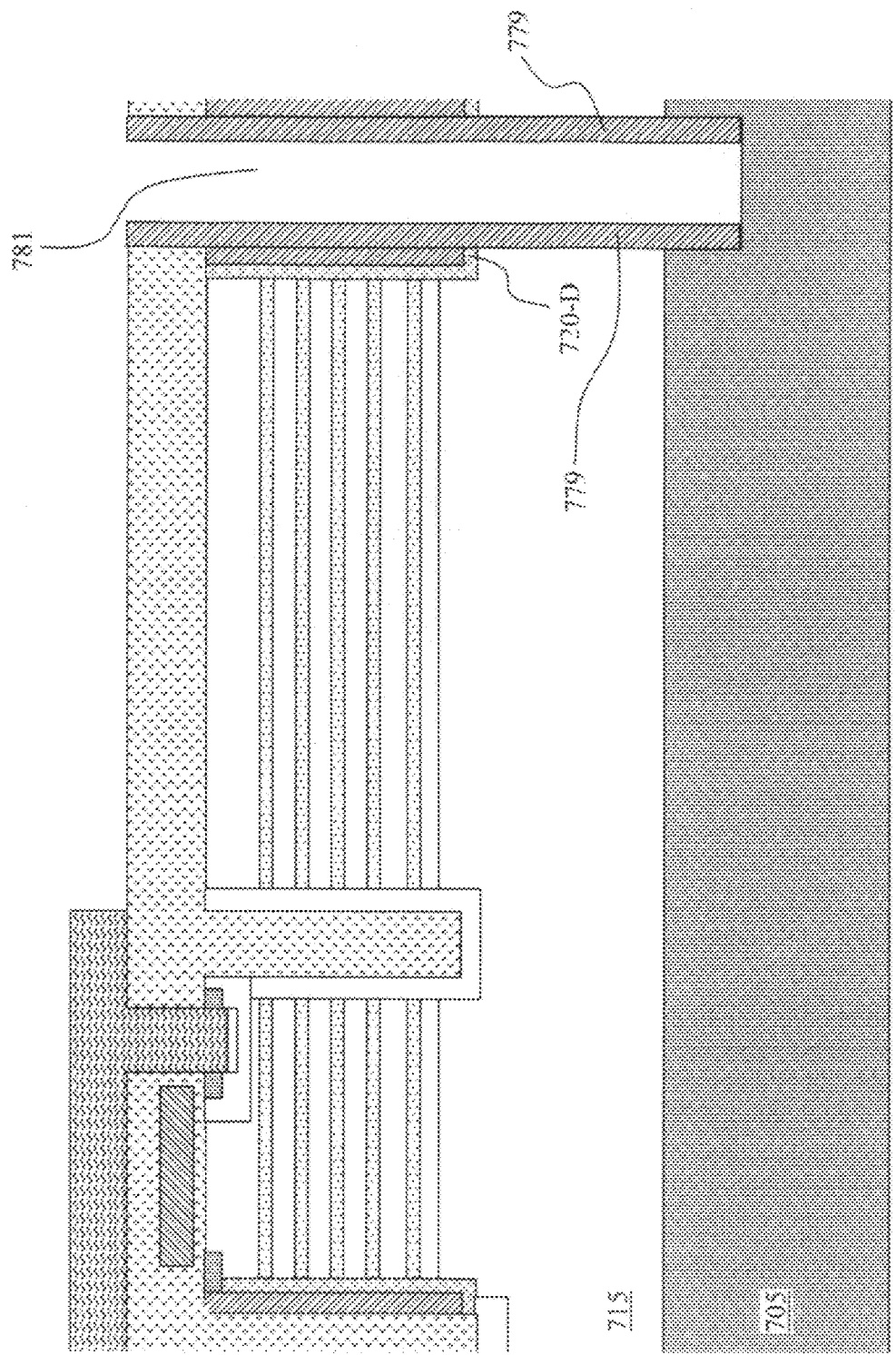

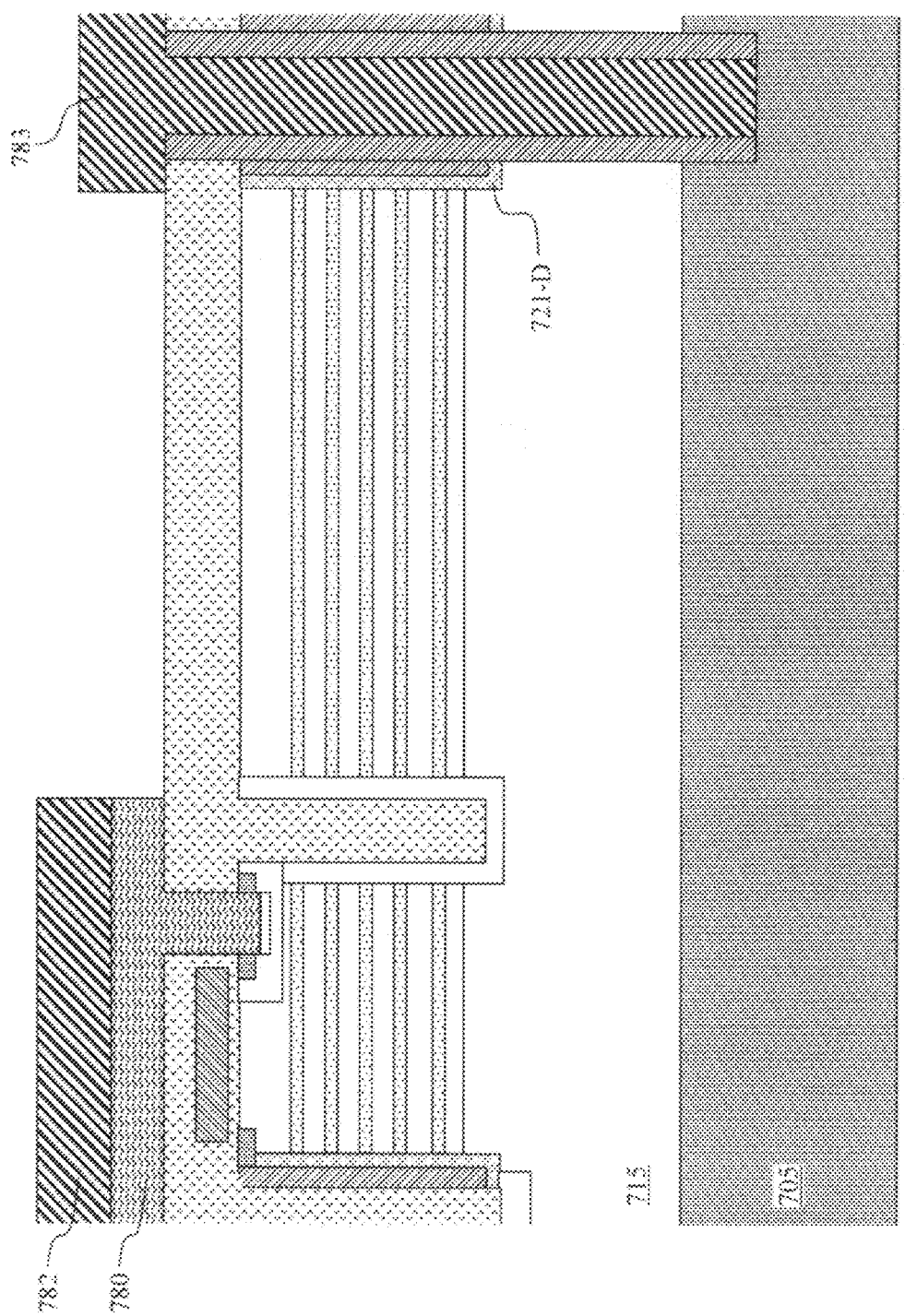

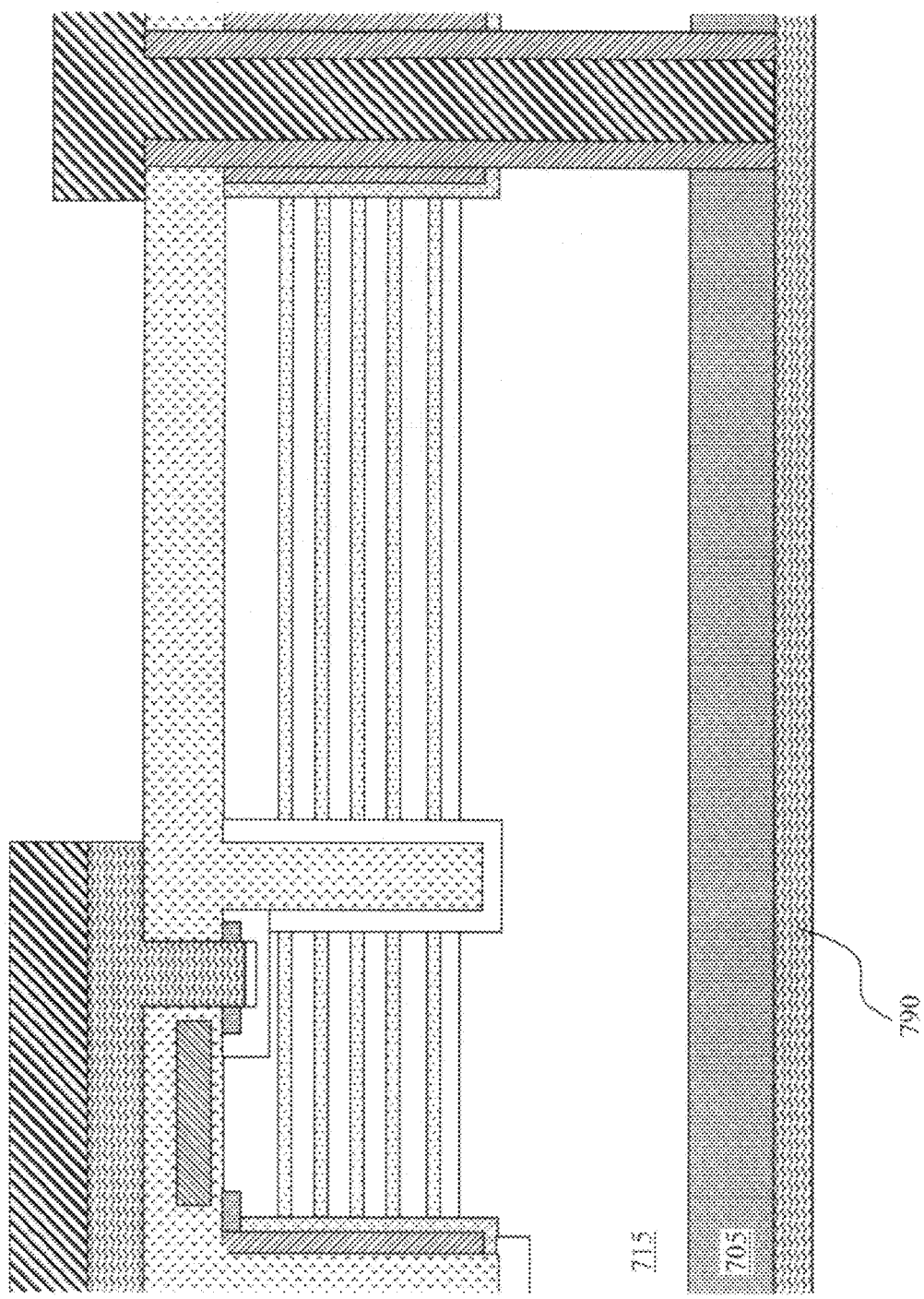

LATERAL SUPER JUNCTION DEVICE WITH HIGH SUBSTRATE-GATE BREAKDOWN AND BUILT-IN AVALANCHE CLAMP DIODE

This Patent Application is a Continuation in Part (CIP) Application of a co-pending Application with a Ser. No. 12/592,619 filed by a common Inventor of this Application on Nov. 30, 2009. The disclosure made in that Application is hereby incorporated by reference.

BACKGROUND OF THE INVENTION

1. Field of the Invention

The invention relates generally to semiconductor power devices. More particularly, this invention relates to configurations and methods to manufacture lateral power device including a super-junction structure with an avalanche clamp diode formed between the drain substrate and the gate. The lateral super-junction structure reduces on-resistance, while the structural enhancements increase the breakdown voltage between substrate and drain and improve unclamped inductive switching (UIS) performance

2. Description of the Prior Art

Conventional semiconductor power device such as the MOSFET power devices implemented with a super-junction structure can achieve performance improvements with significant reduction of the on-resistance while still maintaining a high breakdown voltage. However, the manufacturing technologies and device configuration for implementing the super-junction structures in the MOSFET devices are still confronted with manufacturability difficulties. The manufacturability and cost of the conventional vertical power devices designed for high voltage applications implemented with super-junction structures are limited due to the structural features that require numerous manufacturing processes which are time-consuming, complex, and expensive. The manufacturing processes according to current practice involve many sequential masking, implantation and epitaxial growth steps to build the vertical structure. Achieving a high density of alternately doped columns becomes prohibitive since it requires a direct increase in the number of these steps. Too many factors influence the accuracy of charge-balance between adjacent alternately doped columns, leading to narrow process margins as a high density of said columns is attempted. FIG. 1A shows a typical design for a MOSFET vertical super junction device, as disclosed by Tatsuhiko Fujihira in his paper "Theory of Semiconductor Superjunction Devices" published in Jpn. J. Appl. Phys. 36 (1997) pp. 6254-6262. It is difficult and costly to manufacture the vertical charge-balanced alternately doped columns of Fig. A, especially at high densities For these reasons, lateral JFET power devices with super junction structures formed with stacked horizontal layers of alternating dopant conductivity types overcome these difficulties. This device may be configured in cascade with a low voltage MOSFET to achieve the normally-off operation of a conventional device. Coe discloses a lateral power device in U.S. Pat. No. 4,754,310 with charge balanced super junction structure configured with stacked horizontal layers of alternating conductivity types extended between a source and drain column. Such structure of stacked horizontal layers can be efficiently manufactured without the use of masks. However, a typical device configuration as shown in FIG. 1B is limited by its drain-substrate breakdown voltage and is further restricted due to the difficulty in improving its unclamped inductive switching (UIS). FIG. 1C shows an example of another lateral super junction device as disclosed by Tatsuhiko Fujihira in the same paper as mentioned above, "Theory of Semiconductor Superjunction Devices". This device suffers from excessive channel resistance in distributing the current into the stacked n-type conduction paths.

Therefore, a need still exists in the art of power semiconductor device design and manufacture to provide new device configurations and manufacturing methods for forming the lateral power device such that the above discussed problems and limitations can be resolved.

SUMMARY OF THE INVENTION

It is therefore an aspect of the present invention to provide a new and improved device structure and manufacturing method to form the junction field effect transistor (JFET) and MOSFET power device on an P-epitaxial layer functioning as an intermediate semiconductor layer over an N substrate constituting a bottom semiconductor layer with lateral super junction structure extended between deep N type columns functioning as the source and drain columns, and a deep P+ column to function as the JFET gate. In this structure, the drain terminal is moved to the substrate in order to separate the two high current terminals to separate planes to allow for better current spreading. This is achieved by making the drain trench deeper than that of source and gate, so that the drain terminal cuts through the P epitaxial region and contacts the N+ substrate. This configuration also results in the formation of a concave or saddle N+ drain substrate-P-epitaxial N+ drain column junction that can be designed to achieve high substrate blocking voltage. In addition, an N+-P-P+ gate-drain avalanche clamp diode is formed from the N+ drain substrate to the P-epitaxial to the P+ gate column to provide a rugged high voltage diode that diverts the avalanche current away from the superjunction layers of this device.

Another aspect of this invention is to provide a new and improved device structure and method to manufacture a normally off semiconductor power device with a structure that integrates a low voltage MOSFET with the super-junction JFET. The low voltage MOSFET is disposed near the device surface with a configuration to achieve the cascode connection required to make the normally off switch.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1C is a cross section of a perspective view of a conventional lateral super junction power device.

FIGS. 3A-1 to 3C-1 are a series of cross sectional views showing an alternative method of forming a lateral super junction power device of this invention.

FIGS. 5D to 5F are cross sectional views taken along cross section lines A-A, B-B and C-C of FIG. 5B.

FIGS. 6A-1 to 6A-3 are cross sectional views taken along cross section lines D-D and E-E of FIG. 6A.

FIG. 6C-1 is a cross sectional view taken along cross section line F-F of FIG. 6C.

FIG. 6D is a top view showing multiple rows of JFETs in stripe configuration.

FIG. 7A is a top view showing a closed cell configuration of a lateral super junction JFET of this invention.

FIG. 7A-1 is a cross sectional view taken along cross section lines G-G of FIG. 7A.

FIGS. 7B and 7C are top views showing how a MOSFET may be integrated with a JFET of FIG. 7A.

FIG. 7C-1 is a cross sectional view taken along cross section line G-G of FIG. 7C.

DETAILED DESCRIPTION OF THE METHOD

Figure 1A:
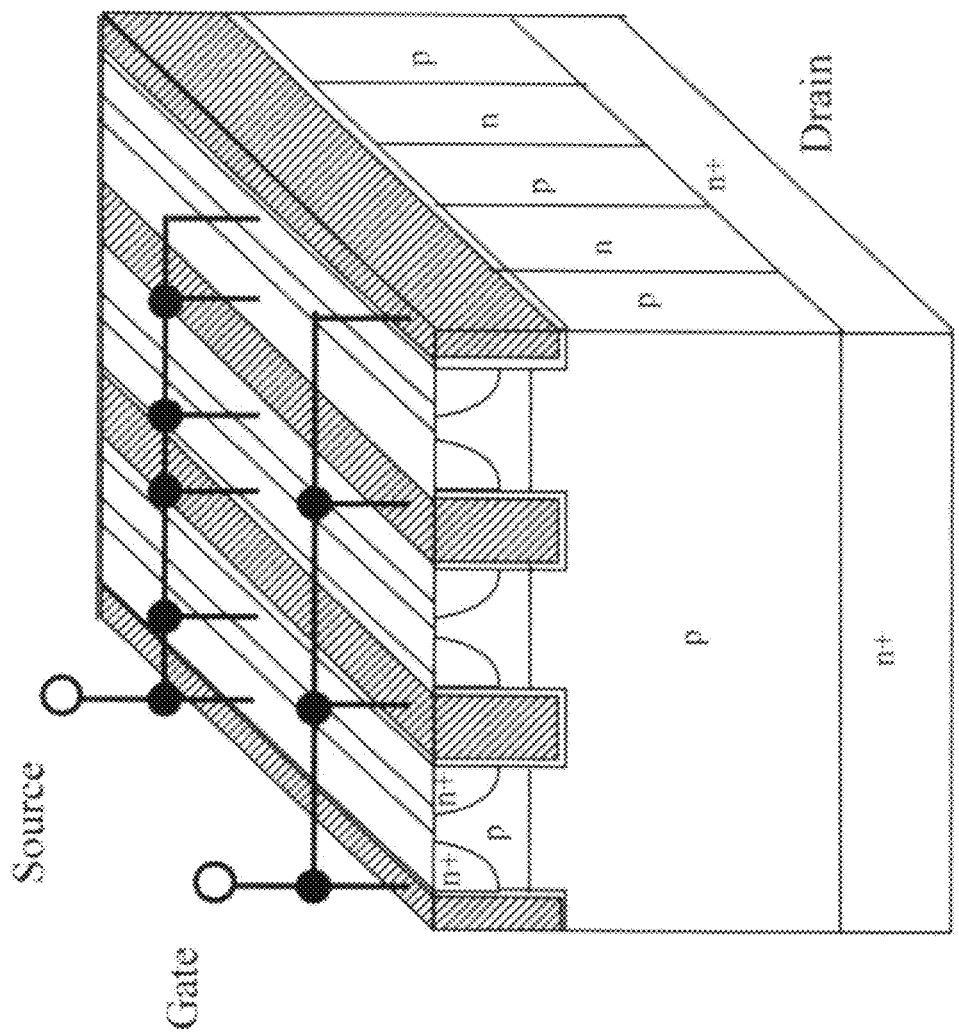
FIG. 1A is a cross sectional view for showing a conventional configuration of a vertical super junction power device.
Figure 1B:
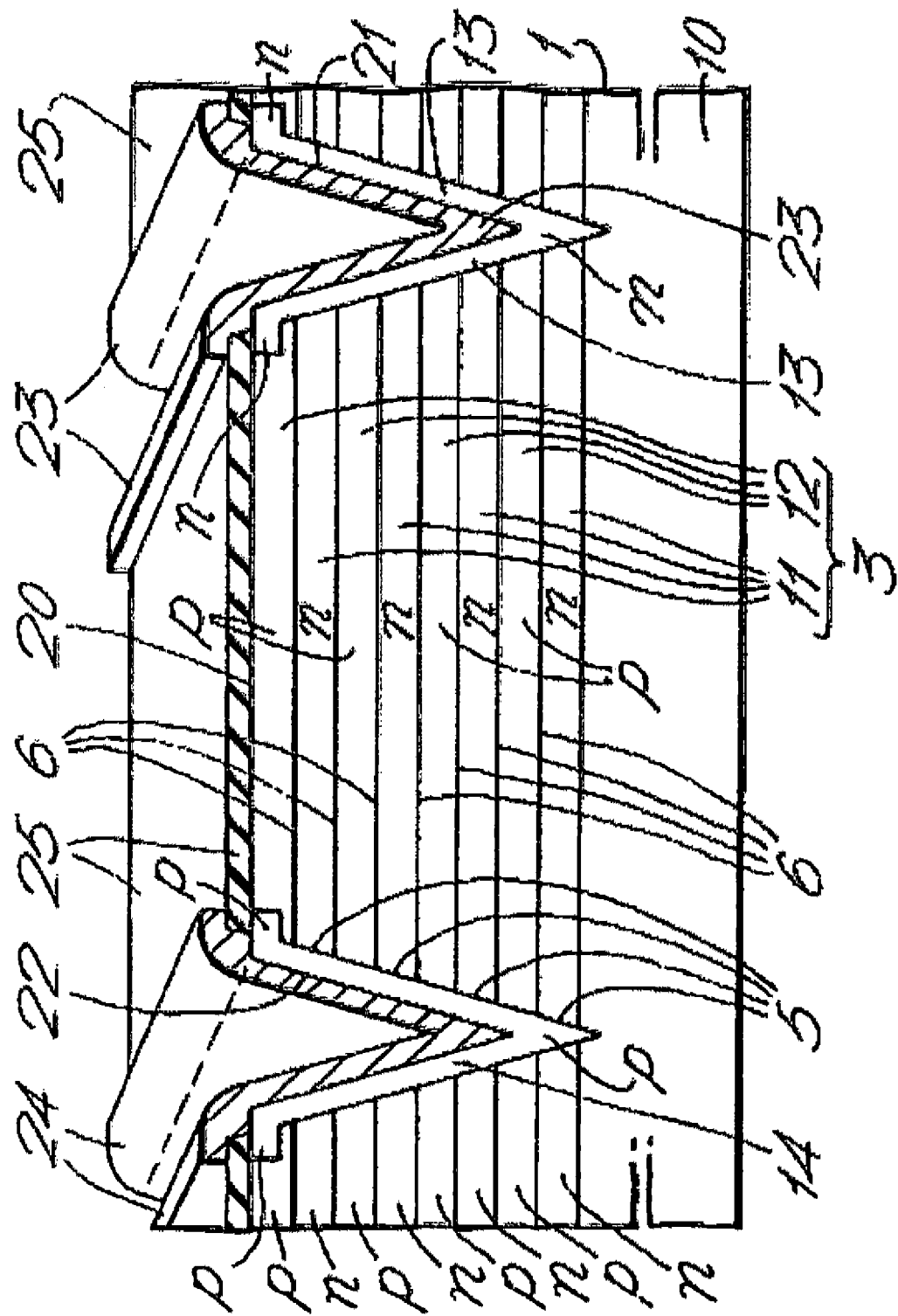
FIG. 1B is a cross sectional view of a conventional lateral super junction power device.
Figure 2:
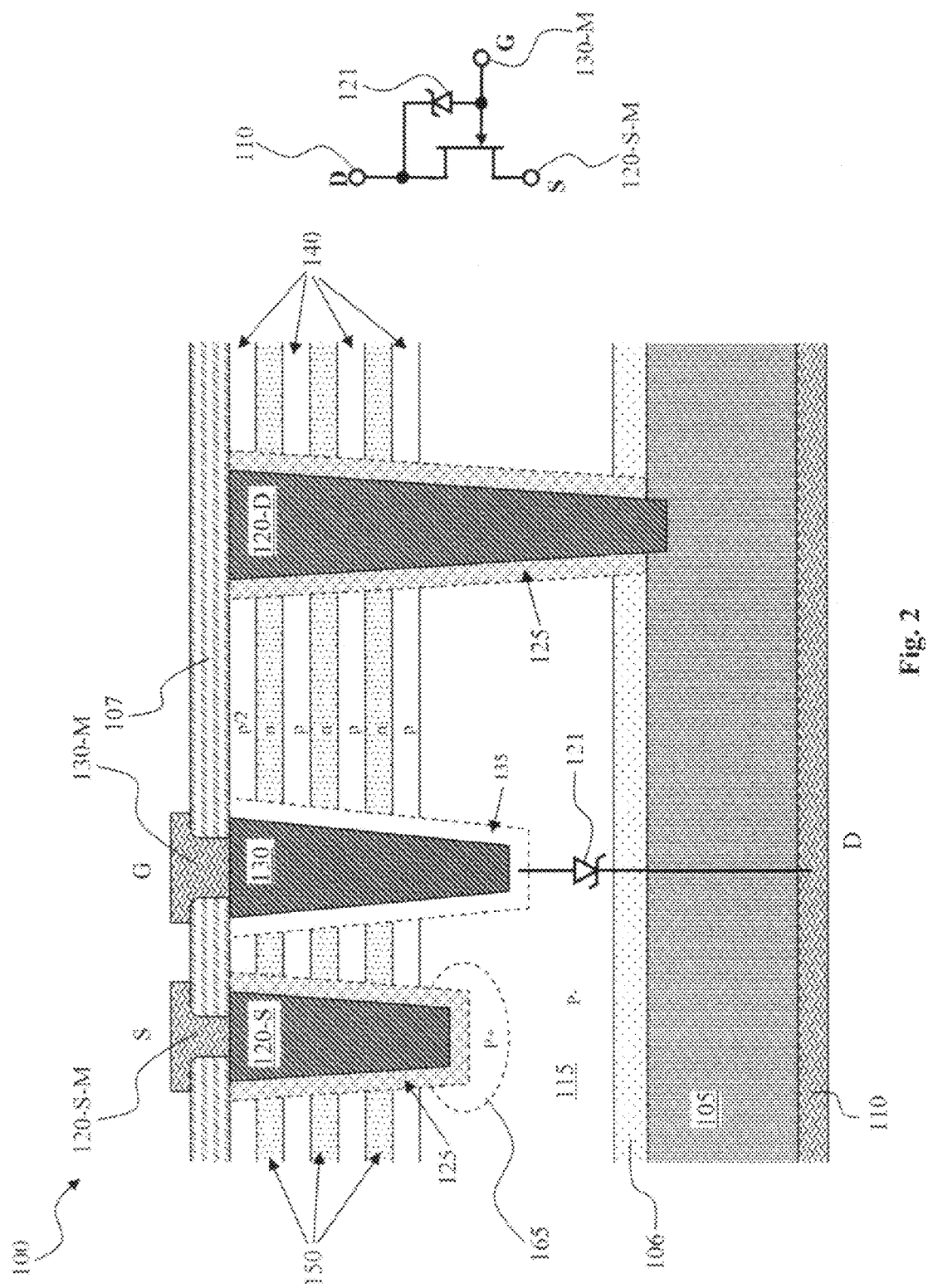
FIG. 2 is a cross sectional view of a lateral super junction power device of this invention.

FIG. 2 is a cross sectional view of a lateral super junction high-voltage (HV) JFET device 100 having a bottom drain substrate of the present invention. The lateral JFET device 100 is supported on a P-Epitaxial layer 115 and an optional N buffer region 106 on an N+ substrate 105 functioning as a drain. The lateral JFET device 100 includes a drain metal electrode 110 disposed on the bottom of the substrate 105. The lateral power device 100 further includes an N source column 120-S and an N drain column 120-D formed respectively as first and second conductive columns disposed in a first trench and a second trench respectively on two opposite sides on the substrate. In this embodiment, each of these source and drain trenches may comprise a conductive material in the trench such as a metal fill or polysilicon surrounded by an N+ doped region 125. Of course, any other scheme may be utilized to form the N+ drain and source columns 120-D and 120-S. The N+ source column 120-S contacts a source metal 120-S-M on the top surface through the oxide 107. The drain 120-D disposed in the trench extends downwardly to reach the N+ drain substrate layer 105. The source trench is etched down into the P epitaxial layer 115. A P+ doped region 165 is disposed below the source 120-S to suppress activation of the parasitic NPN bipolar transistor formed from the N+ source column 120-S to the P-epitaxial layer 115 to the N+ substrate 105. The heavily doped P+ region 165 in the P-epitaxial layer 115 greatly reduces the minority carrier lifetime to suppress the parasitic NPN transistor.

The lateral JFET device 100 further includes a P+ doped column 130 disposed in another trench functioning as a gate of the lateral power device. Like the N+ source and drain columns 120-S and 120-D, the P+ gate column 130 comprises a trench filled with metal or polysilicon surrounded by a P+ doped region 135. The P+ gate column 130 and the P-epitaxial layer 115, and the optional N− buffer region 106, are further designed to form an avalanche diode 121 to clamp the breakdown voltage. A super junction device is normally very vulnerable to damage from avalanche breakdown. If avalanche breakdown occurs in the charge balanced regions, the avalanche current tends to focus and magnify on the small area in which it started, permanently damaging that area. The avalanche diode 121 diverts the avalanche current path away from the charge balanced super junction region so that it instead flows between the bottom of the P+ gate column 130 and the N+ drain layer 105, thus increasing the robustness of the device. The P+ gate column 130 is connected to a gate metal 130-M on the top surface. The source and drain 120-S and 120-D may also be formed with N+ doped polysilicon filling in the trenches or may be formed with metal plug filling the trenches with N+ doped sidewalls. Alternatively, the trenches may be filled by epitaxial growth or formed by any other method. It is important that the sidewalls of the trench are formed with an N+ doped semiconductor material.

The lateral power device has a super-junction structure formed as multiple layers of alternating horizontal P doped layers 140 and N doped layers 150. These alternating P doped and N doped layers provide charge balanced conduction channels between source 120-S and the drain 120-D. The electric current is conducted along a lateral direction with a gate 130 that controls and switches on and off the power device. The gate 130 in FIG. 1 is disposed at a different plane from the source and drain and therefore does not cut off the lateral channels formed in the super-junction structure with the alternating N and P doped layers. Both the gate column 130 and the source column 120-S should be formed to be deeper than the super-junction structure so as to have contact with the P epitaxial layer 115. The gate column 130 may be formed to the same depth as the source column 120-S, or it may be formed deeper than source column 120-S. Forming the gate column 130 deeper than source column 120-S can help direct avalanche current to the gate column 130 and avalanche diode 121 rather than to the parasitic NPN transistor under the source column 120-S. The schematic circuit of the lateral superjunction JFET device 100 shows the drain metal 110, source metal 120-S-M and the gate metal 130-M as the device terminals. The avalanche diode 121 is formed between the gate and the drain.

Figure 3A:
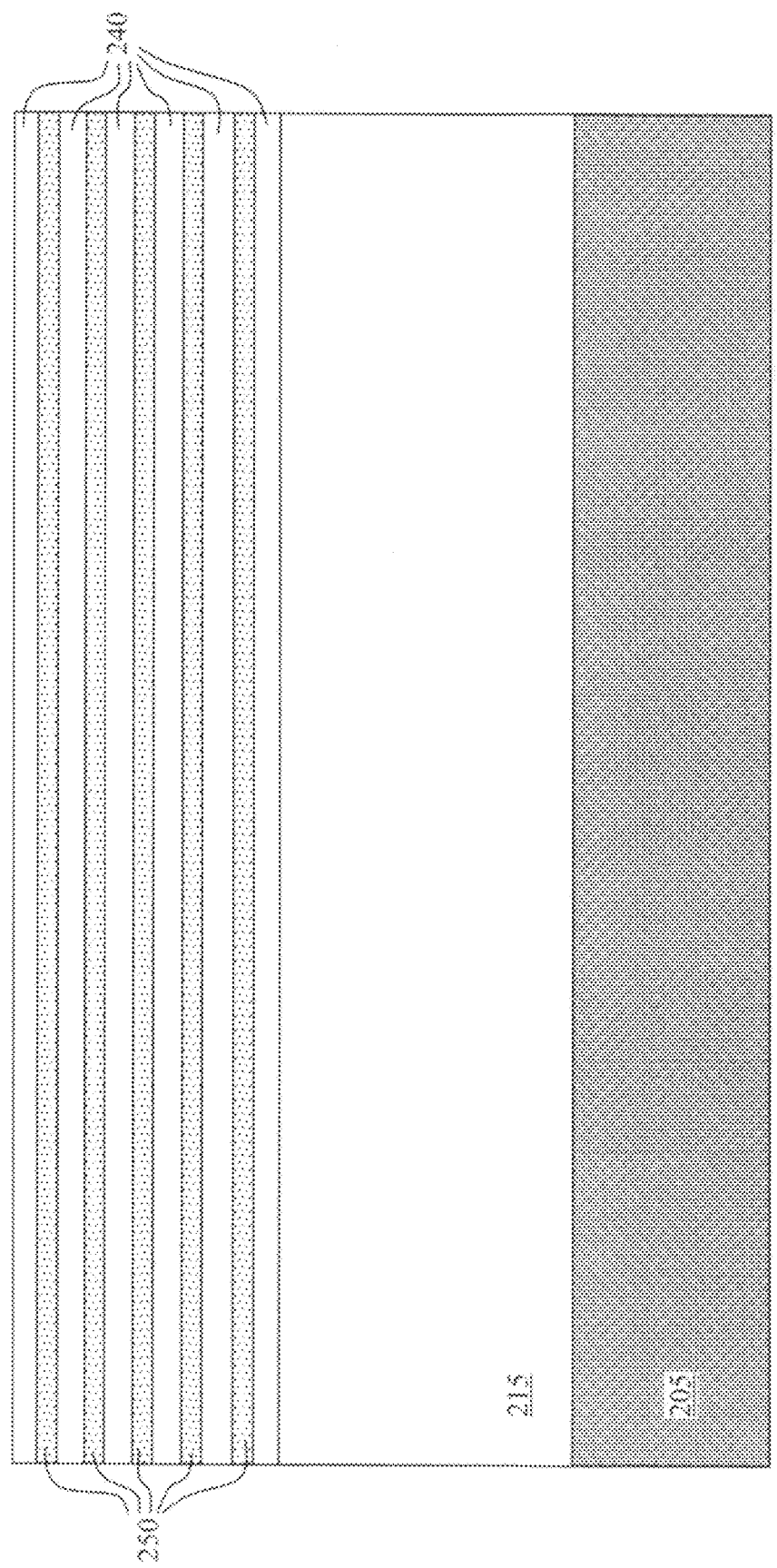
FIGS. 3A to 3N are a series of cross sectional views showing a method of forming a lateral super junction power device of this invention.
Figure 3C:
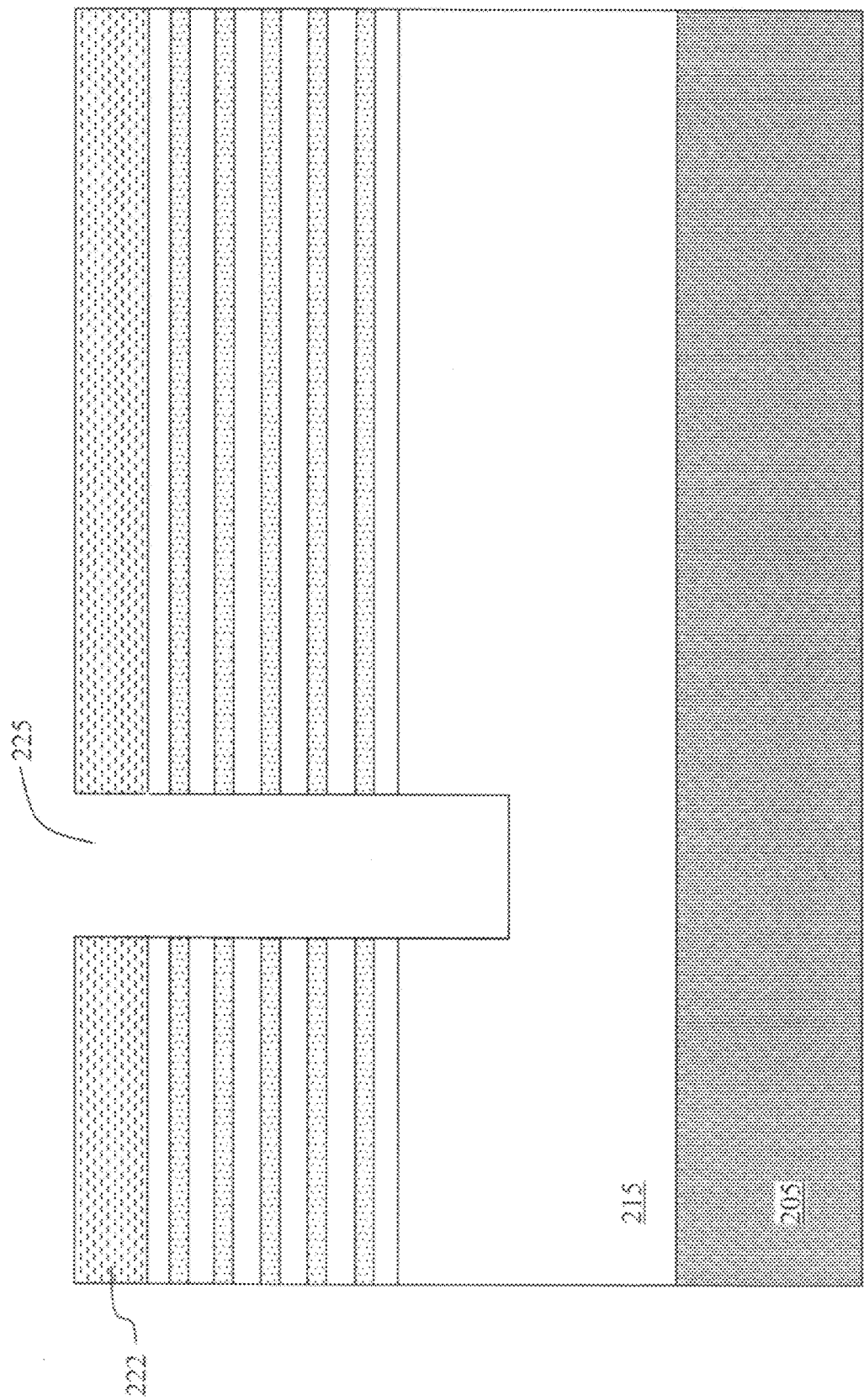
Figure 3D:
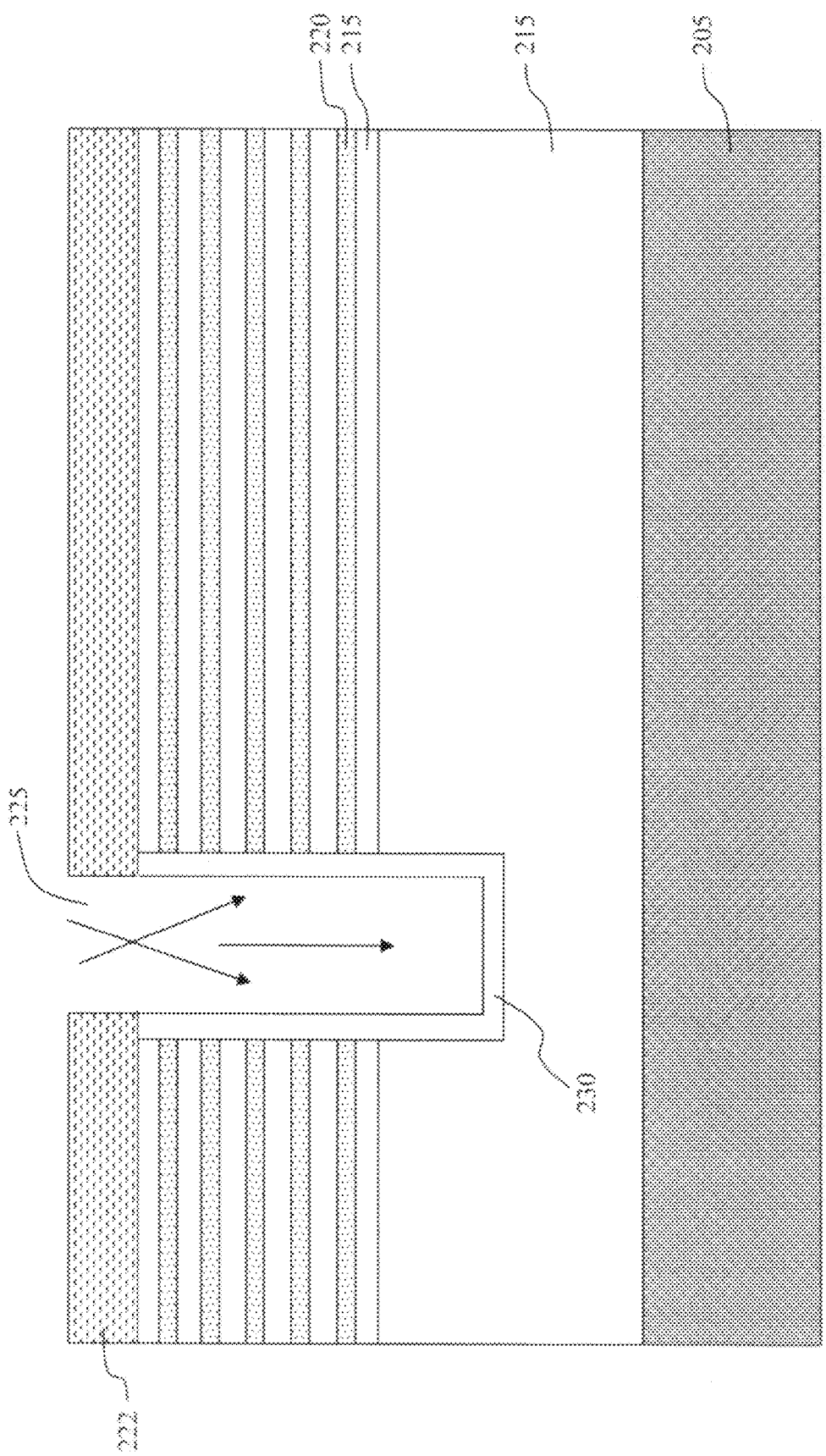
Figure 3F:
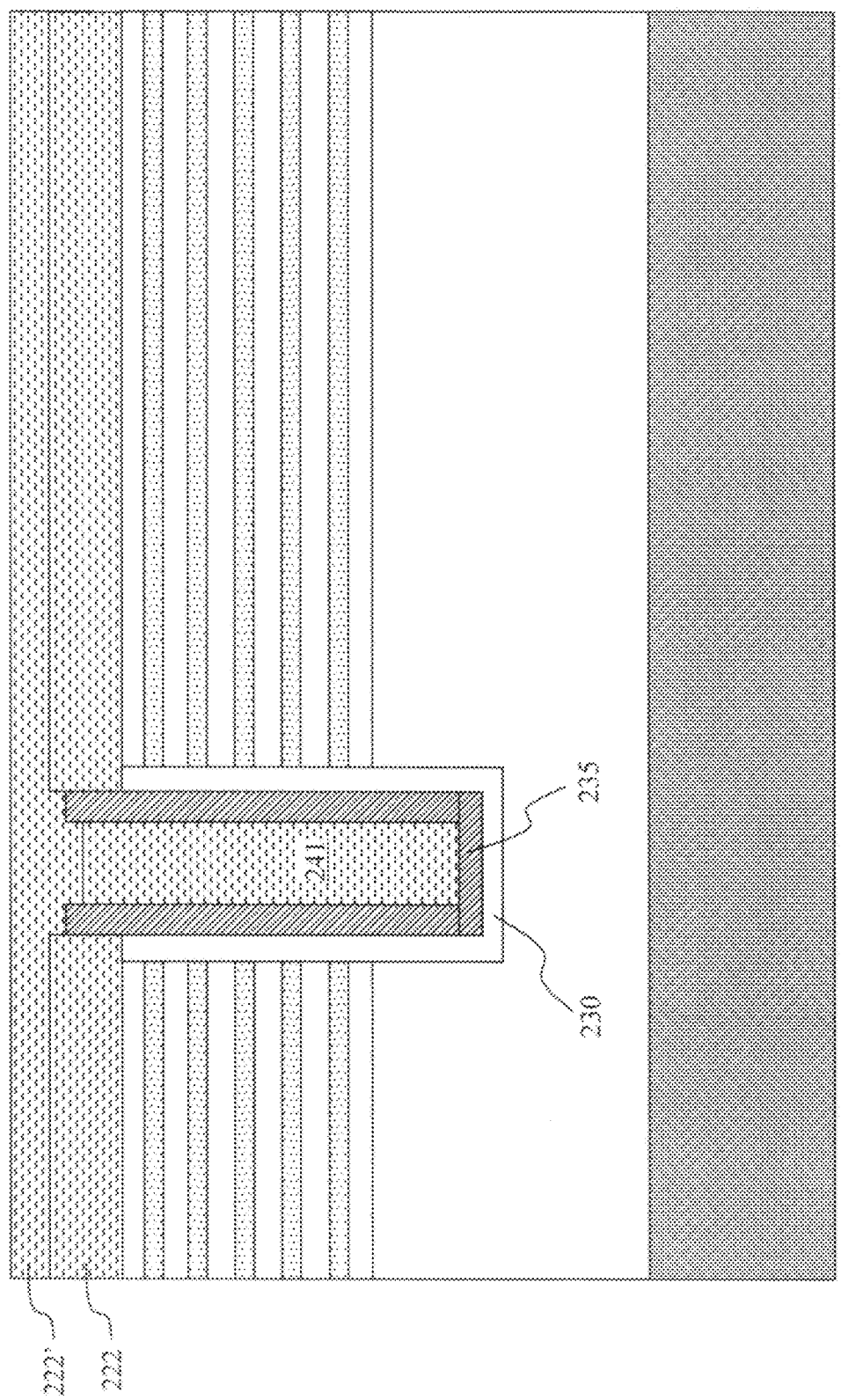
Figure 30:
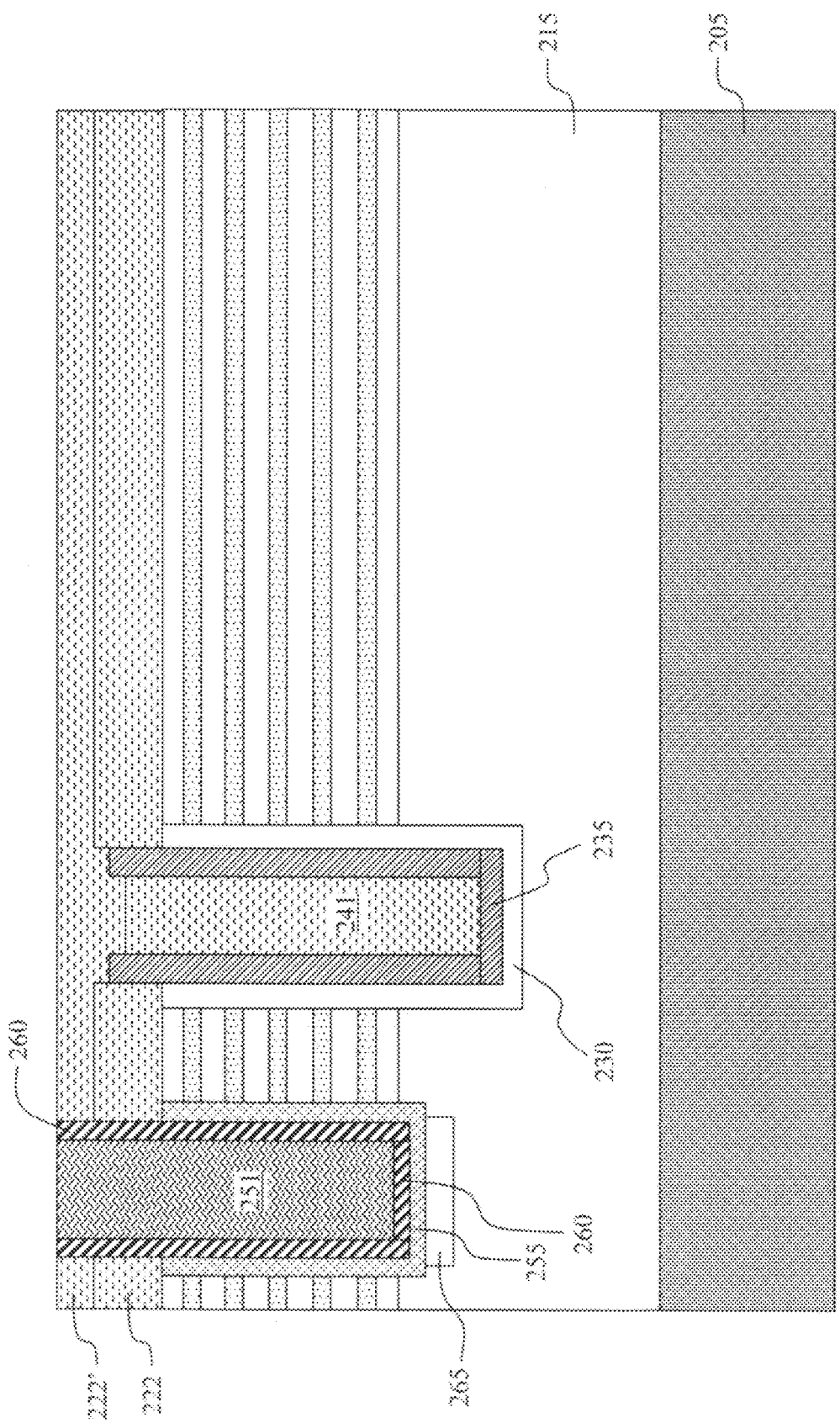
Figure 3K:
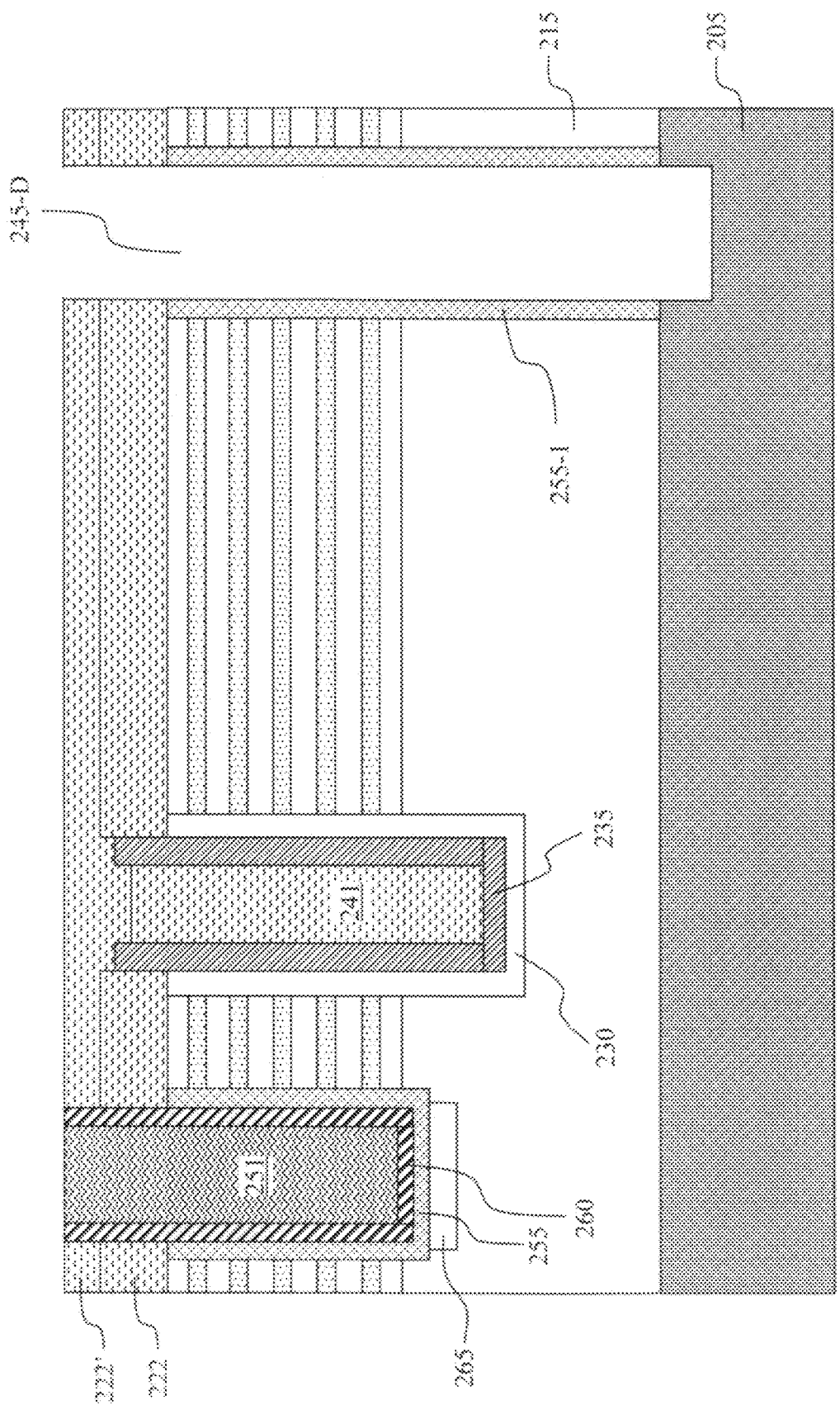
Figure 31:
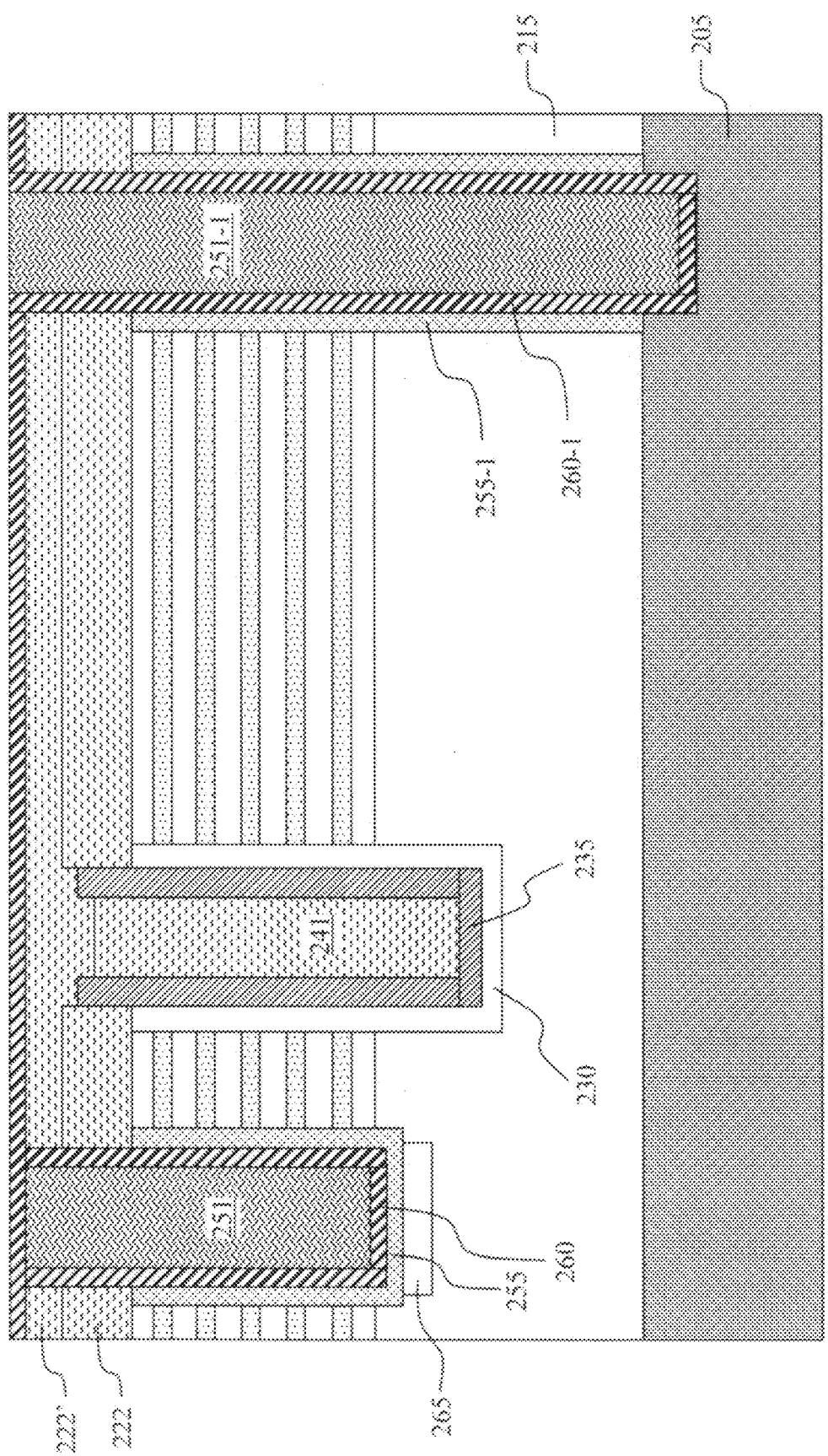
Figure 3M:
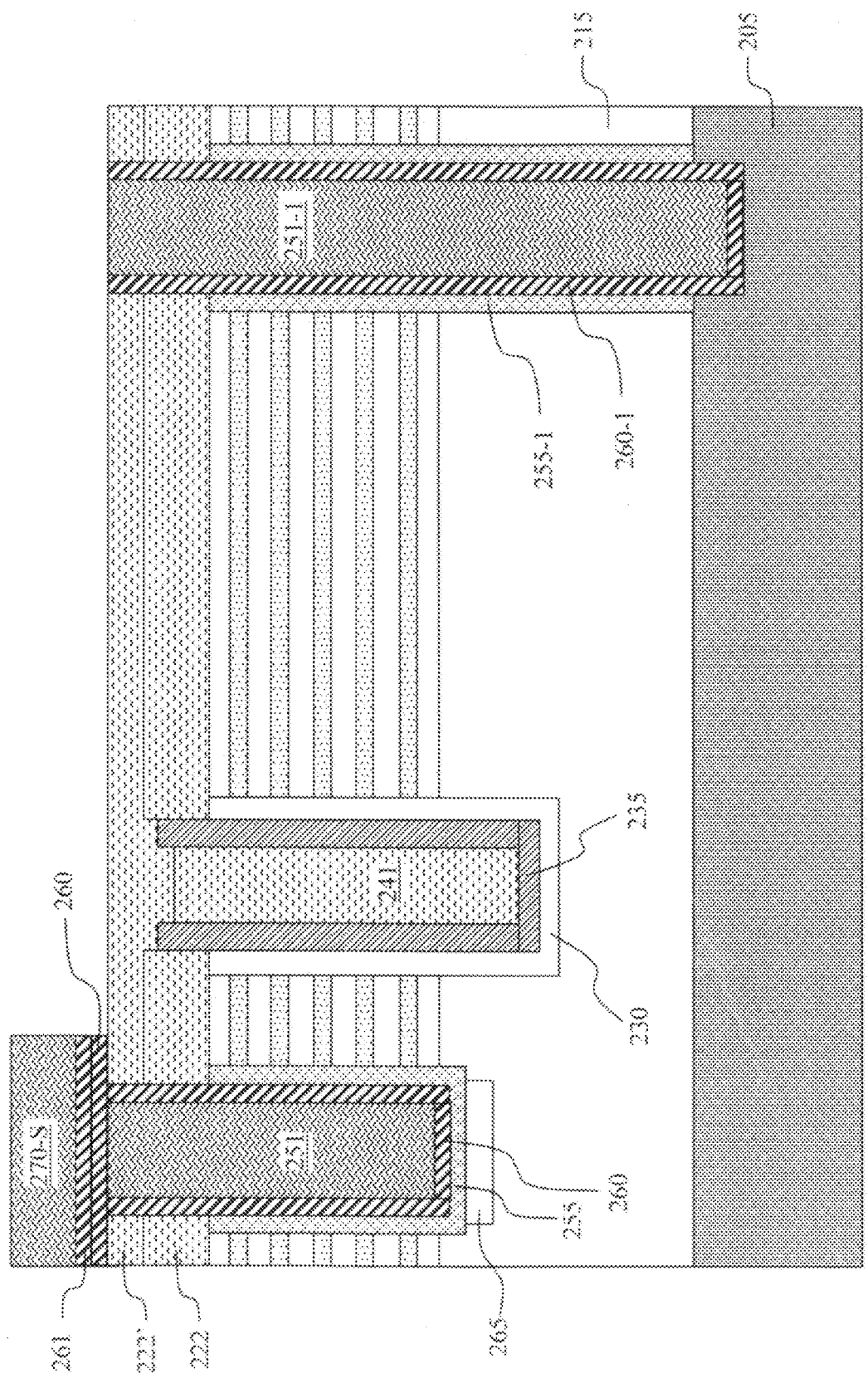
Figure 3N:
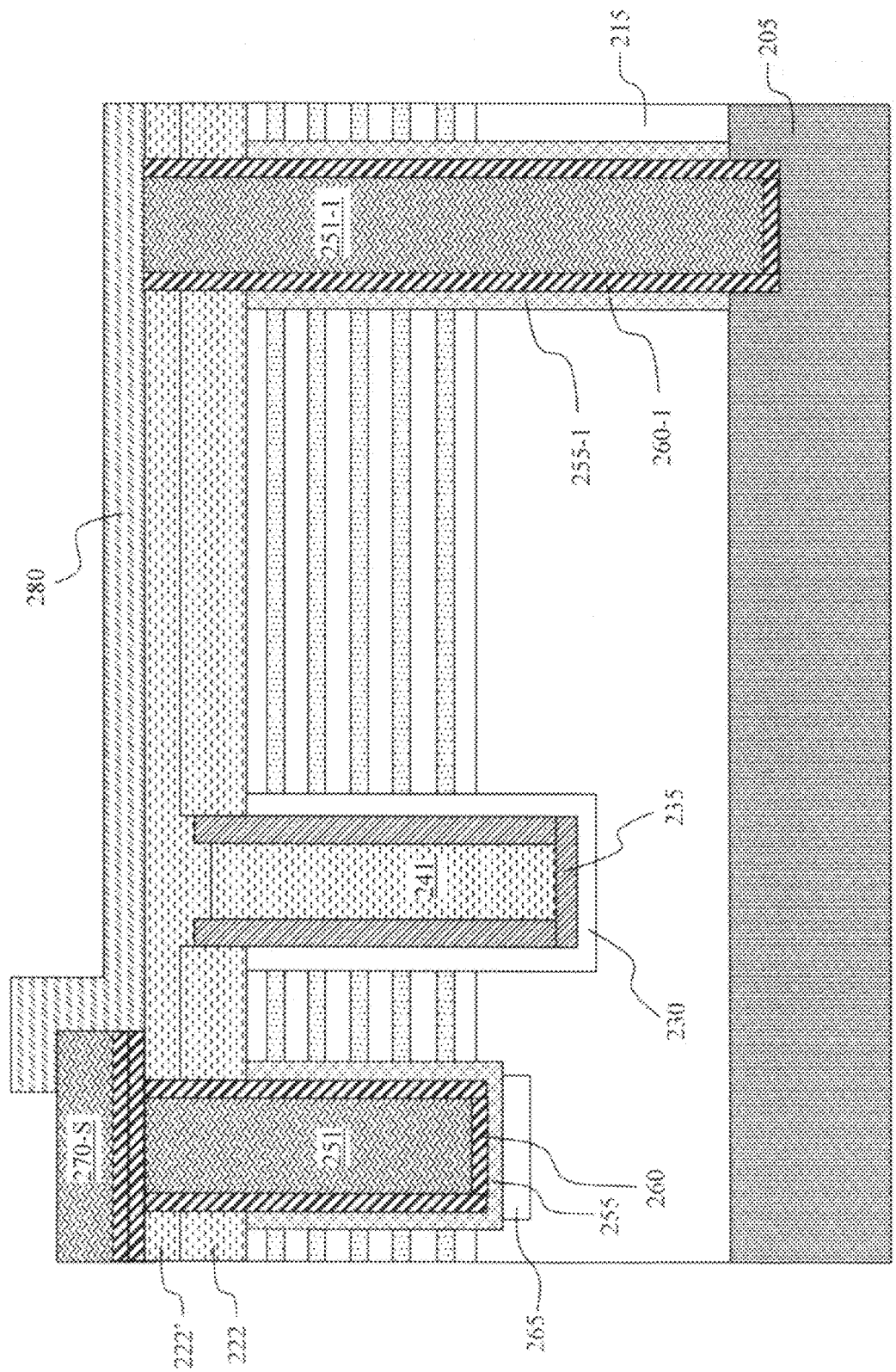
Figures 1, 3A:
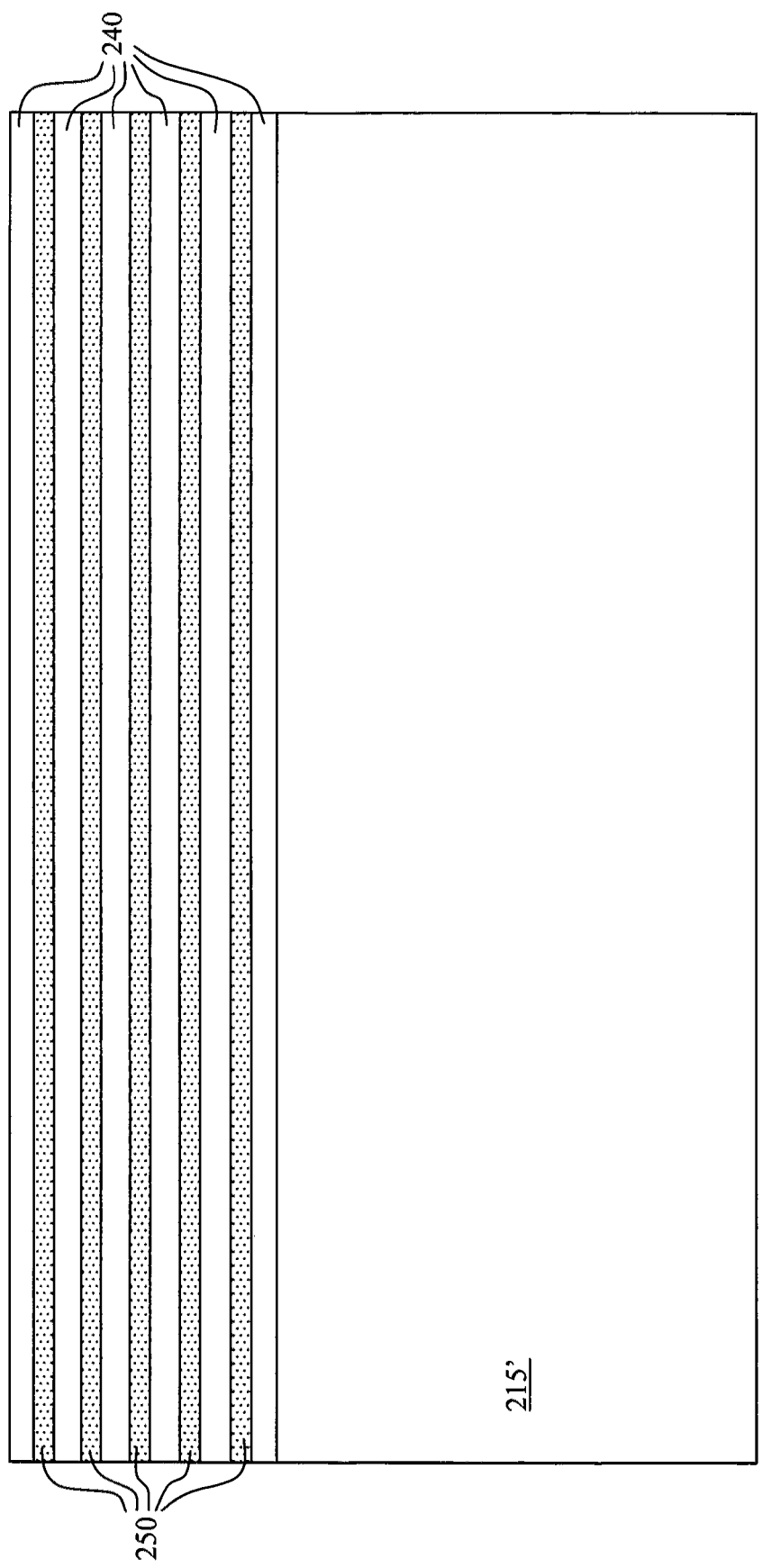
Figures 1, 3B:
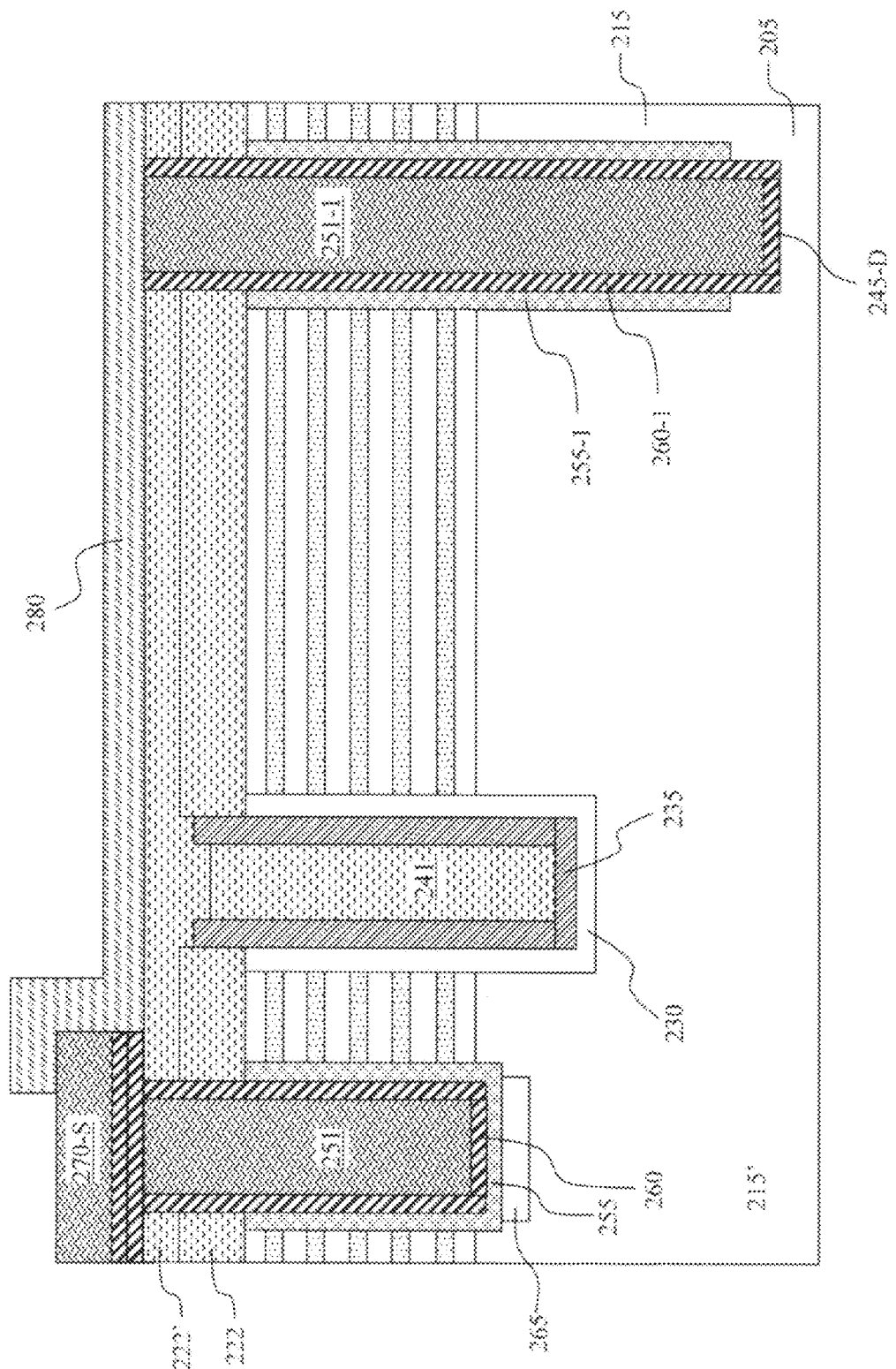
Figures 1, 3C:
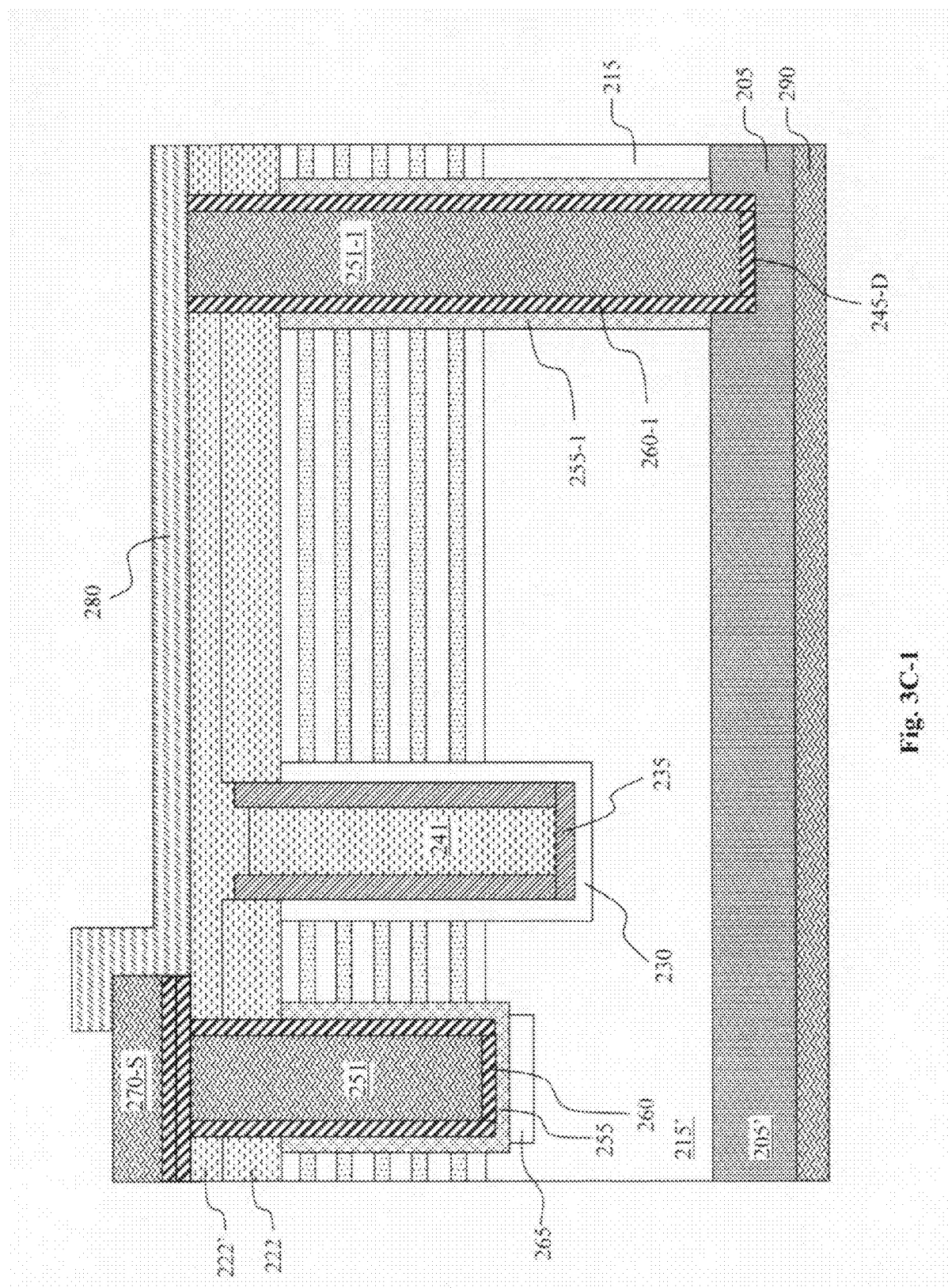

FIGS. 3A to 3N are a series of cross sectional views for illustrating the processing steps for manufacturing a JFET device with lateral super-junction structure of this invention. FIG. 3A shows a P+ substrate 205 supporting a P-epitaxial (P-epi) layer 215 with a dopant concentration and layer thickness designed to block a voltage of 600 volts. Alternating P and N dopant layers 240 and 250 respectively are formed on top of P-epi layer 215 as charge balanced layers, e.g. by using one of the processes described in FIGS. 10 to 12 of U.S. application Ser. No. 12/592,619. In FIG. 3B, a hard mask layer 222 is formed, e.g., through a thermal oxide process to grow an oxide layer with a layer thickness of approximately 205 Angstroms followed by oxide deposition to form thick oxide layer to function as a hard mask layer 222. A photoresist mask is used to etch through the hard mask 222 and form opening 223. In FIG. 3C, a silicon etch process is carried out to open the gate trenches 225 extending vertically through the super-junction structure of alternating P and N dopant layers 240 and 250 to reach the P-epitaxial layer 215 having a depth of approximately 60 micrometers and a width of about 10 micrometers. The gate trench 225 may be formed with a slight taper of 88 degrees to improve the manufacturability of the device. In FIG. 3D, a P+ implant with boron ions into the gate trench to form the P+ region 230 surrounding the gate trenches 225. By way of example, the boron implants may comprise implants having implant energy of about 40 keV, concentration of about $5E15$ $cm^{-2}$, and a tilt angle of about seven degrees and four 90-degree rotations and a perpendicular boron ion implant of the same ion flux. In FIG. 3E, a polysilicon lining layer 235 is first formed on the sidewalls and bottom surface of the gate trenches 225, then an oxide layer 241 is filled into the gate trenches. The polysilicon layer may also be doped P+ to reduce the resistance of the gate trench. Then a polysilicon and oxide etch back is carried out to remove the polysilicon and oxide above the top surfaces. The polysilicon layer 235 is optional, but can act as a convenient endpoint when etching or chemical mechanical polishing (CMP) back the oxide layer 241. The polysilicon 235 may also be deposited undoped—later P type dopants from the P+ layer 230 will diffuse into the polysilicon 235.

In FIG. 3F a second oxide layer 222' is deposited on top of the first oxide layer 222. In FIG. 3G, a source mask is applied to open trench openings 224 through the oxide layers 222 and 222'. In FIG. 3H, source trenches 245-S are etched through the super-junction structure to a depth reaching the P-epi layer 215. In one embodiment the depth of the trenches is approximately between 40 and 44 micrometers and having a width of about ten micrometers. At any rate, the source trenches 245-S should end in the P-epi layer 215. Then the fabrication processes proceed with an angled N+ implant of about 7 degrees tilt followed by a perpendicular N+ implant to form N+ regions 255 surrounding the sidewalls and bottom of the trenches 245-S. In FIG. 3I, a perpendicular P+ implant is carried out to form the P+ regions 265 at the bottom of the trenches 245-S. In FIG. 3J, a Ti/TiN layer 260 is first deposited covering the sidewalls, the bottom surface of the trenches and over the top surface of the oxide 222'. Then, a thick metal layer 251 of 6-8 micrometers is deposited to fill the trenches 245-S. A chemical mechanical planarization (CMP) process is carried out to remove the top portion of the metal layer 251 and Ti/TiN layer 260 to form a planar top surface. In FIG. 3K, a drain trench mask is applied to etch a drain trench 245-D in the semiconductor material, e.g. by oxide etch followed by silicon etch. The drain trench 245-D reaches down through the super junction structure and the P-epi 215 to reach the N+ substrate 245. N+ regions 255-1 are formed along the sidewalls of the drain trench 245-D. Another Ti/TiN layer 260-1 is formed on the sidewalls of the trench and a metal 251-1 if formed on the Ti/TiN layer 260-1. The metal 251-1 can be CMP back on top, as shown in FIG. 2L. A second metal layer is deposited on the top surface covering over the Ti/TiN layer 260. Another Ti/TiN layer 261 may optionally be deposited before the metal layer 270 is deposited. A metal mask is applied to pattern the metal layer into a source metal 270-S, gate metal (not shown) and optionally a top drain metal (not shown), as shown in FIG. 3M. The gate 230 may be connected to a gate metal (not shown) in the third dimension. In FIG. 3N, a passivation layer 280 formed e.g., with a layer comprising a standard SiO2/nitride/polyimide stack followed by applying a passivation mask to pattern the passivation layer 280 to expose the source metal 270-S. The processes continue by carrying out a back grinding operation is performed followed by a back metal process to form a bottom drain metal layer, similar to a step as that shown in FIG. 8Q, then forming a bottom drain metal layer, similar to the layer 790 as shown in FIG. 8Q, on the bottom surface of the P+ substrate 205, to complete the manufacturing processes.

There can be many alternative methods for forming the lateral superjunction JFET of this invention which should be obvious to one proficient in the art. For example, there may be many ways to form gate, drain and source columns.

In an alternative method starting in FIG. 3A-1, the super junction structure may be initially formed on a single P-type substrate 215'—the P type substrate 215' would be similar to the P-epi layer 215 of FIG. 3A, but does not include N+ substrate 205. The other processing steps are the same up to the back-grinding step of FIG. 3N. At this point, the back side of P-type substrate 215' is ground back to, or close to the bottom of drain trench 245-D, as shown in FIG. 3B-1. The N+ dopant ions can be implanted into the back side of the device to form N+ drain 205', which connects to the drain trench 245-D, and a back drain metal 290 may be formed as that shown in FIG. 3C-1. Some other alternative techniques are shown later in the specification.

Figure 4A:
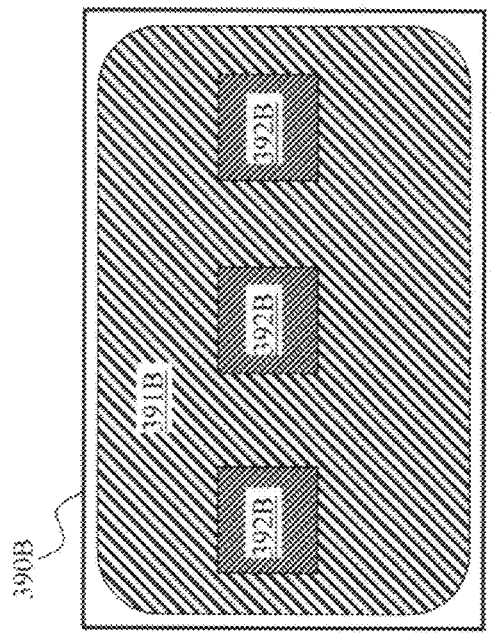
FIGS. 4A to 4C are top views for showing possible layouts for integrating a MOSFET with a lateral super junction power device of this invention.
Figure 4B:
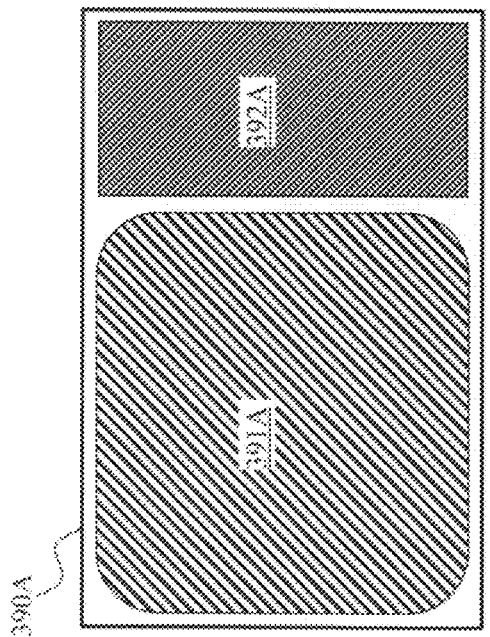
Figure 4C:
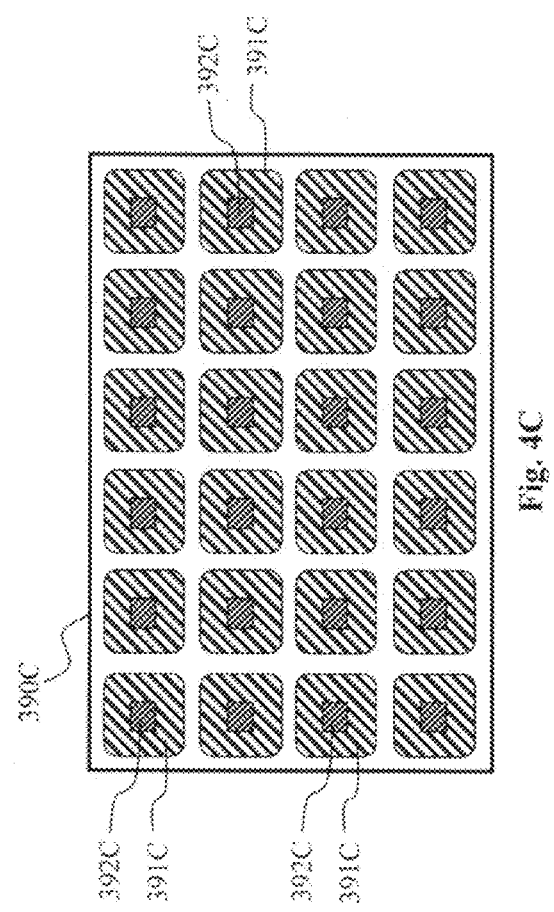

A JFET is a normally on device. In many applications a normally off power switch is preferred over a normally on power switch for various reasons including the device being off at circuit start-up, compatibility with existing designs, and familiarity. FIGS. 4A-4C show three possible layouts of integrating a low voltage MOSFET with a high voltage lateral super junction JFET of this invention together on a single semiconductor die. The MOSFET can be arranged with the JFET in a cascode configuration like the circuit shown in FIG. 4A in order to make the device a normally off power switch device. In FIG. 4A, the semiconductor die 390A contains a high voltage lateral super junction JFET 391A of this invention and a low voltage MOSFET region 392A. The JFET 391A and the MOSFET 392A each occupy a separate portion in the die 390A. In FIG. 4B, three MOSFET regions 392B are distributed throughout a single large JFET region 391A to reduce package resistance and inductance in a die 390B. In FIG. 4C, a MOSFET 392C is integrated at the device cell level of JFET 391C in a die 390C. As shown in FIG. 4C, a MOSFET 392C is integrated with each cell of JFET 391C. The MOSFETs and JFETs may be connected internally and/or externally in the cascode configuration. The low voltage MOSFET is very well known in the art and can come in any number of forms including lateral MOSFET, vertical MOSFET, trench gate, planar gate, etc, and there can be a number of different packaging schemes for connecting the MOSFET to the JFET in a cascode circuit configuration.

Of course, a MOSFET can also be co-packaged with a lateral superjunction JFET of this invention in a single package having separate MOSFET and superjunction JFET semiconductor dies. The semiconductor dies can be co-packaged side-by-side or in a stacked configuration.

Figure 5A:
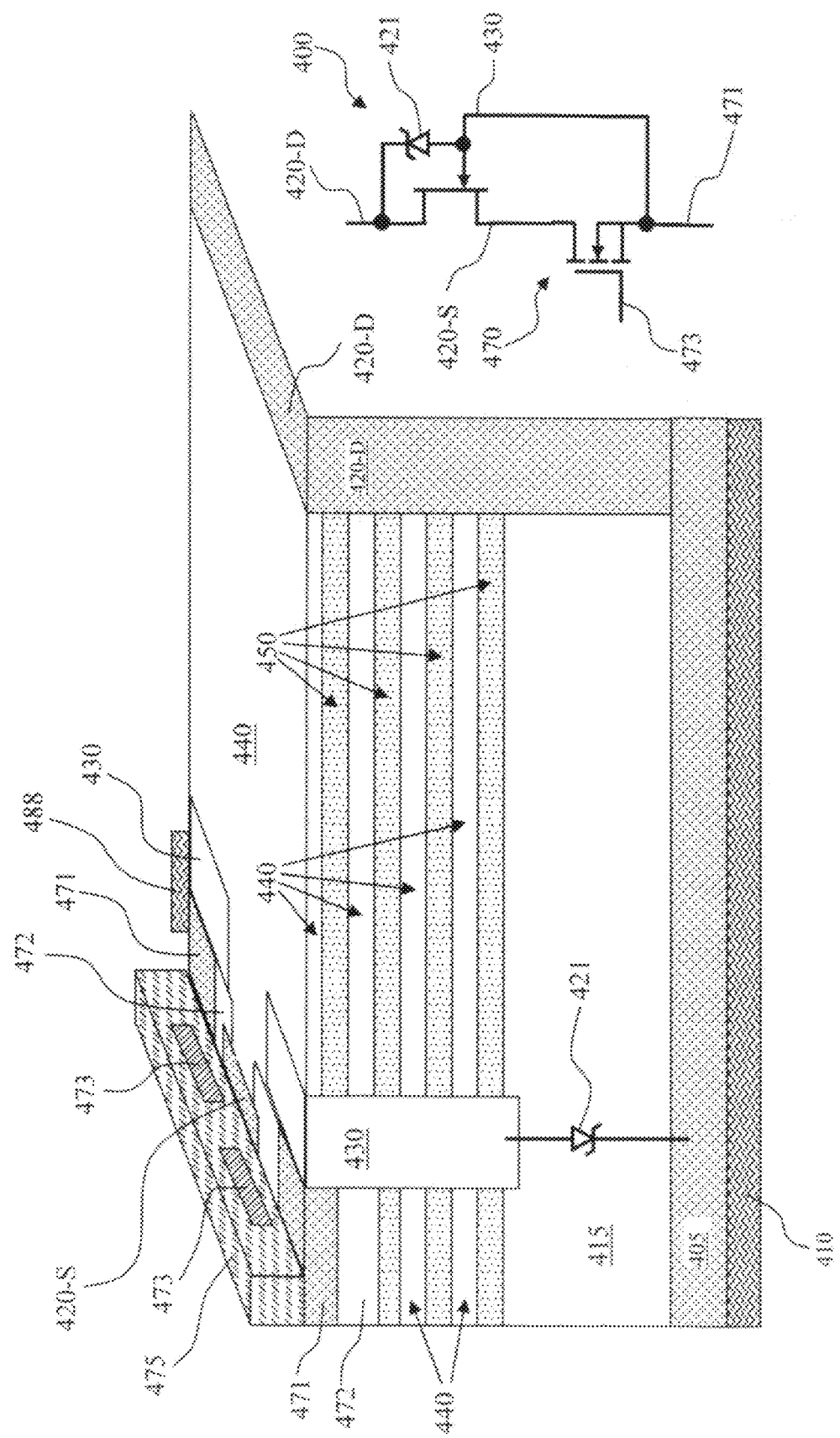
FIGS. 5A to 5B are cross sections of perspective views for a MOSFET integrated with a lateral super junction power device of this invention.

FIG. 5A shows a cross section of a perspective view of a MOSFET 470 integrated with a high voltage lateral super junction JFET 400 of this invention. In this embodiment, a MOSFET 470 is integrated into each JFET 400 cell, like in the layout of FIG. 4C. In this layout, the lateral Low Voltage MOSFET 470 is placed in the $3^{rd}$ dimension, perpendicular to the plane channel direction of the lateral Super-Junction JFET 400. The JFET 400 is similar in structure to the lateral superjunction JFET 100 of FIG. 2. In these figures, the JFET N+ drain and source columns and JFET P+ gate columns are represented as simple N and P doped columns (420-D, 420-S, 430). The doped columns 420-D, 420-S, and 430 operate in the same way as the N and P columns of JFET 100. In this embodiment, the MOSFET 470 comprises an N+ source region 471 in a P body region 472. The MOSFET N+ source 471 also acts as the overall source of the cascode circuit. The MOSFET 470 further comprises a planar gate 473 in oxide 475 which also acts as the overall gate of the cascode circuit. The N+ drain of the MOSFET 470 doubles as the N+ source column 420-S of the JFET 400. The lateral super junction structure of the JFET 400 comprises charge balanced, alternating stacked P layers 440 and N layers 450, to form a lateral super junction drift region running from the JFET N+ source column 420-S to the JFET N+ drain column 420-D. The super junction structure is supported on a P epitaxial layer 415 over an N+ drain substrate 405. The drain column 420-D extends down to contact the N+ drain substrate 405. A drain metal 410 may be located beneath the N+ drain substrate 405. The JFET N+ drain column 420-D (and N+ drain substrate 405 and drain metal 410) act as the overall drain of the cascode circuit. The JFET 400 is controlled by the JFET P+ gate column 430, which extends down through the super junction P and N layers 440 and 450 to contact the P-Epitaxial layer 415. The JFET P+ gate column 430 is shorted to the MOSFET N+ source region 471 by a source metal 488, in accordance to the cascode circuit. In accordance with this invention, an avalanche diode 421 is formed from the bottom of the JFET P+ gate column 430 through the P-epitaxial layer 415 to the N+ drain substrate 405. The avalanche diode 421 diverts avalanche current away from the super junction structure formed from charge balanced alternating stacked N and P layers 450 and 440.

As shown in the schematic of the circuit, the MOSFET (MOS) 470 is connected to the superjunction JFET 400 in a cascode configuration. The drain of the MOS 470 is connected the JFET source 420-S. The JFET gate 430 is connected to the MOS source 471. The lateral superjunction JFET 400 further comprises an avalanche diode 421 between its gate 430 and drain 420-D in accordance with this invention.

Figure 5B:
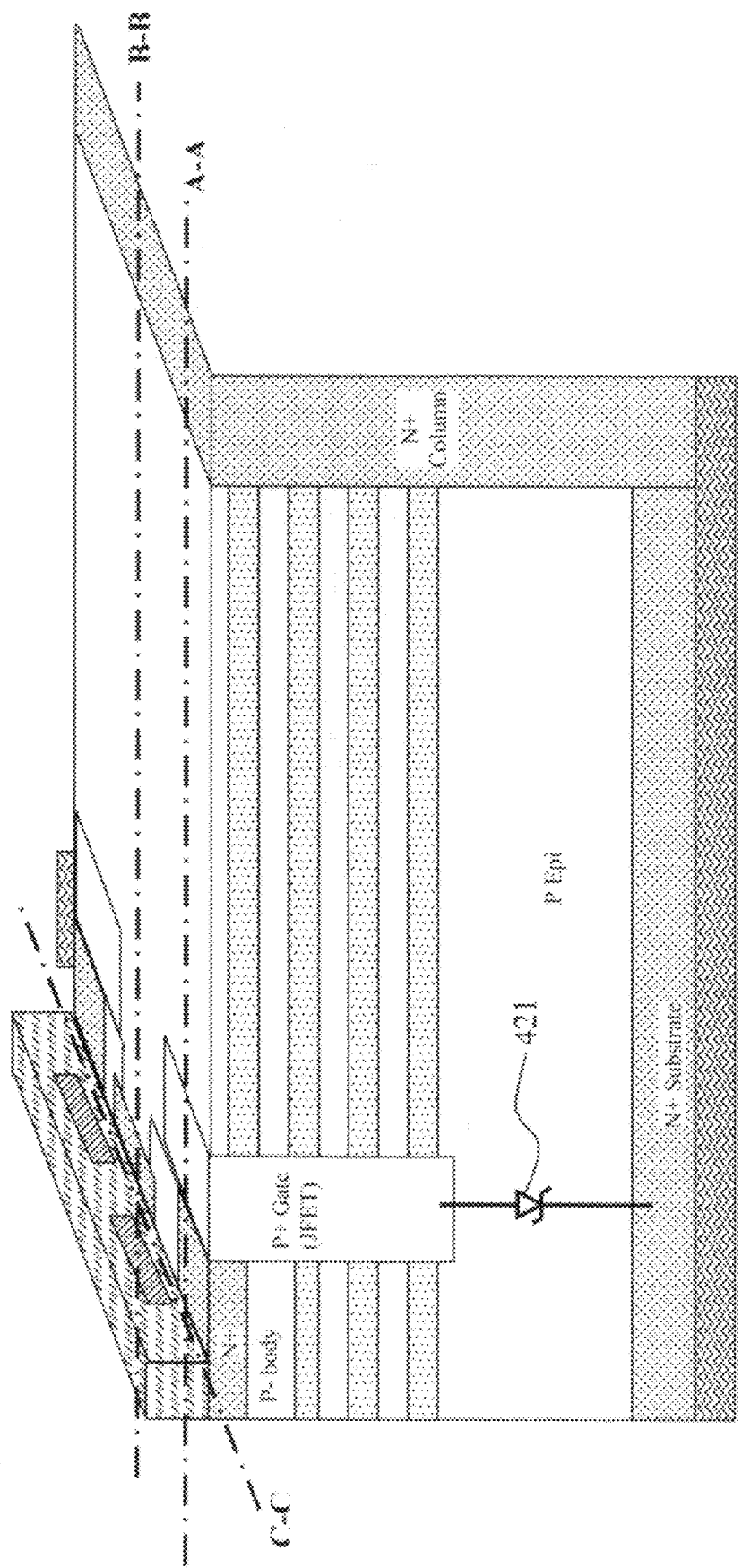
Figure 5C:
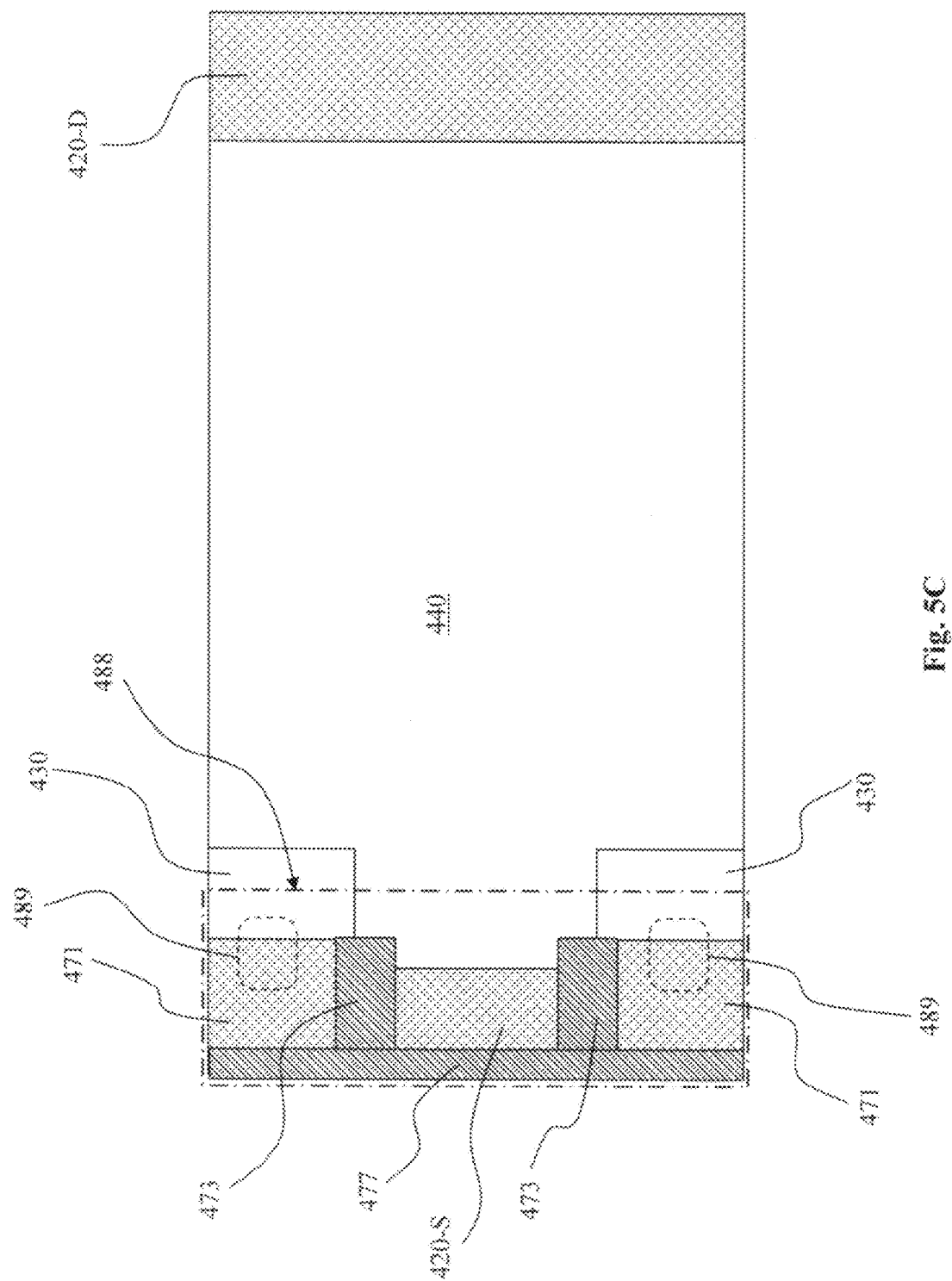
FIG. 5C is a top view of the device from FIGS. 5A and 5B.
Figure 5F:
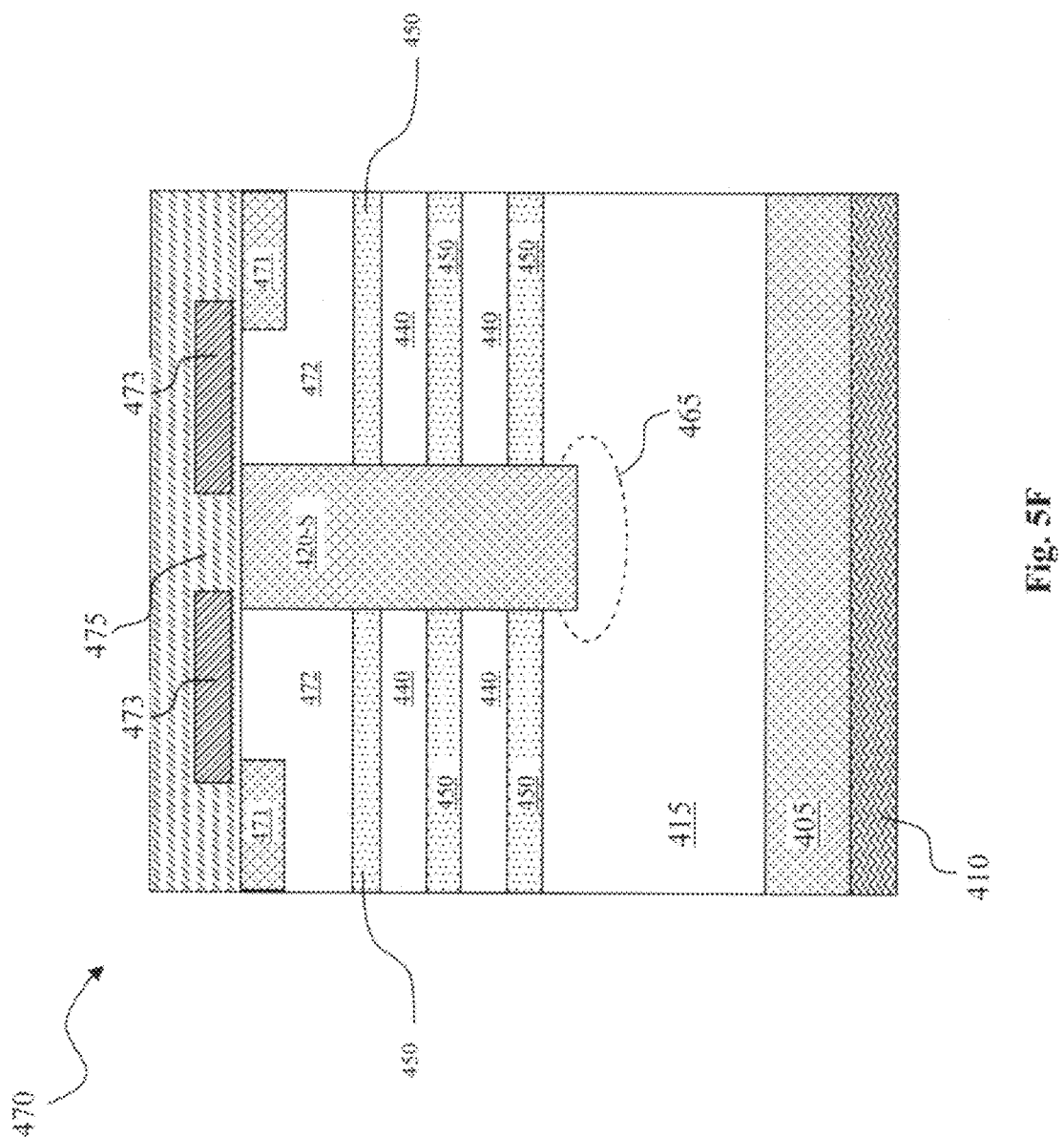

FIG. 5B is the same as FIG. 5A, but shows the location of vertical cross sections displayed in FIGS. 5D-F. FIG. 5D shows the cross section A-A, with the source metal 488 connected to both the MOS N+ source 471 and the JFET P+ gate column 430. The source metal 488 also contacts the MOS P body 472 in a third dimension. FIG. 5E shows the cross section B-B with the N+ JFET source column 420-S and the N+ JFET drain column 420-D. The cross section B-B illustrates the lateral superjunction JFET 400, although the P+ JFET gate column 430 is in a third dimension. A P+ implant is formed under the N+ JFET source column 420-S to suppress a parasitic NPN transistor formed from the N+ source column 420-S to the P-epitaxial 415 to the N+ drain substrate 405. FIG. 5F shows the cross section C-C, which illustrates the low voltage MOSFET 470. MOSFETs are very well known devices, and it should be apparent that other equivalent structures may be formed to integrate a MOSFET with the lateral super junction JFET of this invention.

A top view of the lateral super junction JFET 400 integrated with MOSFET 470 of FIGS. 5A and 5B may be seen in FIG. 5C. For clarity, the top insulating layers are not shown. An outline of the source metal 488 is indicated by the dashed-dot line. Dashed lines show the outlines of contact openings 489 for the source metal to make contact to the N+ MOS source region 471 and the P+ JFET gate column 430 through the oxide 475 (not shown). MOS gates 473 allow channels to be formed in the underlying body regions 472 (not shown) from the N+ MOS source regions 471 to the N+ MOS drain region/JFET source column 420-S. A polysilicon gate runner 477 connects the gates 473 together. From the N+ JFET source column 420-S, the current can flow through the superjunction structure (the N layers 450 under top P layer 440) to the N+ JFET drain column 420-D. In accordance with the cascode configuration, the JFET P+ gate column 430 is shorted to the MOS N+ source region 471 at the contact openings 489 and provides high voltage blocking for the device when the MOS gate 473 is turned off.

Figures 1, 6A:
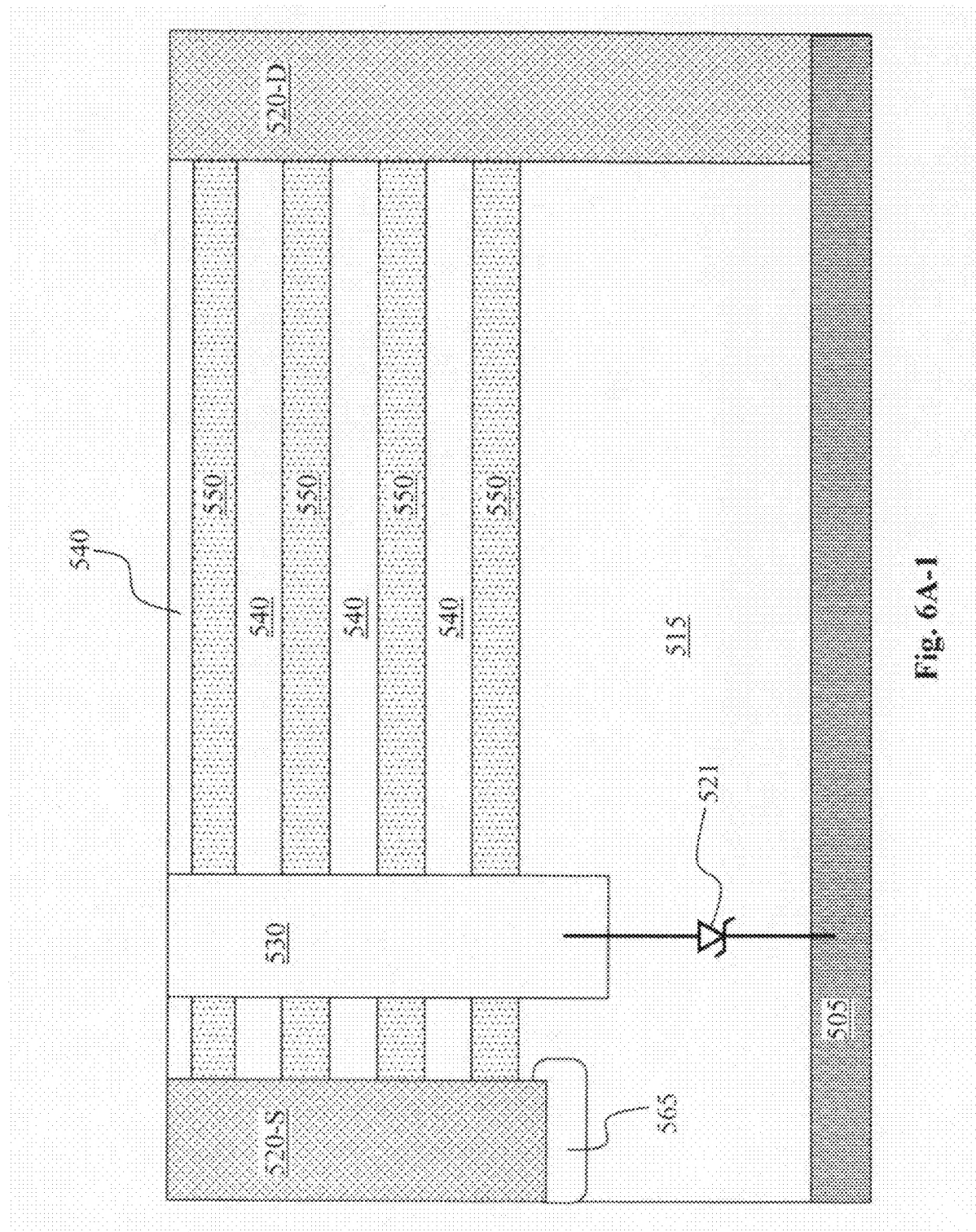
Figures 2, 6A:
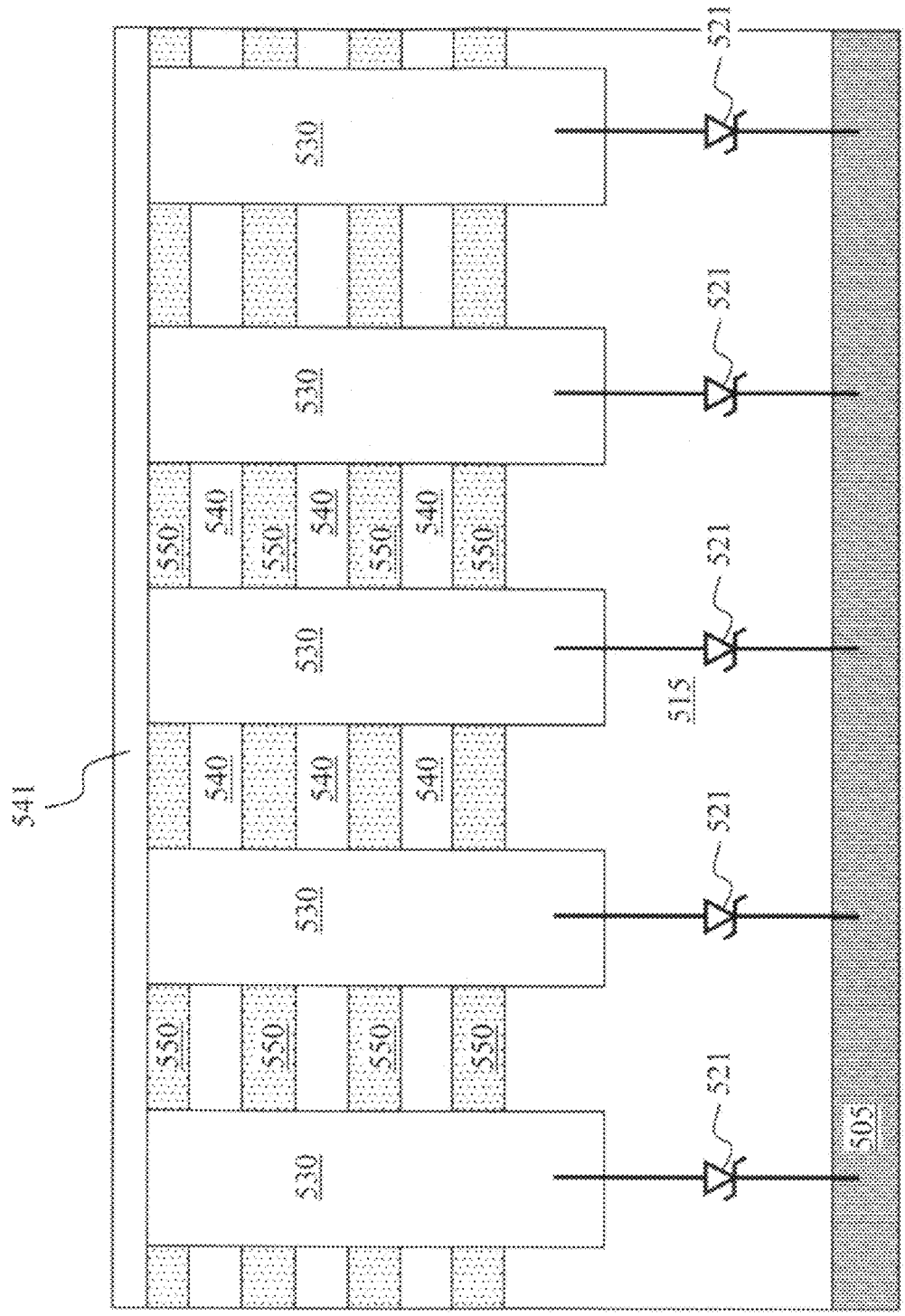
FIG. 6A is a top view showing a stripe configuration of a lateral super junction JFET of this invention.

FIG. 6A shows a top view of a bottom drain lateral superjunction JFET 500 of this invention. FIG. 6A shows the JFET 500 in a stripe configuration. It has an N+ JFET source column 520-S which is formed as a stripe. Running alongside the N+ JFET source column 520-S stripe are P+ JFET gate columns 530 formed intermittently like a dashed stripe. The P+ JFET gate columns 530 are staggered so that a current path is available from the N+ JFET source column 520-S to the N+ JFET drain column 520-D. The cross section D-D of FIG. 6A is shown in FIG. 6A-1. An N+ substrate 505 supports a P-epi layer 515. Over the P-Epi layer, the lateral superjunction structure is formed from alternating stacked P layers 540 and N layers 550. The P layers 540 and N layers 550 are formed with doping concentrations and thicknesses selected such that they are charge balanced. The N layers 550 form lateral paths from the N+ JFET source column 520-S to the N+ JFET drain column 520-D. The P+ JFET gate columns 530 pinch off the current. The N+ JFET drain column 520-D extends down to the N+ drain substrate 505, to form a bottom drain device. A P+ region 565 may be formed under the N+ JFET source column 520-S to suppress a parasitic NPN bipolar transistor action from the N+ source column 520-S to the P-epi 515 to the N+ substrate 505. An avalanche diode 521 may also be formed from P+ gate column 530 to the N+ substrate (by way of P-epi 515) in accordance with this invention.

Figures 3, 6A:
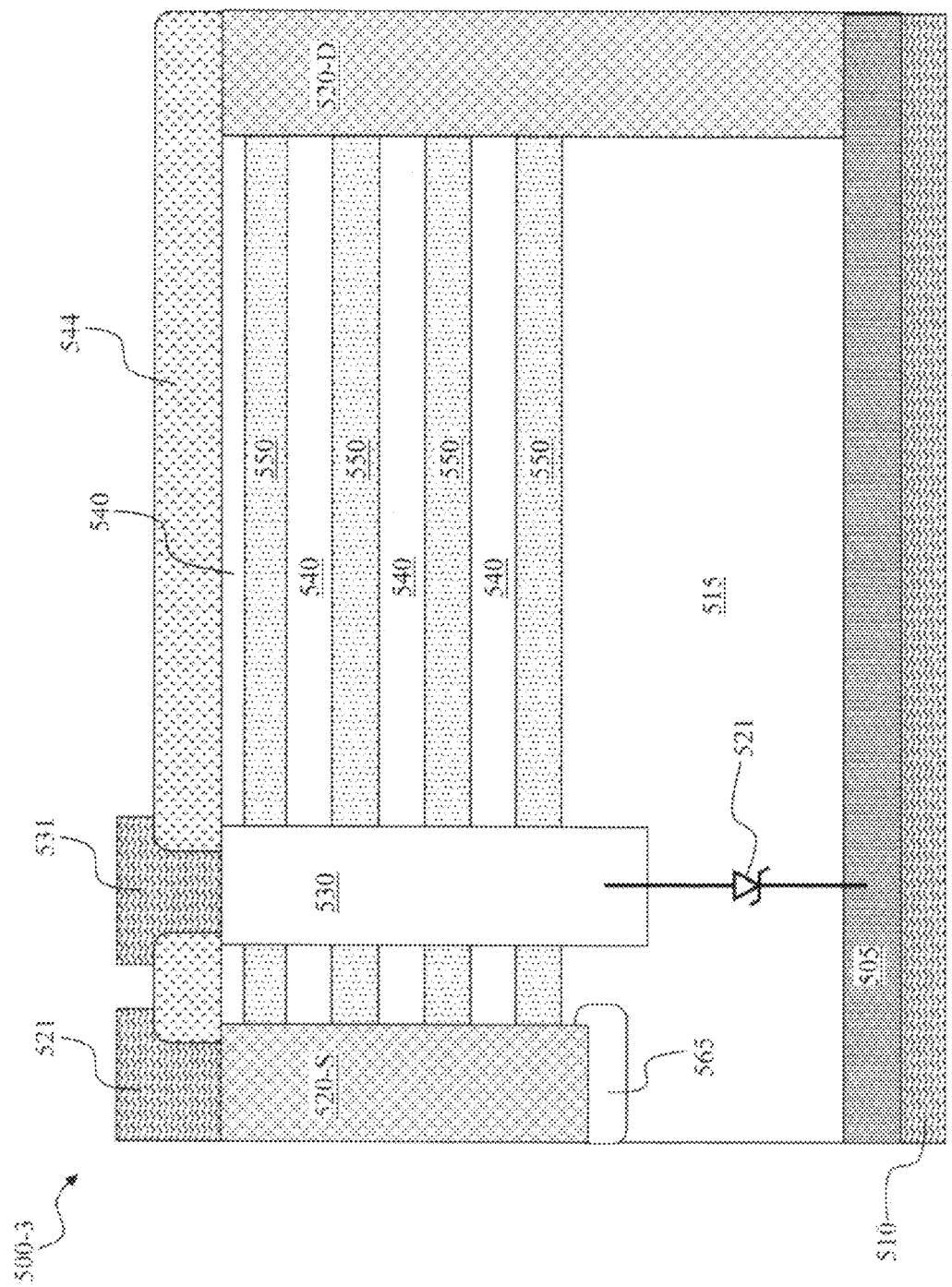

The individual gate columns 530 may be connected together with a shallow P+ surface implant 541, as shown in cross section E-E in FIG. 6A-2. Alternatively, a metal strip could connect the P+ gates 530 on the top. FIG. 6A-3 shows a completed JFET 500-3 with source metal and gate metal on the top, and drain metal on the bottom taken along cross section line D-D of FIG. 6A. A source metal 521 contacts the N+ JFET source column 520-S, and a gate metal 531 contacts the P+ JFET gate column 530 through openings in a thick dielectric layer 544, e.g. oxide or BPSG (borophosphosilicate glass). A drain metal 510 is formed on the bottom of the N+ substrate 505.

Figure 6B:
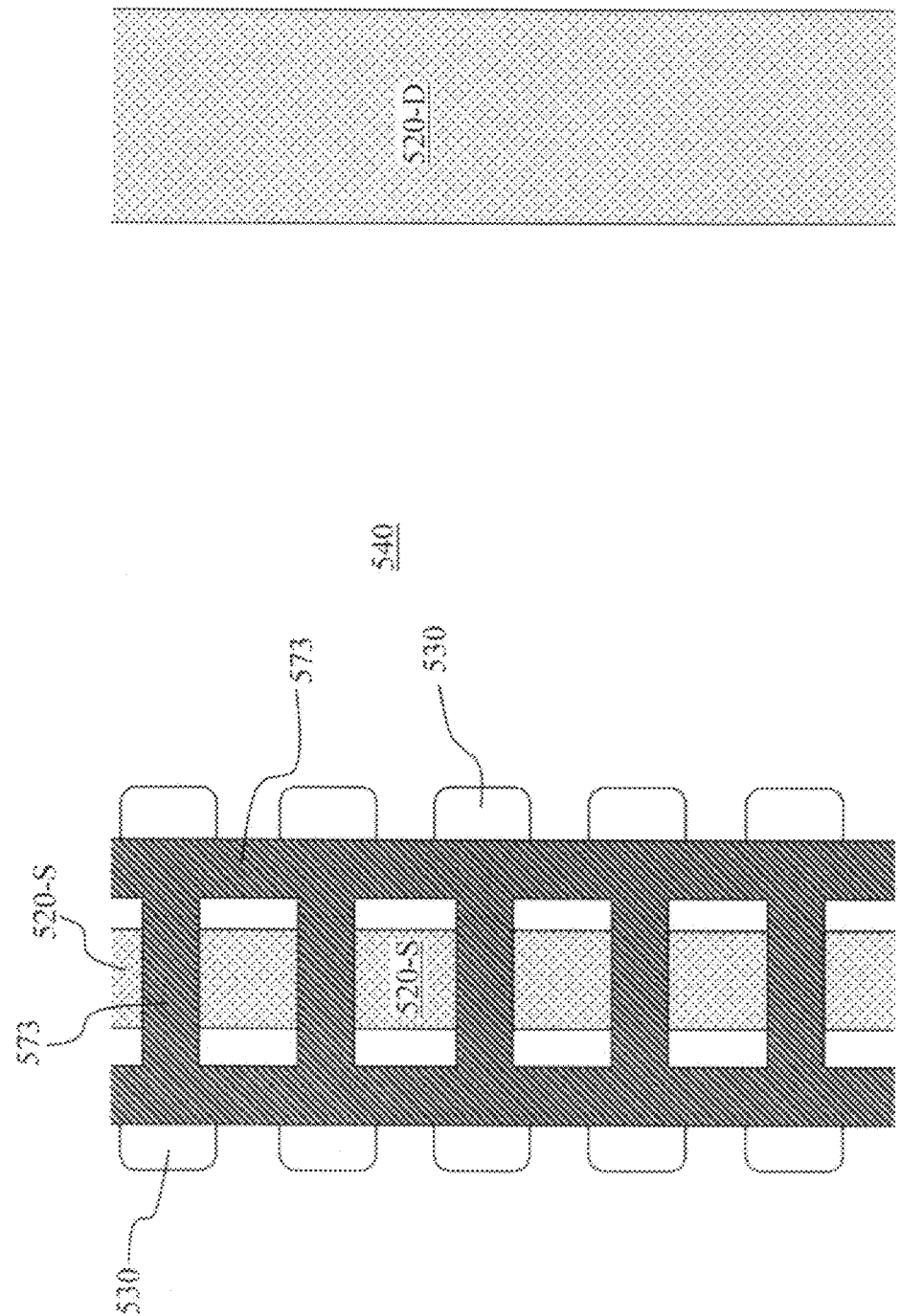
FIGS. 6B and 6C are top views showing how a MOSFET may be integrated with a JFET of FIG. 6A.

A low voltage MOSFET can also be integrated with the lateral superjunction JFET 500 such that it is in the same plane as the super-junction JFET. The MOSFET may be connected to the JFET 500 in a cascode circuit configuration to make the overall device a normally off device. FIG. 6B is a top view showing the next step after FIG. 6A of forming the MOSFET—forming a MOS gate electrode 573, e.g. polysilicon (poly), on top of the device. A thin gate oxide (not shown in FIG. 6B) insulates the MOS gate 573 from the semiconductor surface.

Next, N+ MOS source 571, and N+ MOS drain 575 regions are implanted into the top of the device, self aligned to the MOS gate 573. A P MOS body region 572 is also formed self-aligned to the MOS gate 573, as shown in the top view of FIG. 6C. The outlines of the P+ JFET gate columns 530 and N+ JFET source column 520-S are indicated by dashed lines.

Figure 6C:
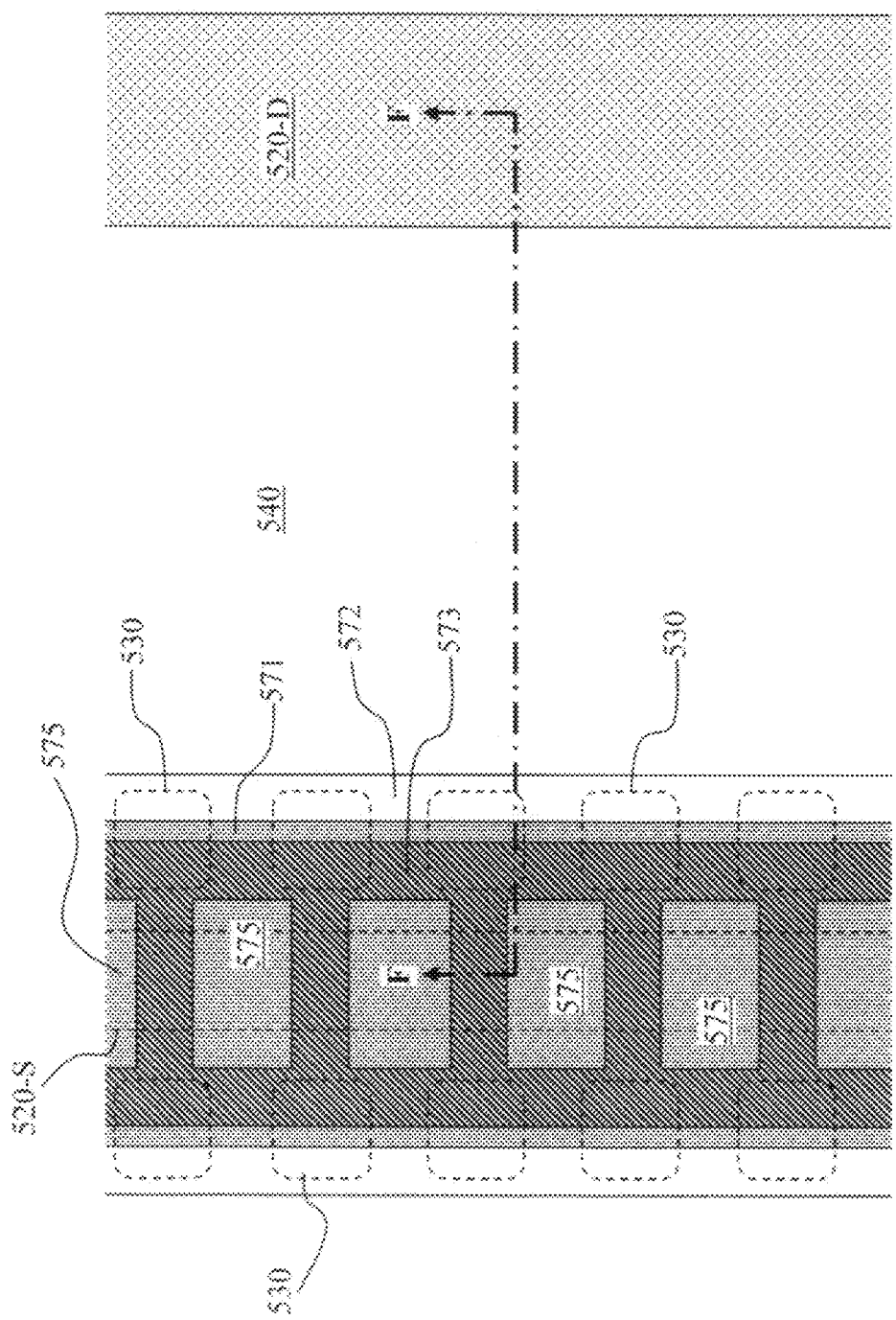
Figures 1, 6C:
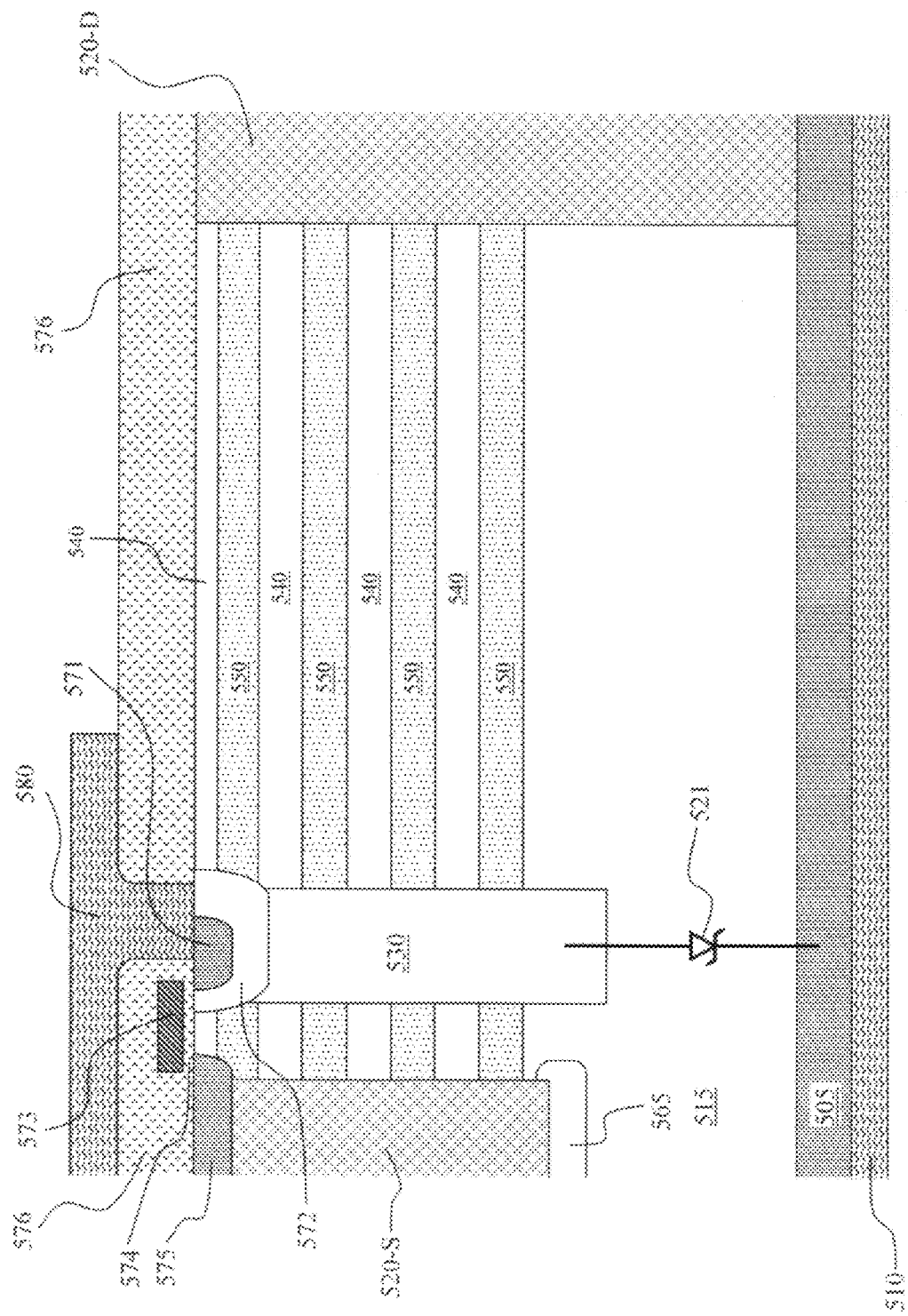

The cross section F-F of FIG. 6C is shown in FIG. 6C-1. The N+ MOS source 571 is located within P MOS body region 572, with both being self-aligned to the MOS gate 573. The MOS gate 573 is separated from the semiconductor surface by a thin gate dielectric 574, e.g. gate oxide. On the other side of the MOS gate 573, the N+ MOS drain 575 is also formed self-aligned to the MOS gate 573. The N+ MOS drain 575 is connected to the N+ JFET source column 520-S in accordance to the cascode circuit configuration. A source metal 580 contacts the N+ MOS source 571 and P MOS body 572 through openings in a thick dielectric layer 576. The P MOS body 572 connects to the P+ JFET gate column 530, so the source of the MOS and the gate of the JFET are connected, in accordance with the cascode circuit configuration. An electric current can thus start at the N+ MOS source 571, and flow to the N+ MOS drain 575, under the control of the MOS gate 573. From the N+ MOS drain 575, the current can continue through the N+ JFET source column 520-S to the superjunction N layers 550 and flow laterally to the N+ JFET drain 520-D. The P+ JFET gate 530 is shorted to the N+ source 571 in the cascode configuration, so when the MOSFET is on, the JFET gate 530 is approximately at the same potential as JFET source 520-S (and MOS drain 575), thereby allowing current flow in the N layers 550. The current can flow down the N+ JFET drain column 520-D to the N+ drain substrate 505, and to the drain metal 510 below. When the MOSFET is off, the JFET gate 530 is at a lower potential than the JFET source 520-S/MOS drain 575 thus shutting off current flow as will be explained. Removal of the MOS gate 573 bias turns off the low voltage MOSFET. In this mode, application of a positive bias to the drain terminal 510 will result in a positive bias on the N layers 550 and a corresponding negative bias on the JFET P gate 530 causing the superjunction N layers 550 and P layers 540 and the P-epitaxial 515 to deplete. At a certain drain bias, the depletion regions from adjacent P layers 540 merge, and pinch-off the JFET source column 520-S from additional drain voltage. This allows the device to block high voltages with low leakage. It also allows a low voltage MOSFET to be used in the cascode circuit, because the JFET supports the additional voltage after pinch off. The charge in the P epi region 515 created when it depletes at high drain biases reduces the peak electric field under the P+ gate 530 and allows this device structure to have a high substrate breakdown voltage. Though not shown here, the MOS gate 573 may be connected to a gate metal terminal located on another part of the semiconductor die.

The source and drain stripe structures and layout may be repeated throughout a semiconductor die, as shown in FIG. 6D.

Figures 1, 7A:
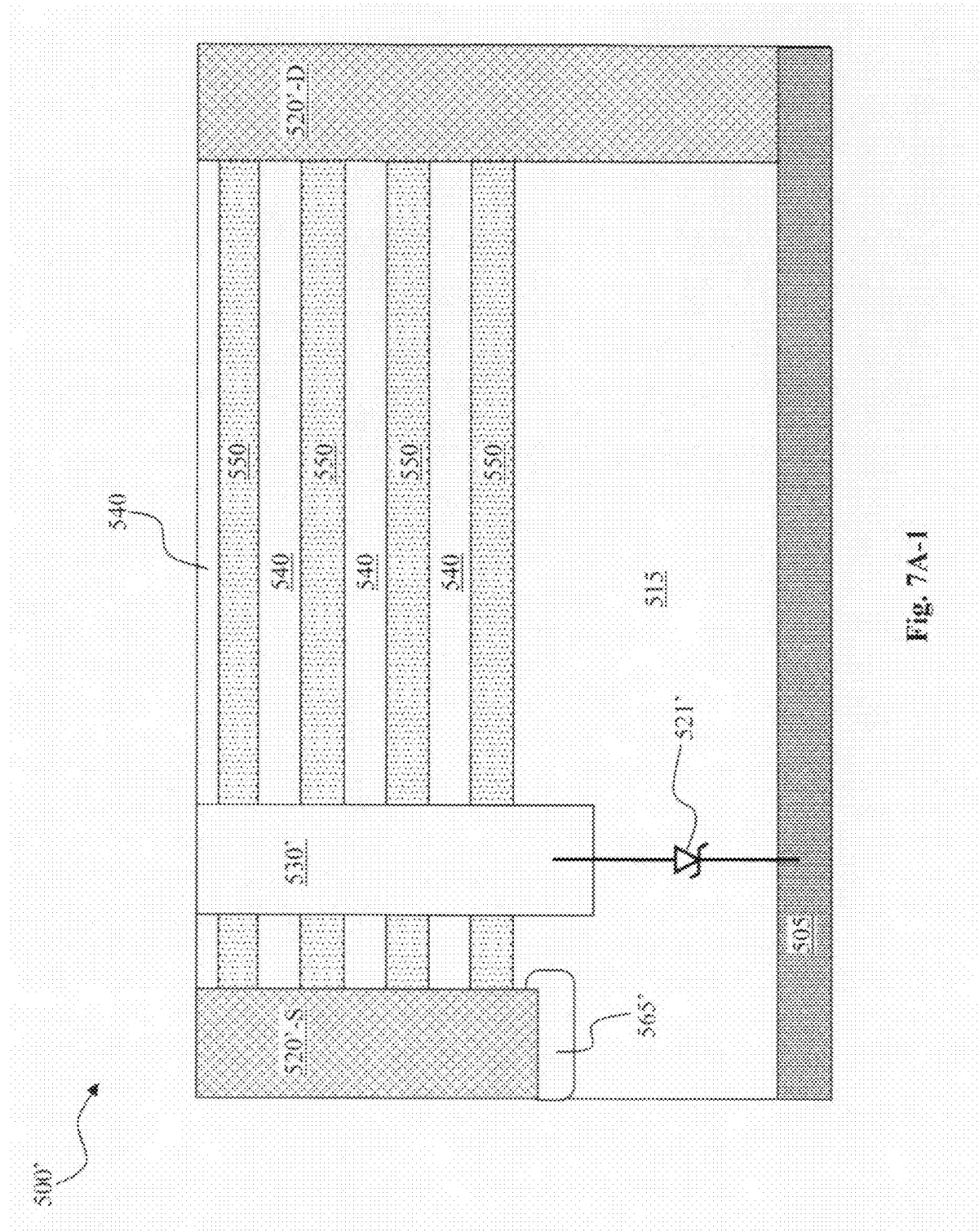

FIG. 7A shows a top view of an alternative layout for the device a closed cell layout. More specifically, it shows a hexagonal closed cell layout. The basic lateral superjunction JFET 500' structure is shown in the top view of FIG. 7A and the cross section view of FIG. 7A-1. The N+ JFET source columns 520'-S are arranged in an interconnected hexagonal web. Alongside the N+ JFET source column 520'-S are the P+ JFET gate columns 530'. The P+ JFET gate columns 530' are staggered to allow current flow between them. In the center of each hexagon is the N+ JFET gate column 520'-D. As shown in the cross section view G-G of FIG. 7A-1, the JFET elements are located in the superjunction structure of charge balanced, stacked P layers 540 and N layers 550 over a P-Epi 515 over an N+ substrate 505. In each hexagonal closed cell, the current flows laterally from the N+ JFET source column 520'-S at the sides of the hexagon to the N+ JFET drain column 520'-D at the center of the hexagon through the super junction N layers 550. The current can then flow down the N+ drain column 520'-D to the N+ substrate 505. An NPN suppressing P+ region is formed under the N+ JFET source column 520'-S and an avalanche diode 521' is formed from the P+ JFET gate column 530' to the N+ substrate 505.

Figure 7B:
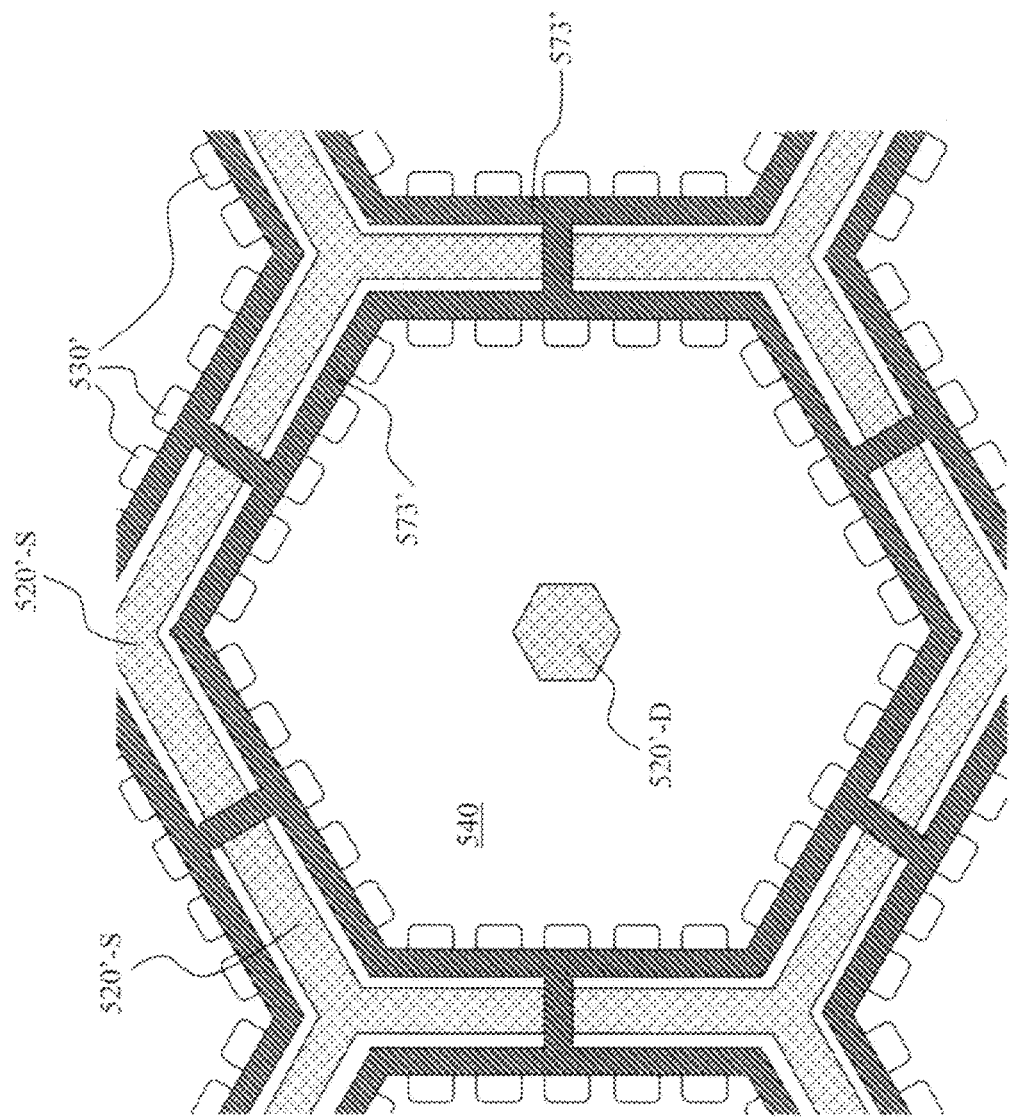

As with the stripe configuration of FIGS. 6A-6D, a MOSFET may be easily integrated with the JFET 500' of FIG. 7A in a cascode circuit configuration, as shown in FIGS. 7B-7C. In the top view of FIG. 7B, which is a close-up view of a single hexagonal closed cell, a network of MOS gate electrodes 573' are formed over the top of the die. The MOS gates 573' run alongside the N+ JFET source columns 520'-S.

In the top view of FIG. 7C, N+ MOS source 571' and N+ MOS drain 575' regions are formed self-aligned to the MOS gate 573'. P MOS body 572' regions are also formed self aligned to the MOS gate 573', surrounding the N+ MOS source regions 571'. The outlines of the N+ JFET source 520'-S and P+ JFET gate 530' are shown as dashed lines. As shown in the cross section H-H of FIG. 7C-1, the source metal 580' contacts the N+ MOS source 571' and the P MOS body 572' through openings in the thick dielectric 576'. The source metal 580' is also connected to the P+ JFET gate column 530' through P MOS body 572', in accordance with the cascode circuit. The N+ MOS drain 575' is formed on the other side of the MOS gate 573'. A thin gate dielectric 574' insulates the MOS gate 573' from the semiconductor surface. The N+ MOS drain 575' is connected to the N+ JFET column 520'-S in accordance with the cascode circuit configuration.

Figure 8A:
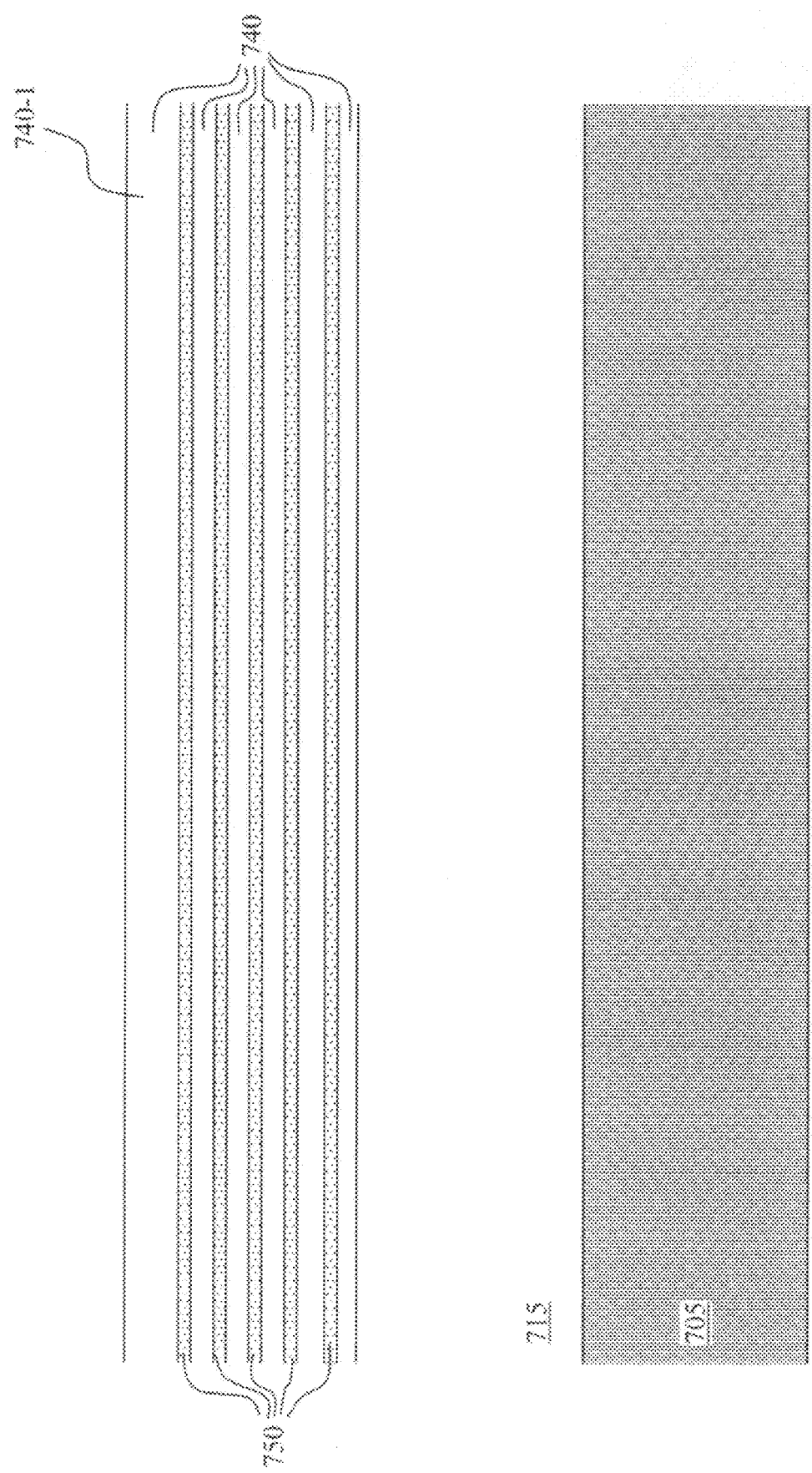
FIGS. 8A to 8Q are a series of cross sectional views showing how to form a MOSFET integrated with a lateral super junction JFET of this invention.

FIGS. 8A-7Q are a series of cross sectional views showing a method of manufacturing a MOSFET integrated with a bottom drain lateral superjunction JFET of this invention. The process begins in FIG. 8A with forming a lateral super junction structure made of alternating stacked charge balanced P type layers 740 and N type layers 750. The lateral super junction structure is formed over the P-epi layer 715 which is formed over the N+ substrate 705.

Figure 8D:
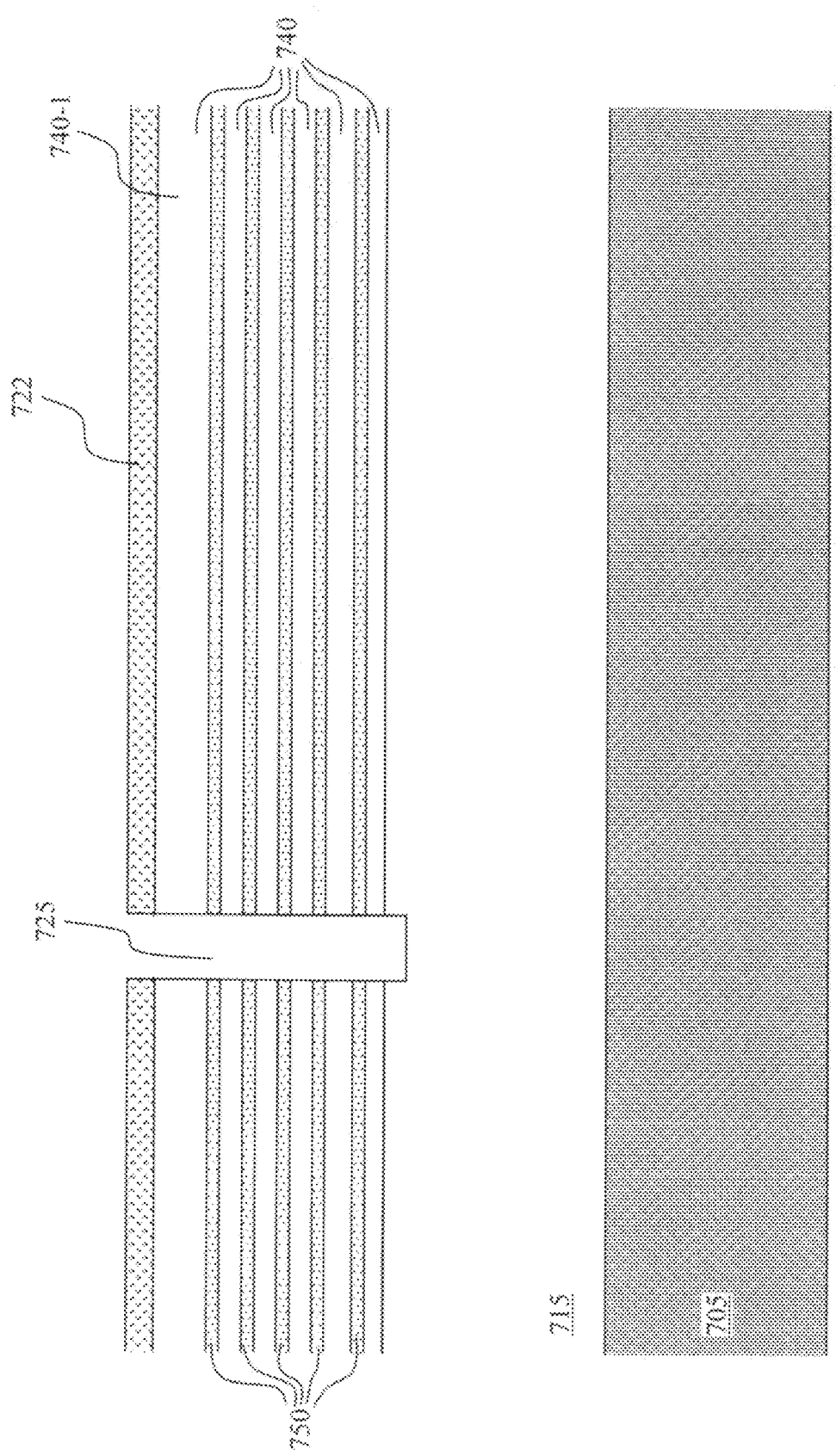
Figure 8E:
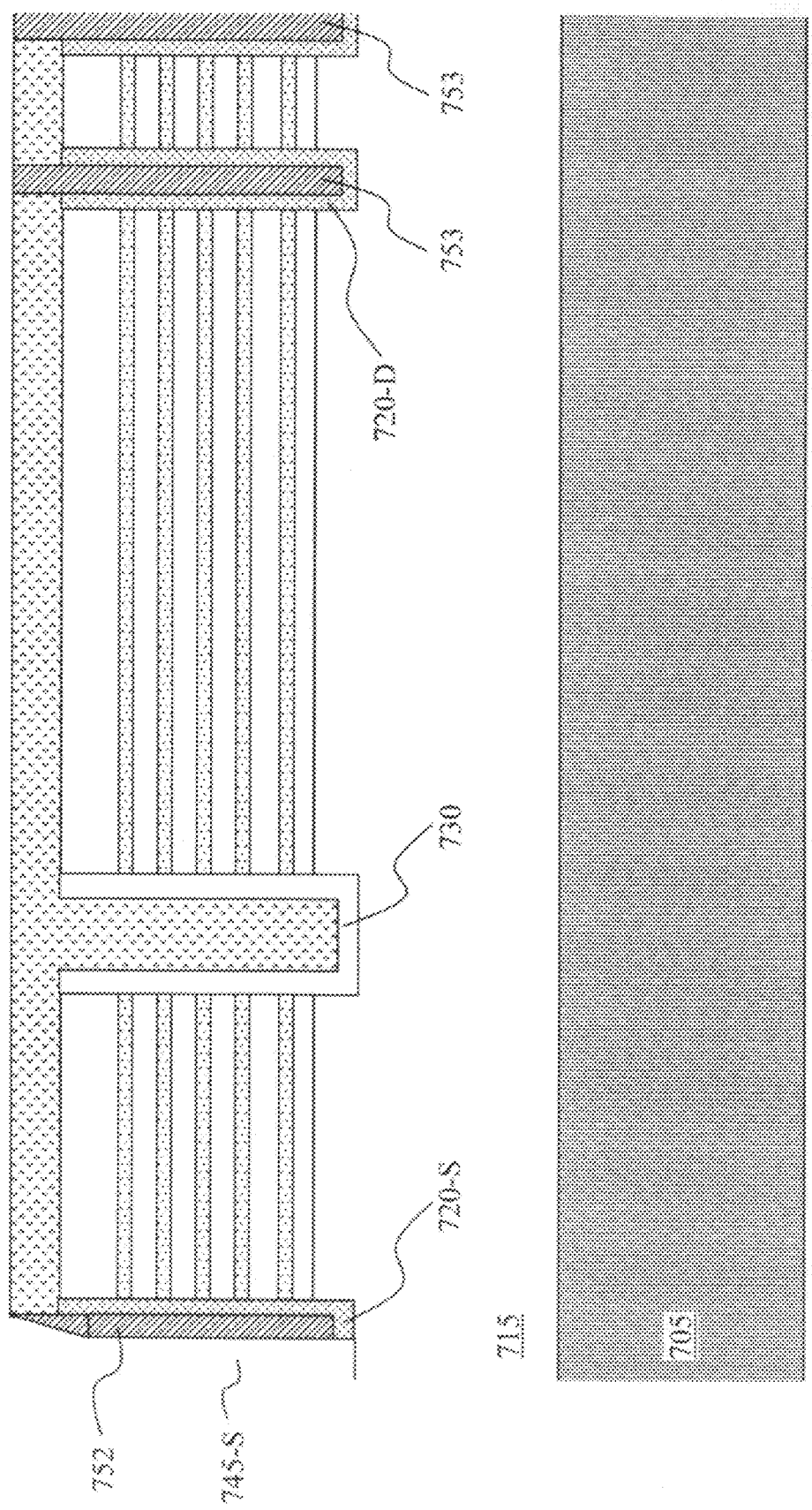
Figure 8C:
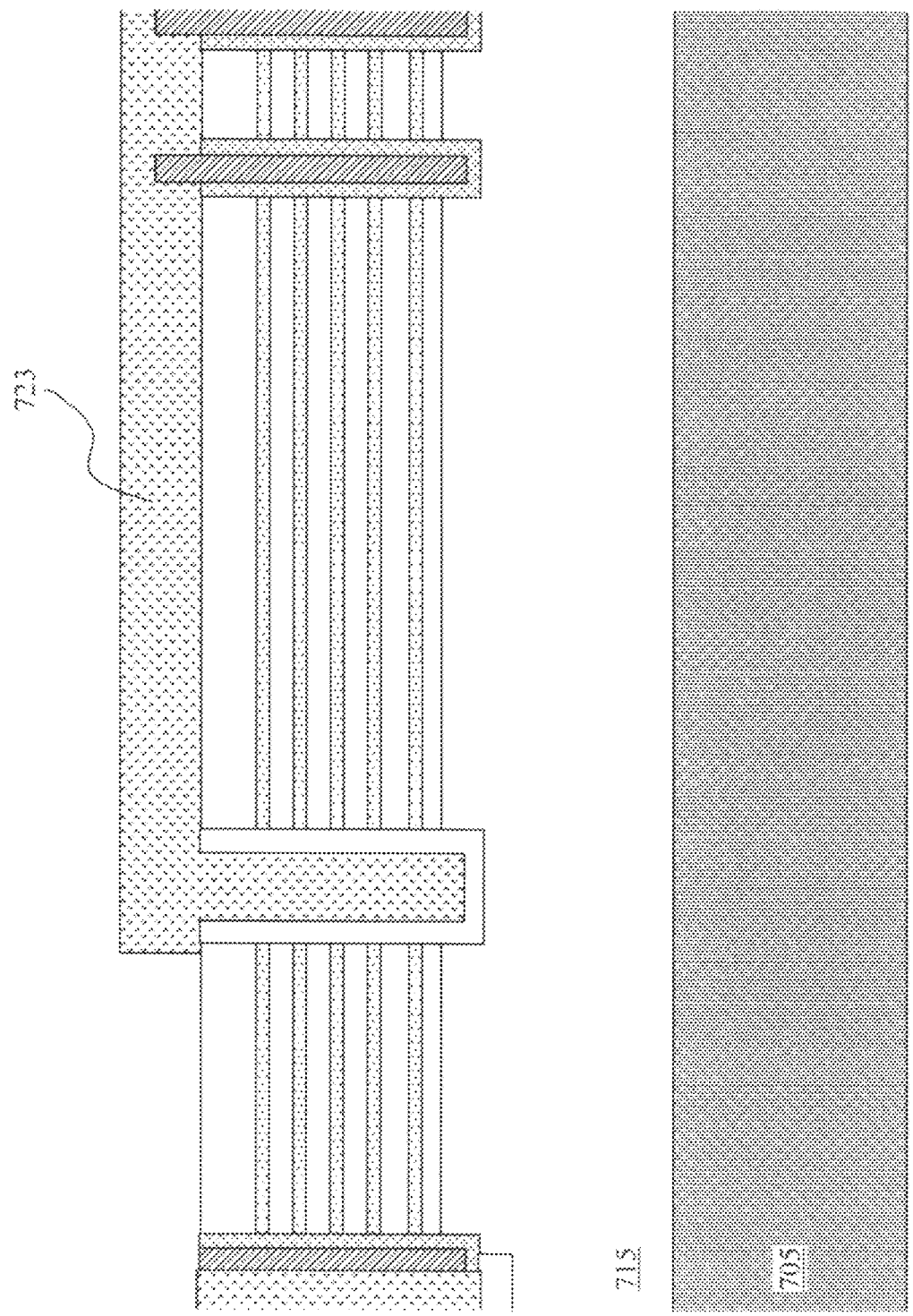

Next a hard mask 722, e.g. oxide, is formed and patterned on top. A gate trench 725 is etched into the semiconductor material, as shown in FIG. 8B. The gate trench 725 extends down through the lateral super junction structure to reach the P-epi 715. In FIG. 8C, the gate trench 725 is lined with P+ implant, e.g. by angled implant, to from the P+ gate column 730. In FIG. 8D, a second hard mask 726 is formed and patterned. The second hard mask material may also fill in the gate trench 725, e.g., with an oxide fill 727. Source trench 745-S and interim drain trenches 745-D are etched into the semiconductor material through the lateral super junction structure of P layers 740 and N layers 750 to the P-epi 715. The interim drain trenches 745-D are much narrower than the source trench 745-S. The sidewalls of the source trench 745-S and interim drain trenches 745-D are implanted N type to form N type source column 720-S and interim N type drain columns 720-D. In FIG. 8E, N+ polysilicon spacers 752 are formed along the sidewalls of the source trench 745-S. By way of example, the polysilicon spacers 752 may be formed by depositing a layer of polysilicon, and then isotropically etching the polysilicon layer to leave the polysilicon spacers 752 in source trench 745-S. The process of forming polysilicon spacers 752 additionally fills in the narrow interim drain trenches 745-D with N+ polysilicon fill 753. In FIG. 8F, a vertical P+ implant is performed to form a P+ region 765 in the P-epi layer 715 at the bottom of the source trench 745-S. The P+ region 765 suppresses the parasitic NPN transistor formed from the N source column 720-S to the P-epi 715 to the N substrate 705.

Figure 8H:
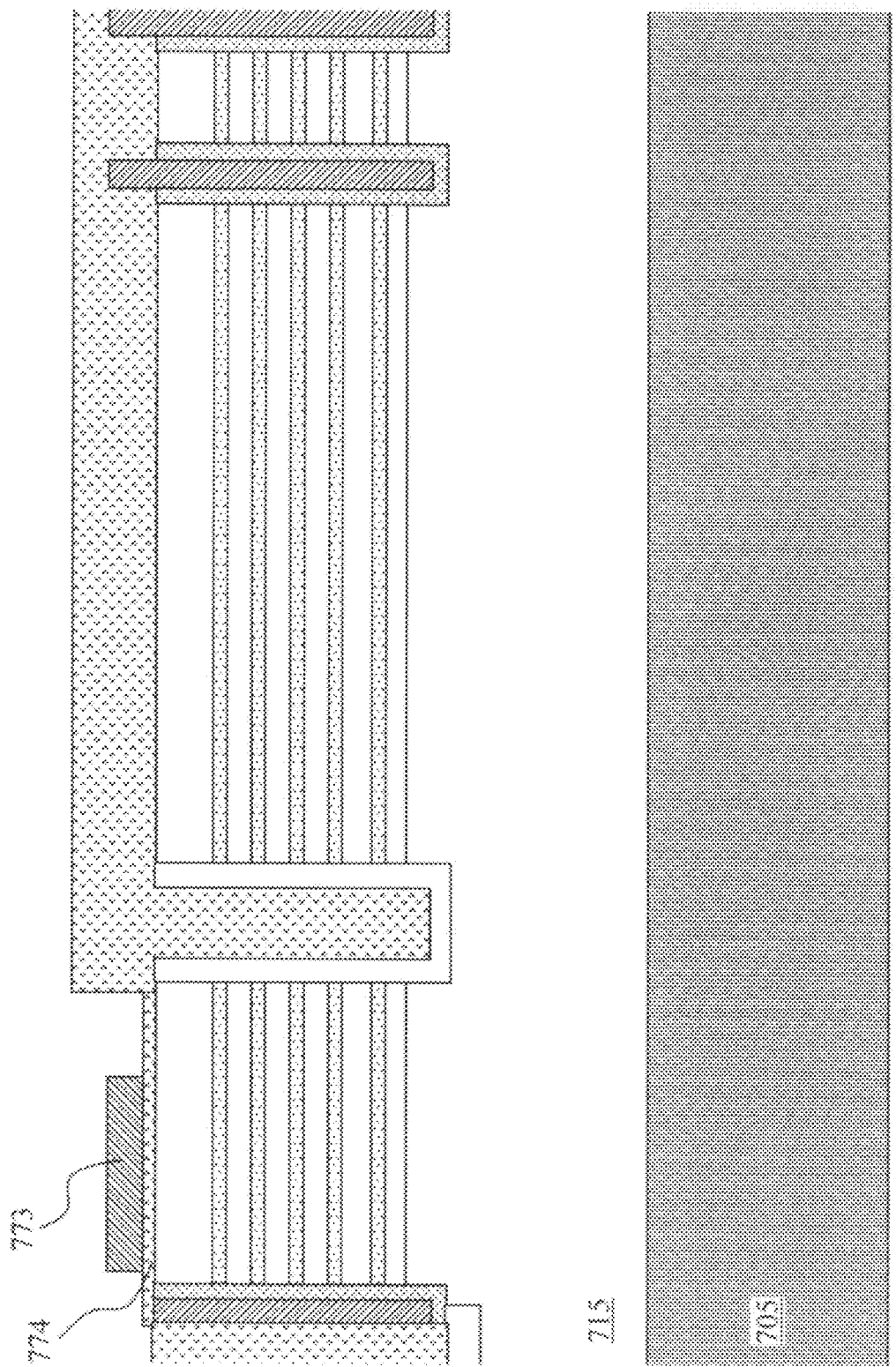

In FIG. 8G, oxide 723 is deposited over the device, and then planarized. The oxide also fills in the remaining space in the source trench 745-S. The oxide 723 is patterned with a third mask and etched down to the surface of the semiconductor material in the regions where the MOSFET will be formed. A thin gate oxide 774 is formed on the exposed semiconductor material, and then a gate poly 773 is formed and patterned with a fourth mask on top of the gate oxide 774, as shown in FIG. 8H. In FIG. 8I, a fifth mask is used as a body block mask. A P body implant is performed to form P− body region 772, using the body block mask 719, gate poly 773, and oxide 723 as a mask. The body region 772 is self aligned to the gate poly 773. If the gate poly 773 is long enough, e.g. if the gate poly 773 extends to the N source column 720-S— the body block mask 719 may not even be necessary.

Figure 8J:
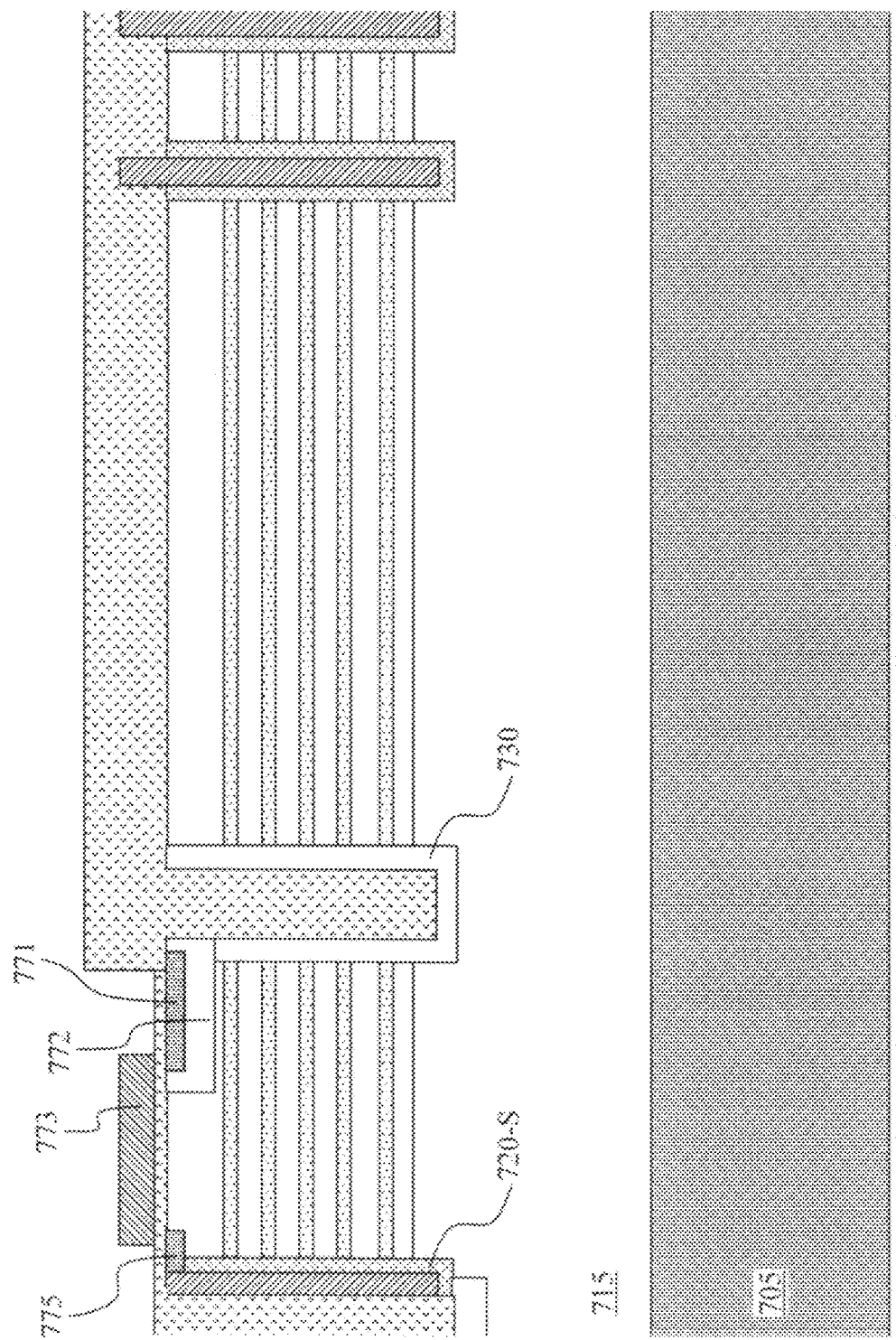

Next, in FIG. 8J, a blanket N+ implant is performed to form N+ MOS source region 771 and N+ MOS drain region 775 on opposite sides of the gate poly 773. The gate poly 773 forms a planar gate between the MOS source 771 and the MOS drain 775. The MOS source 771 and MOS drain are self-aligned to the gate poly 773. The N+ MOS drain 775 connects to the N JFET source column 720-S and the P-body region 772 connects to the P+ JFET gate column 730.

Figure 8L:
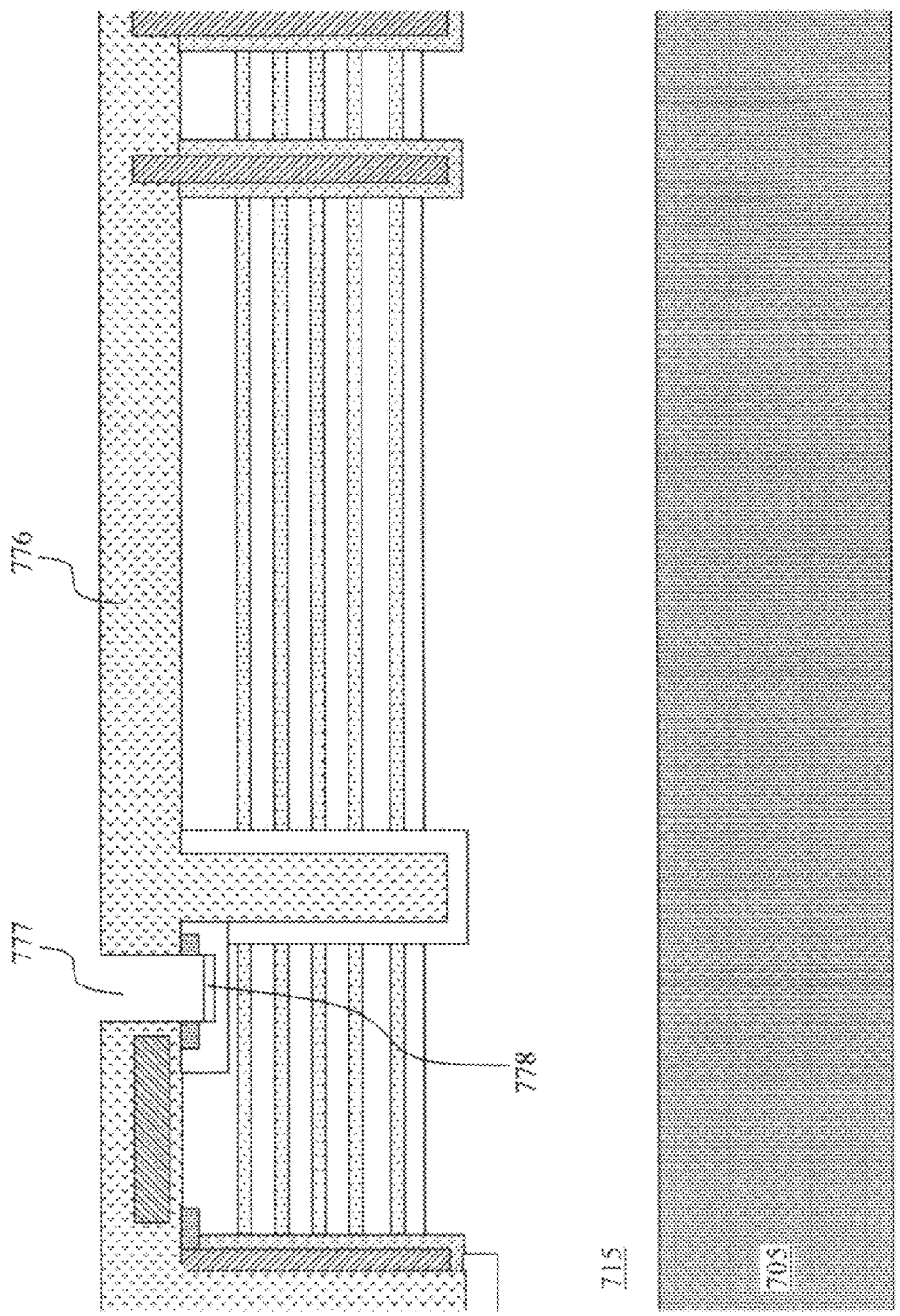
Figure 8M:
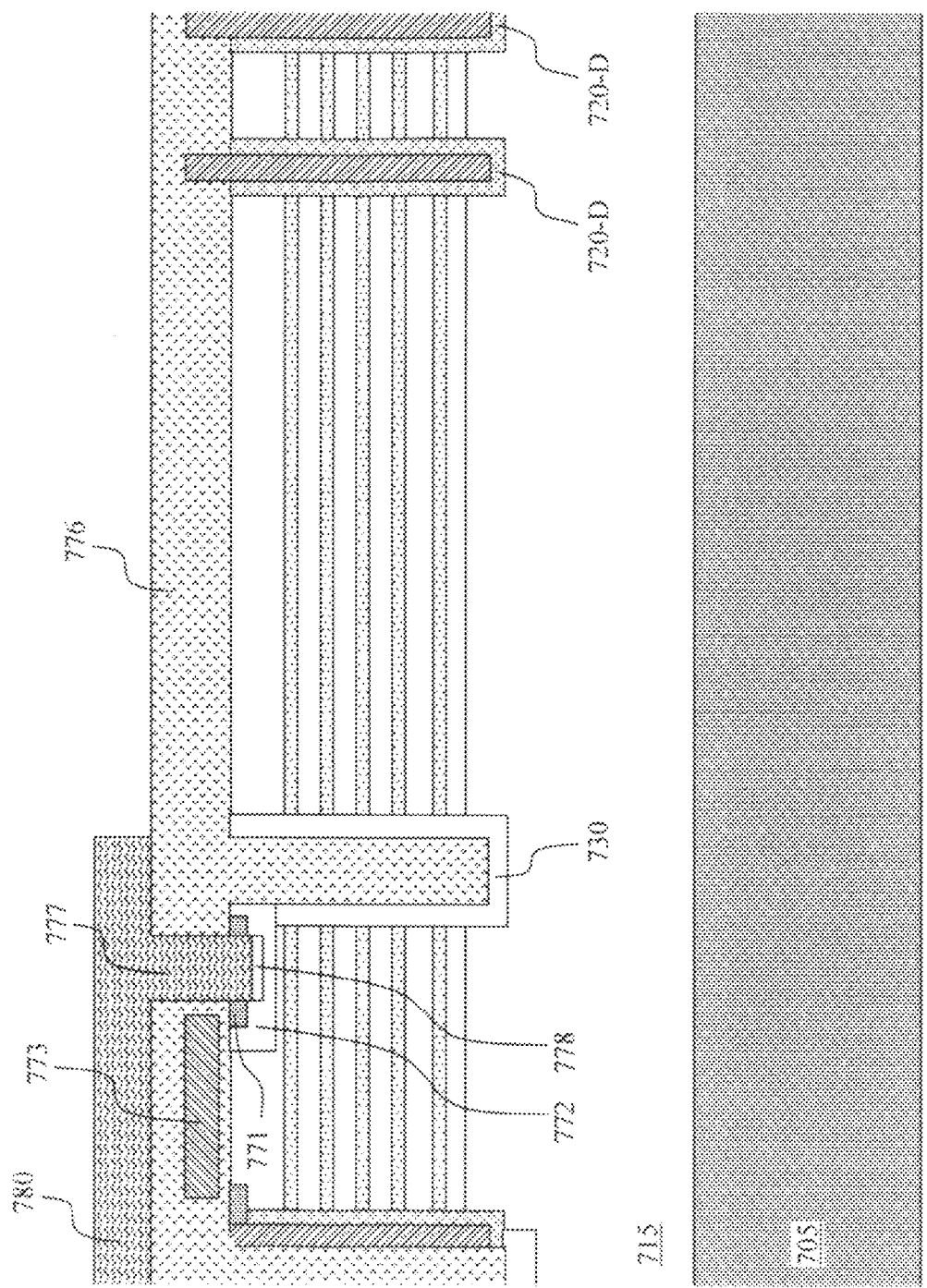

An insulating material such as BPSG (borophosphosilicate glass) 776 if formed on top, insulating the top surface of the device, as shown in FIG. 8K. In FIG. 8L, a sixth mask is used to form a contact hole 777 by etching through the BPSG 776 and into the semiconductor material. The contact hole 777 should etch through the N+ MOS source 771 to reach the P-body 772. A P+ body contact region 778 can be formed at the bottom of contact hole 777, e.g. by vertical implantation. As shown in FIG. 8M, a source metal 780 is deposited and patterned such that the source metal 780 fills the contact hole 777 and makes contact to the N+ MOS source 771 and P-body 772 (via P+ body contact region 778. The source metal 780 is also connected to the P JFET gate column 730 through the P body 772, in accordance with the cascode circuit configuration. In the third dimension, a gate pad (not shown) may also be formed for external connection to the MOS gate poly 773. By way of example, the source metal 780 may be aluminum.

In FIG. 8N, an eighth mask is used to form the drain trench 781 at the interim JFET drain columns 720-D. The drain trench 781 is etched through the interim JFET drain columns 720-D, down through the P-epi 715 and into the N+ substrate 705. In FIG. 8O, the drain trench 781 is lined with N type regions 779, e.g. by forming N+ polysilicon spacers, N+ epitaxial growth, or by the exposed sidewalls of the trench. Metal 783 is formed in the drain trench 781, as shown in FIG. 7P. By way of example metal 783 may be a copper plating that forms in the drain trench as metal 783 and on top of the source metal 780 as metal 782. Finally in FIG. 7Q, the back side of the wafer/N+ substrate 705 is thinned and a bottom drain metal 790 is formed on the bottom.

As can be seen, there are many ways of forming the JFET source, gate and drain columns including doping the semiconductor, etching a trench then filling with doped polysilicon, etching a trench and lining the trench with implanted dopants or doped polysilicon and filling the rest of the trench with conductive material or oxide, and so on. More alternative methods may include etching a trench a forming doped side walls by epitaxial growth, from the top surface implantation, implantations while forming the epitaxial layer and super junction layers, etc.

While the above embodiments may have been described for silicon, it should be clear to one of ordinary skill in the art that they can be applied to any semiconductor material such as silicon carbide (SiC), germanium (Ge), diamond, or gallium arsenic (GaAs) or gallium nitride (GaN). Also, it should be clear that the N+ and P+ columns comprising the source, drain and gate columns may be formed in a number of different ways. Although the present invention shows an N-channel JFET, it may also be applied to a P-channel JFET, by switching the conductivity types of the P type and N type semiconductor regions.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device comprising:
a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and
a gate column of a second conductivity type extending downward through said super junction structure for applying a voltage on the super junction structure to control a current transmitted laterally through said super junction structure between said source and said drain columns;
the semiconductor substrate further comprises a bottom semiconductor layer of a first conductivity type, wherein said drain column extends downwardly to connect to said bottom semiconductor layer;
the semiconductor substrate further comprises an intermediate semiconductor layer of a second conductivity type disposed under said super junction structure and on top of said bottom semiconductor layer; and
the gate column extends downwardly into the intermediate semiconductor layer to constitute a built-in gate-drain avalanche clamp diode from a combination of the bottom semiconductor layer through the intermediate semiconductor layer to the gate column.

2. A semiconductor power device comprising:
a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and
a gate column of a second conductivity type extending downward through said super junction structure for applying a voltage on the super junction structure to control a current transmitted laterally through said super junction structure between said source and said drain columns;
the semiconductor substrate further comprises a bottom semiconductor layer of a first conductivity type, wherein said drain column extends downwardly to connect to said bottom semiconductor layer;
the semiconductor substrate further comprises an intermediate semiconductor layer of a second conductivity type disposed under said super junction structure and on top of said bottom semiconductor layer; and
the source column extends into said intermediate semiconductor layer and further comprises a bipolar suppressing region in the intermediate semiconductor layer at the bottom of the source column; said bipolar suppressing region is doped with the second conductivity type.

3. A semiconductor power device comprising:
a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and
a gate column of a second conductivity type extending downward through said super junction structure for applying a voltage on the super junction structure to control a current transmitted laterally through said super junction structure between said source and said drain columns;

the semiconductor substrate further comprises a bottom semiconductor layer of a first conductivity type, wherein said drain column extends downwardly to connect to said bottom semiconductor layer;

the semiconductor substrate further comprises an intermediate semiconductor layer of a second conductivity type disposed under said super junction structure and on top of said bottom semiconductor layer; and the gate column extends deeper than the source column.

4. A semiconductor power device comprising:

a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and a gate column of a second conductivity type extending downward through said super junction structure for applying a voltage on the super junction structure to control a current transmitted laterally through said super junction structure between said source and said drain columns;

the semiconductor substrate further comprises a bottom semiconductor layer of a first conductivity type, wherein said drain column extends downwardly to connect to said bottom semiconductor layer;

the semiconductor substrate further comprises an intermediate semiconductor layer of a second conductivity type disposed under said super junction structure and on top of said bottom semiconductor layer; and said source, drain and gate columns form a JFET, and wherein the semiconductor power device further comprises a MOSFET connected in a cascode circuit configuration with said JFET.

5. The semiconductor power device of claim 4 wherein:

said MOSFET is integrated with said JFET at the device cell level.

6. The device of claim 5, wherein:

said MOSFET further comprises a source region, a body region, a gate, and a drain region wherein the source region extends along a direction parallel to the source column and is separated therefrom with the body region disposed between the source region and the source column.

7. The device of claim 6 wherein said gate of the MOSFET is configured to form an inversion channel between said source region of the MOSFET and said source column.

8. A semiconductor power device comprising:

a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and a gate column of a second conductivity type extending downward through said super junction structure for applying a voltage on the super junction structure to control a current transmitted laterally through said super junction structure between said source and said drain columns;

the semiconductor substrate further comprises a bottom semiconductor layer of a first conductivity type, wherein said drain column extends downwardly to connect to said bottom semiconductor layer;

the semiconductor substrate further comprises an intermediate semiconductor layer of a second conductivity type disposed under said super junction structure and on top of said bottom semiconductor layer; and the source, drain and gate columns are arranged as stripes extending horizontally across the semiconductor substrate.

9. A semiconductor power device comprising:

a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and a gate column of a second conductivity type extending downward through said super junction structure for applying a voltage on the super junction structure to control a current transmitted laterally through said super junction structure between said source and said drain columns;

the semiconductor substrate further comprises a bottom semiconductor layer of a first conductivity type, wherein said drain column extends downwardly to connect to said bottom semiconductor layer;

the semiconductor substrate further comprises an intermediate semiconductor layer of a second conductivity type disposed under said super junction structure and on top of said bottom semiconductor layer; and the source, drain and gate columns are formed with a closed cell layout configuration across a horizontal direction of the semiconductor substrate.

10. The semiconductor power device of claim 9 wherein:

the source column is formed along a closed cell in the closed cell layout configuration and the drain column is formed at the center of each cell.

11. A semiconductor power device comprising:

a semiconductor substrate including a super junction structure disposed near a top surface of said semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and a gate column of a second conductivity type extending downward through said super junction structure for applying a voltage on the super junction structure to control a current transmitted laterally through said super junction structure between said source and said drain columns;

the semiconductor substrate further comprises a bottom semiconductor layer of a first conductivity type, wherein said drain column extends downwardly to connect to said bottom semiconductor layer; and the gate column is staggered alongside the source column.

12. A semiconductor power device comprising:

a semiconductor substrate including a super junction structure disposed near a top portion of the semiconductor substrate wherein said super junction structure comprising a plurality of laterally stacked layers of alternating conductivity types of a first and second conductivity types extending laterally from a source column to a drain column wherein said source column and drain column are of a first conductivity type and extend downward through said super-junction structure; and a gate column of a second conductivity type extending downward through said super junction structure for applying a voltage on the super junction structure to control a current transmitted laterally through said super junction structure between said source and said drain columns; and a built-in gate-drain avalanche clamp diode disposed near a bottom surface of said semiconductor substrate under one of said gate columns and said drain column.

13. The semiconductor power device of claim 12 further comprising:

a bottom semiconductor layer disposed under the super junction structure, wherein one of said gate columns or said drain columns interfaces as a PN junction with said bottom semiconductor layer thus constitutes said built-in gate-drain avalanche clamp diode near the bottom surface of the semiconductor substrate.

14. The semiconductor power device of claim 13 wherein:

at least one of said gate columns and drain columns extends downwardly to electrically connect to said bottom semiconductor layer.

* * * * *